United States Patent
Hayashi et al.

(10) Patent No.: US 8,536,706 B2
(45) Date of Patent: Sep. 17, 2013

(54) METHOD FOR FABRICATING SEMICONDUCTOR DEVICE AND SEMICONDUCTOR DEVICE

(71) Applicants: Yumi Hayashi, Kanagawa (JP); Atsuko Sakata, Kanagawa (JP); Kei Watanabe, Tokyo (JP); Noriaki Matsunaga, Kanagawa (JP); Shinichi Nakao, Kanagawa (JP); Makoto Wada, Kanagawa (JP); Hiroshi Toyoda, Kanagawa (JP)

(72) Inventors: Yumi Hayashi, Kanagawa (JP); Atsuko Sakata, Kanagawa (JP); Kei Watanabe, Tokyo (JP); Noriaki Matsunaga, Kanagawa (JP); Shinichi Nakao, Kanagawa (JP); Makoto Wada, Kanagawa (JP); Hiroshi Toyoda, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/707,359

(22) Filed: Dec. 6, 2012

(65) Prior Publication Data

US 2013/0093090 A1    Apr. 18, 2013

Related U.S. Application Data

(63) Continuation of application No. 12/652,204, filed on Jan. 5, 2010, now Pat. No. 8,344,509.

(30) Foreign Application Priority Data

Jan. 19, 2009 (JP) ................................ 2009-009356
May 29, 2009 (JP) ................................ 2009-130831

(51) Int. Cl.
*H01L 23/48* (2006.01)
*H01L 23/52* (2006.01)

(52) U.S. Cl.
USPC ........... 257/751; 257/754; 257/762; 257/763; 257/E23.161; 257/E21.584; 438/642; 438/643; 438/653

(58) Field of Classification Search
USPC .................. 257/751, 754, 762, 763, E23.161, 257/E21.584; 438/642, 643, 653
See application file for complete search history.

(56) References Cited

U.S. PATENT DOCUMENTS 6,111,318 A    8/2000    Hoshino
6,126,806 A    10/2000   Uzoh (Continued)

FOREIGN PATENT DOCUMENTS

GB    2 390 742 B    7/2006
JP    2003-347302    12/2003

(Continued)

OTHER PUBLICATIONS

Korean Office Action issued Nov. 28, 2011, in Patent Application No. 10-2010-0004372 (with English-language translation).

(Continued)

*Primary Examiner* — Tu-Tu Ho
(74) *Attorney, Agent, or Firm* — Oblon, Spivak, McClelland, Maier & Neustadt, L.L.P.

(57) ABSTRACT

A method for fabricating a semiconductor device, includes forming a dielectric film above a substrate; forming an opening in the dielectric film; forming a first film containing a metal whose energy for forming silicide thereof is lower than that of Cu silicide inside the opening; forming a second film that is conductive and contains copper (Cu) in the opening in which the first film containing the metal is formed; and forming a compound film containing Cu and silicon (Si) selectively on the second film in an atmosphere in which a temperature of the substrate is below 300° C.

18 Claims, 46 Drawing Sheets

(56) References Cited

U.S. PATENT DOCUMENTS

| | | | |
|---|---|---|---|
| 6,365,502 B1 | 4/2002 | Paranjpe et al. | |
| 6,492,267 B1 * | 12/2002 | Yin et al. | 438/687 |
| 7,687,918 B2 | 3/2010 | Kunimune et al. | |
| 2002/0005583 A1 * | 1/2002 | Harada et al. | 257/758 |
| 2006/0071334 A1 * | 4/2006 | Kawabata et al. | 257/741 |
| 2006/0113685 A1 | 6/2006 | Ueki et al. | |
| 2007/0018329 A1 | 1/2007 | Oh et al. | |
| 2008/0023838 A1 | 1/2008 | Sakata et al. | |
| 2008/0184543 A1 | 8/2008 | Sako et al. | |

FOREIGN PATENT DOCUMENTS

| | | |
|---|---|---|
| JP | 2004-214267 | 7/2004 |
| JP | 2004-349572 | 12/2004 |
| JP | 2006-229207 | 8/2006 |
| JP | 2008-47886 | 2/2008 |
| JP | 2008-192739 | 8/2008 |
| JP | 2009-10016 | 1/2009 |
| KR | 10-0381501 | 4/2003 |
| KR | 10-2007-0010979 | 1/2007 |
| TW | 200416800 A | 9/2004 |
| TW | 200824040 A | 6/2008 |
| WO | WO2008/035490 A1 | 3/2008 |

OTHER PUBLICATIONS

W. Wu et al., "Ti-based Barrier for Cu Interconnect Applications". United States, IITC, 2008, 3 pages.

Office Action issued Apr. 20, 2011, in Korean Patent Application No. 10-2010-0004372 with English translation.

Office Action issued Dec. 21, 2012 in Taiwanese Patent Application No. 098141935 (with English translation).

Japanese Office Action mailed Jul. 2, 2013 in Japanese Appln. 2009-130831 (with English translation).

\* cited by examiner

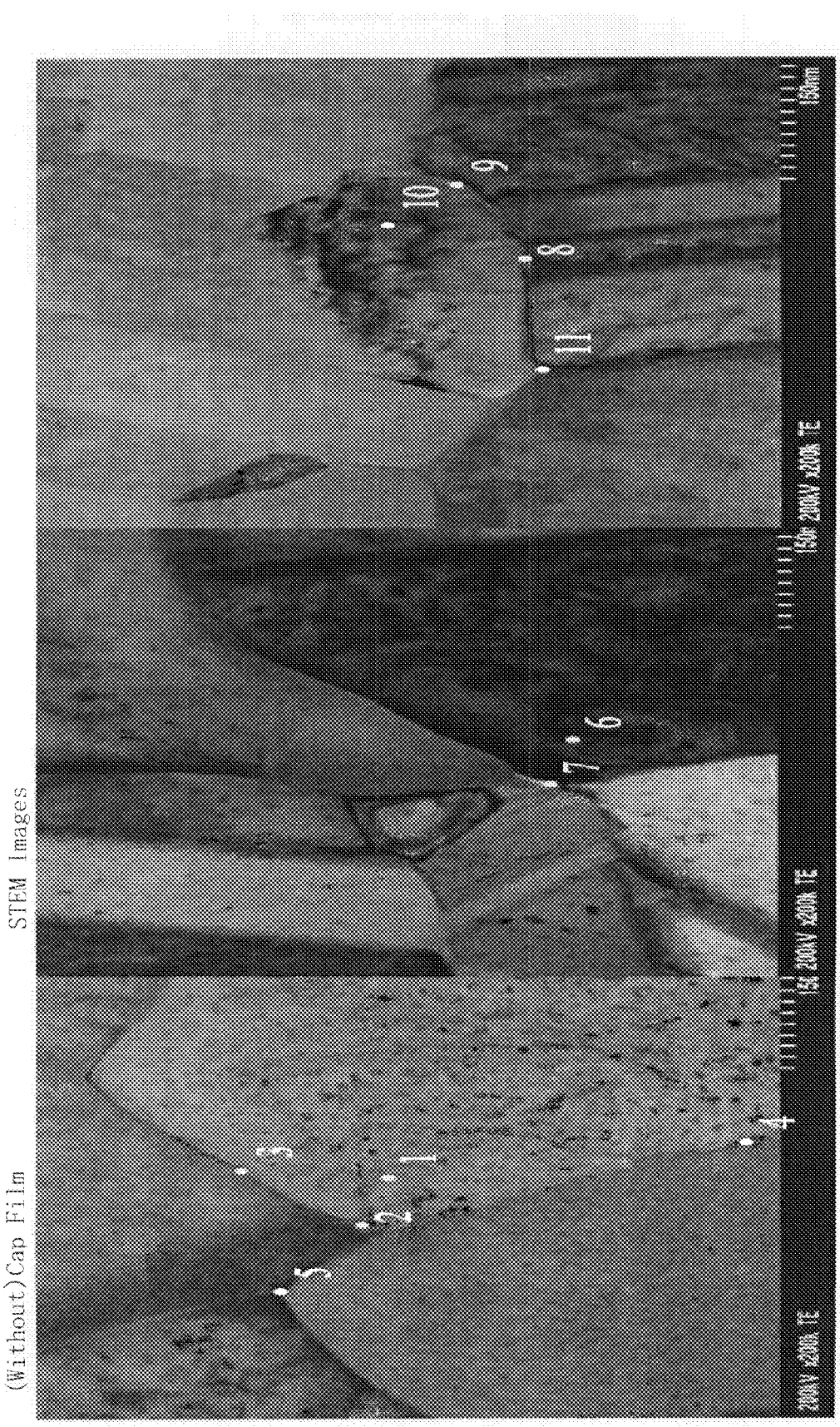

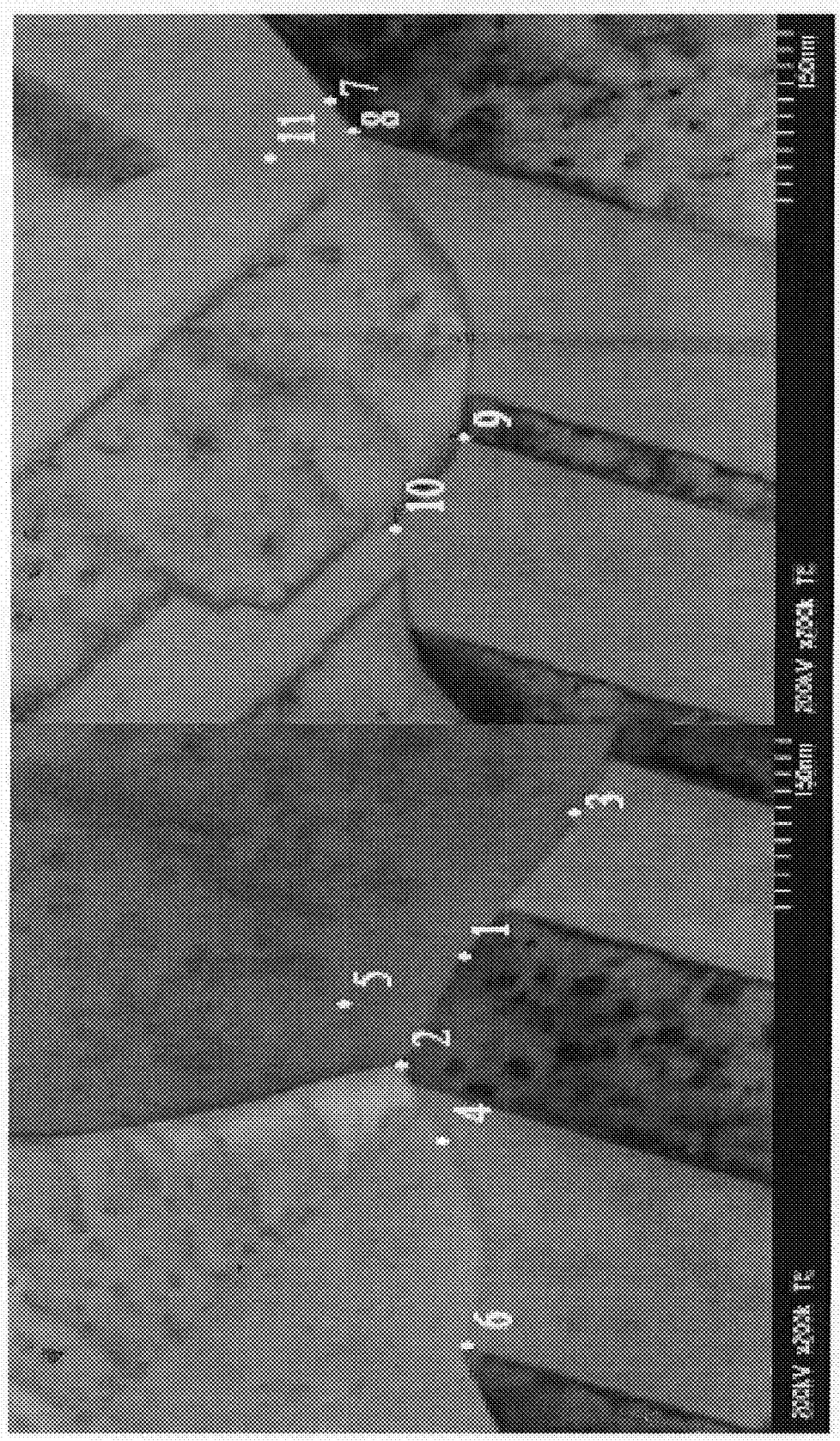

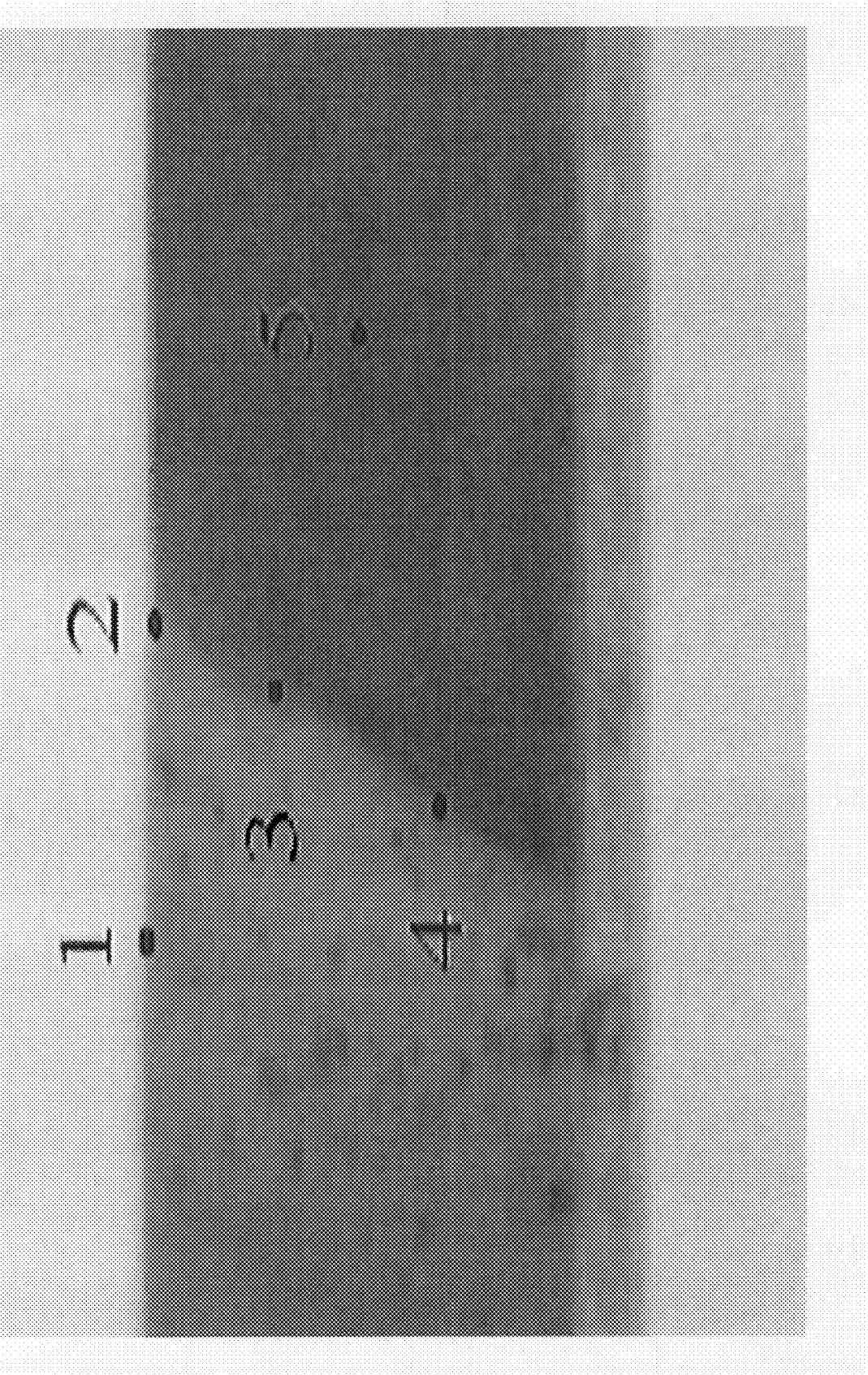

HAADF-STEM Images

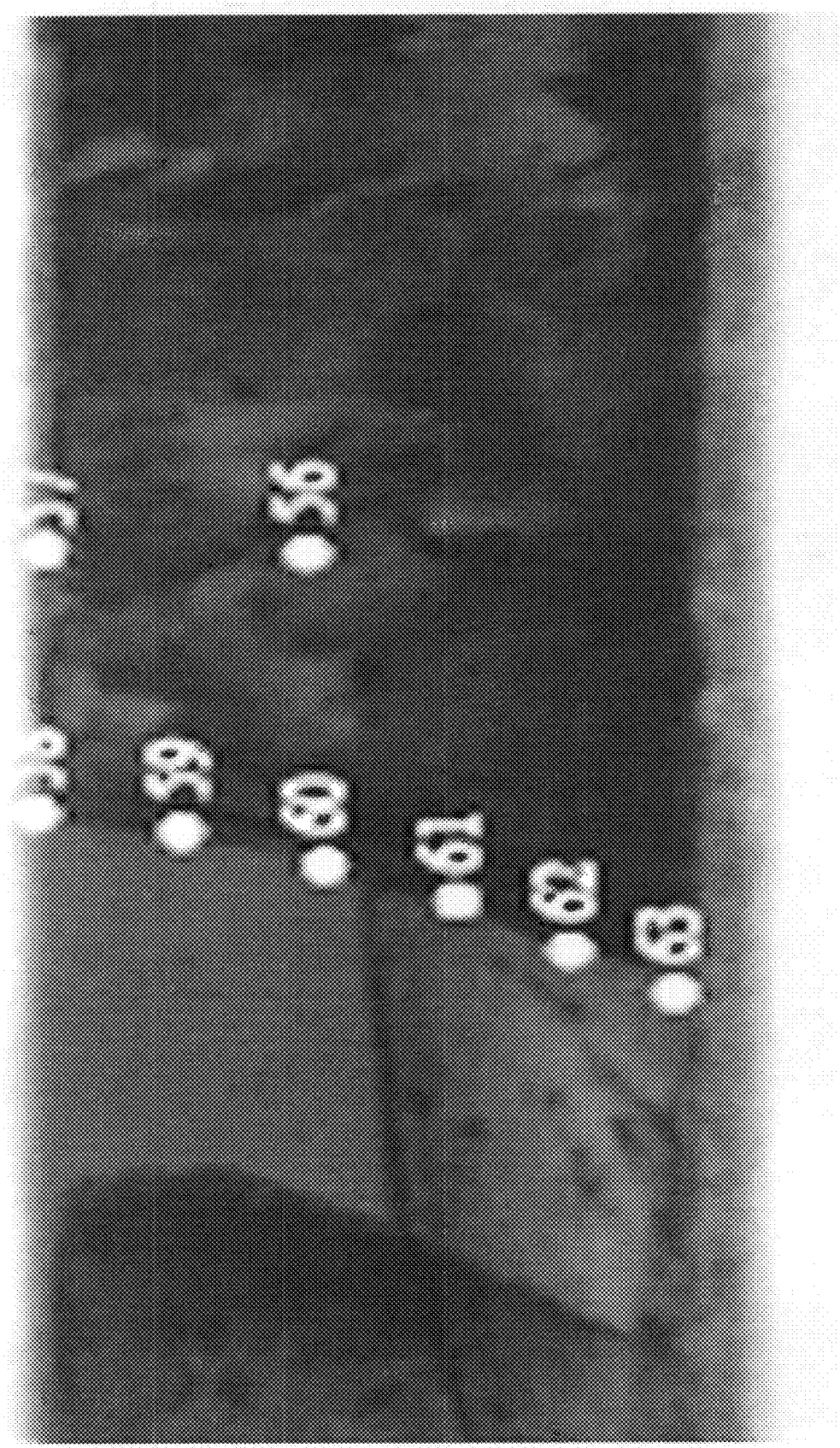
FIG. 24A STEM Images

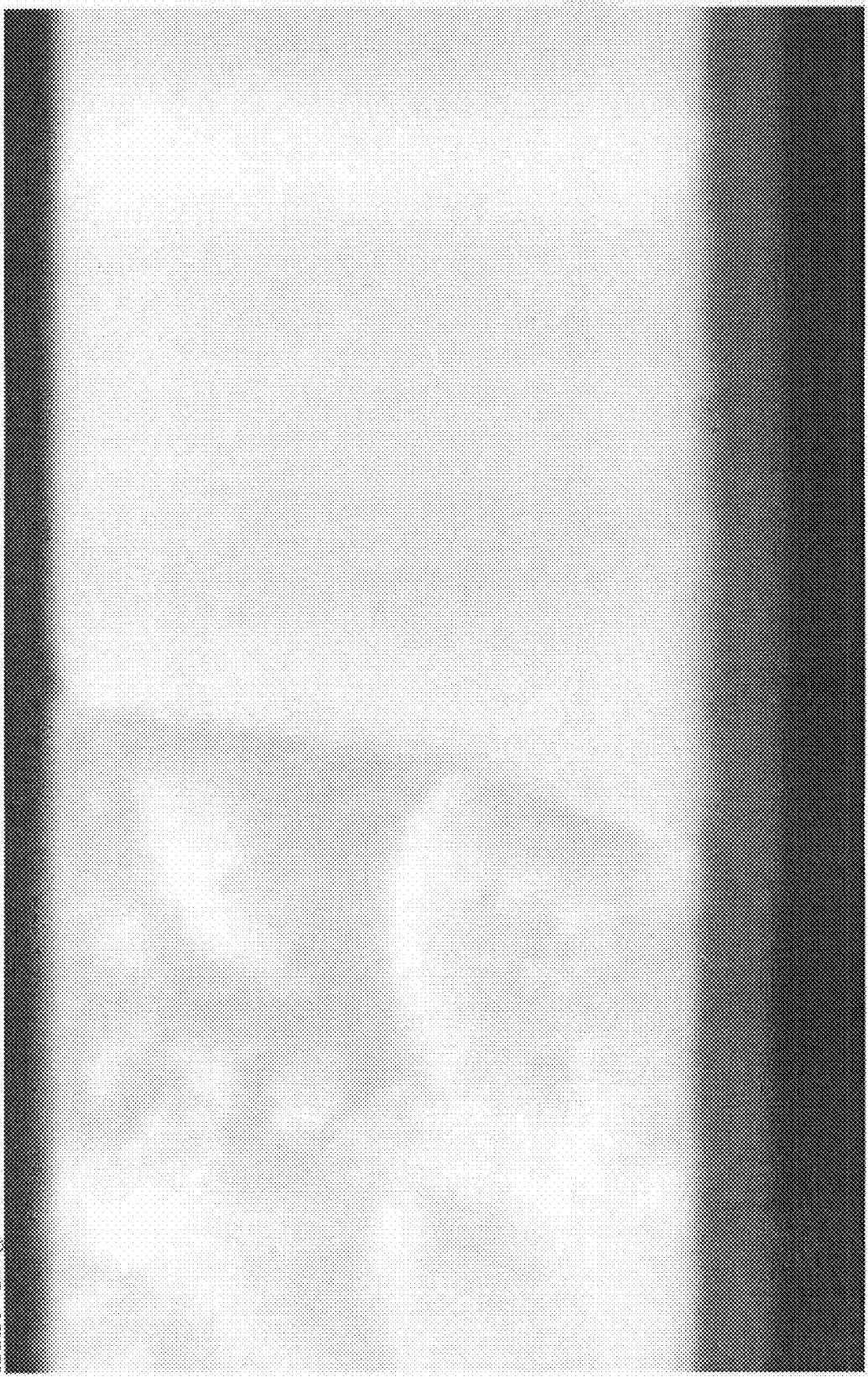
FIG. 24D HAADF Images

METHOD FOR FABRICATING SEMICONDUCTOR DEVICE AND SEMICONDUCTOR DEVICE

CROSS-REFERENCE TO RELATED APPLICATION

The present application is a continuation of, and claims the benefit of priority under 35 U.S.C. §120, from U.S. application Ser. No. 12/652,204, filed Jan. 5, 2010, which claims the benefit of priority under 35 U.S.C. §119, from Japanese Patent Application No. 2009-009356, filed Jan. 19, 2009 in Japan, and Japanese Patent Application No. 2009-130831, filed May 29, 2009 in Japan, the entire contents of all of which are incorporated herein by reference.

BACKGROUND

In recent years, with higher integration and higher performance of semiconductor integrated circuits (LSI), new micro-processing technologies have been developed. Recently, to achieve faster performance of LSI, there is particularly a trend to change wire materials from conventional aluminum (Al) alloys to copper (Cu) or Cu alloys (hereinafter, collectively referred to as Cu) having lower resistance. Since it is difficult to perform micro-processing on Cu by the dry etching method used frequently for forming an Al alloy wire, the so-called damascene method by which embedded wires are formed by depositing a Cu film on a dielectric film where a groove processing is performed and removing a portion of the Cu film that is not embedded in the grooves by the chemical mechanical polishing (CMP) is mainly adopted. Generally as the Cu film, a thin seed layer is formed by the sputter process or the like and then a laminated film of thickness of about several hundred nanometers are formed by electro-plating.

Here, when a multi-layer wire is formed by the damascene method or the like in a semiconductor integrated circuit (LSI), a metal cap film may be selectively formed on a Cu wire in order to prevent diffusion of Cu as a wire material into a low-k film in an upper layer as well as to increase adhesiveness to the low-k film. To achieve higher performance of multi-layer wires, the metal cap technology is expected to become necessary in the future. Major candidates of material of a metal cap film include a CuSiN film that is a compound film of Cu, silicon (Si), and nitrogen (N) or a CuSix film that is a silicide film of Cu (see Japanese Patent Application Laid-Open No. 2008-192739, for example). The CuSiN film or CuSix film has an effect of improving adhesiveness of the interface between a Cu wire and an inter-layer dielectric film of the upper layer and suppressing Cu atom transport in the interface between the Cu wire and inter-layer dielectric film. Accordingly, electro-migration (EM) characteristics are improved. However, if tantalum (Ta), which is generally used as a barrier metal (BM) of Cu wire, is used, the improvement factor of electro-migration characteristics is small to achieve only two to three times improvement in terms of the mean-time-to failure (MTF) compared with a case without the CuSiN film or CuSix film. Therefore, further improvement is needed.

SUMMARY

In accordance with one aspect of the present invention, a method for fabricating a semiconductor device, includes forming a dielectric film above a substrate; forming an opening in the dielectric film; forming a first film containing a metal whose energy for forming silicide thereof is lower than that of Cu silicide inside the opening; forming a second film that is conductive and contains copper (Cu) in the opening in which the first film containing the metal is formed; and forming a compound film containing Cu and silicon (Si) selectively on the second film in an atmosphere in which a temperature of the substrate is below 300° C.

In accordance with another aspect of this invention, a method for fabricating a semiconductor device, includes forming a dielectric film above a substrate; forming an opening in the dielectric film; forming a first film containing a metal whose energy for forming silicide thereof is lower than that of Cu silicide inside the opening; embedding a second film that is conductive and contains copper (Cu) in the opening in which the first film containing the metal is formed; forming an silicon (Si) diffusion obstacle that is made of a material different from that of the first film and that prevents diffusion of silicon (Si) into the second film on at least a portion of a surface of the second film; and forming a compound film containing Cu and Si selectively on the second film in a state in which the Si diffusion obstacle is formed.

In accordance with a further aspect of the invention, a semiconductor device, includes a wire containing copper (Cu); a metal containing body formed in grain boundaries of the wire and containing a metal whose energy for forming silicide thereof is lower than that of Cu silicide; an silicon (Si) diffusion obstacle that is formed on at least a portion of a surface of the wire, made of a material different from that of metal atoms in the metal containing body, and that prevents diffusion of silicon (Si) into the wire; a dielectric film arranged on a side surface side of the wire; and a compound film formed selectively on the wire and containing Cu and Si.

BRIEF DESCRIPTION OF THE DRAWINGS

FIGS. 6A to 6F are photos showing examples of diffusion conditions of Ti in the surface of the Cu film when no cap film is formed.

FIGS. 8A to 8D are photos showing examples of diffusion conditions of Ti on the surface of the Cu film when a cap film is formed.

FIGS. 11A to 11D are photos showing examples of diffusion conditions of Ti in the cross section of the Cu film when no cap film is formed.

FIGS. 24A to 24D are photos of the cross section of the Cu film when the cap film is formed at 350° C. without the Si diffusion obstacle being formed on the surface of Cu.

DETAILED DESCRIPTION

Various methods to improve EM characteristics are under examination and, as shown in Japanese Patent Application Laid-Open No. 2003-347302, for example, EM characteristics improvement due to such interface compound formation and Si diffusion is effective only when the process temperature (used therefor) of CuSiN is 300° C. or higher and a process between 300° C. and 400° C. is proposed.

As another method for improving EM characteristics, applying titanium (Ti) as a barrier metal is being examined (see Japanese Patent Application Laid-Open No. 2006-229207, for example).

In the process of forming the CuSiNx film, however, a problem of rising wire resistance arises if the CuSiN film or CuSix film is formed, though EM is improved. Excessive Si when CuSiN or CuSix is formed or Si that does not form Cu silicide penetrates and diffuses into a Cu wire from a grain boundary present on the surface of the Cu wire. Then, Si that has diffused passing through the grain boundary may further diffuse into Cu grains from the grain boundary of Cu. In addition to penetration from the grain boundary, Si may naturally penetrate and diffuse from the surface of Cu that supplies Si. As a result, compared with a Cu wire without the CuSiN film or CuSix film being formed, wire resistance is caused to increase. Therefore, a technology that improves EM characteristics without causing wire resistance to increase is demanded.

When Ti is used as a barrier metal, Ti is an element that causes the highest increase in resistance with an increase in resistance by 1.6 $\mu\Omega$cm/at % if introduced into Cu grains. Ti diffuses into the grain boundary in a temperature range used for an actual wiring process so that resistance does not increase much and EM is improved by the diffusion. However, with increasingly finer structures, an increase in resistance caused by diffusion of Ti is beginning to be noticeable and securing an EM improvement factor that is compatible with suppression of increase in resistance by controlling the Ti diffusion has become a subject. In each embodiment described below, a semiconductor device or a method for fabricating a semiconductor device that improves EM characteristics while an increase in resistance being suppressed will be described.

First Embodiment

Figure 1:
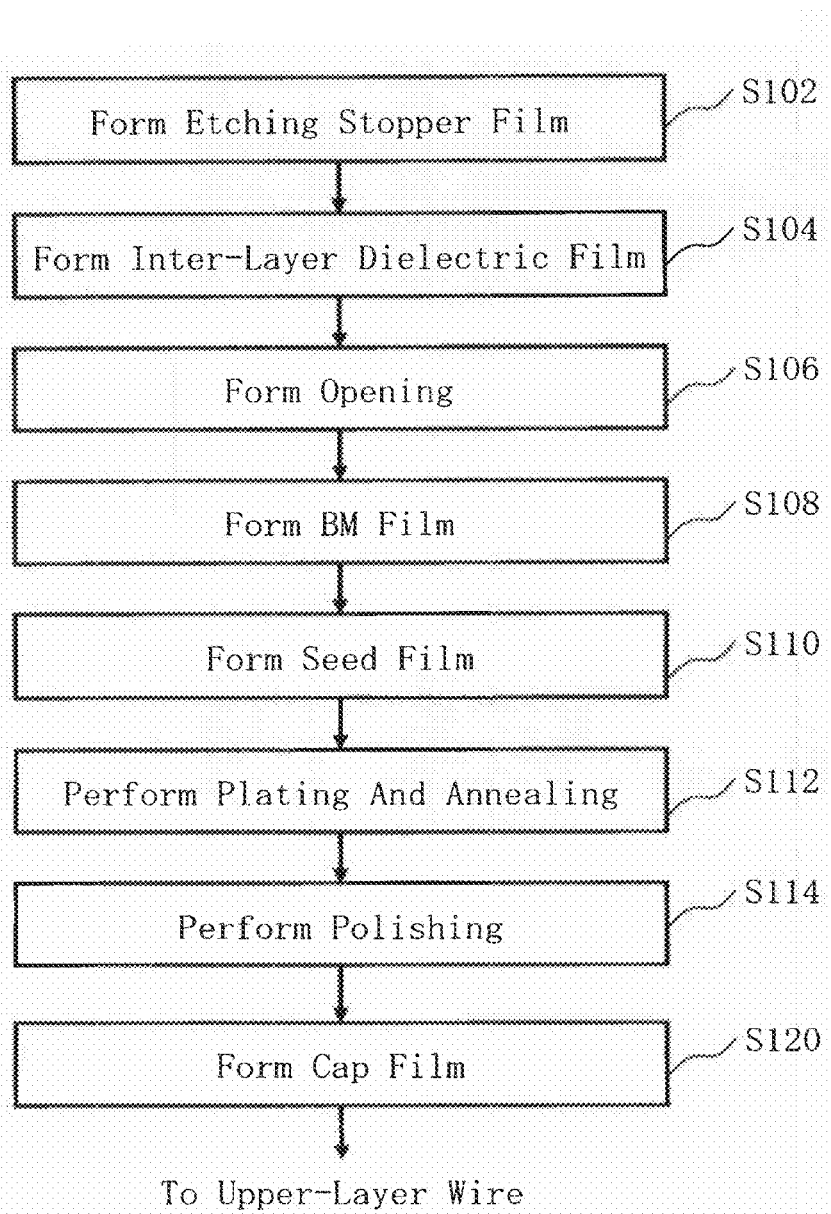
FIG. 1 is a flow chart showing principal parts of a method for fabricating a semiconductor device in a first embodiment.

FIG. 1 is a flow chart showing principal parts of a method for fabricating a semiconductor device in a first embodiment. As shown in FIG. 1, in the method for fabricating a semiconductor device in the present embodiment, a series of processes including an etching stopper film formation process (S102), inter-layer dielectric film formation process (S104), opening formation process (S106), barrier metal (BM) film formation process (S108), seed film formation process (S110), plating and annealing process (S112), polishing process (S114), and cap film formation process (S120). The etching stopper film formation process (S102) may be omitted. Cases each having the etching stopper film formation process (S102) will be described in a series of examples, but the present embodiment is not limited to such cases.

FIGS. 2A to 3D are process sectional views showing processes performed corresponding to the flow chart in FIG. 1. FIGS. 2A to 2D show the processes from etching stopper film formation process (S102) to the barrier metal film formation process (S108). Processes thereafter will be described later.

Figure 2A:
FIGS. 2A to 3D are process sectional views showing processes performed corresponding to the flow chart in FIG. 1.

In FIG. 2A, as the etching stopper film formation process (S102), an etching stopper film 210 is formed on the surface of a substrate 200 by the CVD (chemical vapor deposition) method to a thickness of, for example, 50 nm. As a material of the etching stopper film 210, silicon nitride (SiN), silicon carbonitride (SiCN), silicon carbide (SiC), or silicon oxycarbide (SiOC) and the like may be suitably used. As the substrate 200, for example, a silicon wafer of 300 mm in diameter is used. Here, the illustration of a device portion is not illustrated. The substrate 200 may further have wires or other circuits formed thereon.

Figure 2B:
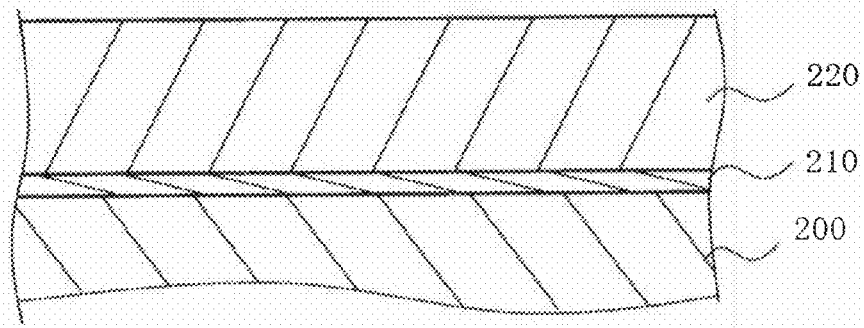

In FIG. 2B, as the inter-layer dielectric film formation process (S104), an inter-layer dielectric film 220 for a wiring layer is formed on the etching stopper film 210 formed on the substrate 200 to a thickness of, for example, 150 nm. An $SiO_2$ film or low-k film may be suitably used as the inter-layer dielectric film 220. Particularly when a low-k film using a porous low dielectric constant material is used as the inter-layer dielectric film 220, an inter-layer dielectric film whose relative dielectric constant k is lower than 3.5 can be obtained. For example, a low-k film is formed by using a film having a polymethyl siloxane component, which is a low dielectric constant material having relative dielectric constant of less than 2.5. In addition to polymethyl siloxane, a low-k film may be formed by using, at least one film selected from a group consisting of: a film having siloxane backbone structures such as polysiloxane, hydrogen silsesquioxane, and methyl silsesquioxane; a film having organic resin such as polyarylene ether, polybenzo oxazole, and polybenzo cyclobutene as a main component; and a porous film such as a porous silica film. Using such materials of a low-k film, a low dielectric constant of less than 2.5 can be obtained. As a formation method thereof, for example, the SOD (spin on dielectric coating) method by which a thin film is formed by spin coating and heat treatment of a solution can be used. For example, a low-k film can be formed by forming a film on a wafer by a spinner, baking the wafer on a hot plate in a nitrogen atmosphere, and finally curing the wafer on the hot plate at temperature higher than the baking temperature in the nitrogen atmosphere. A porous dielectric film having predetermined property values can be obtained by appropriately adjusting the low-k material or formation conditions. Alternatively, a low-k film may be formed by the CVD method. When an $SiO_2$ film is formed as the inter-layer dielectric film 220, the CVD method is suitably used.

When a low-k film is formed as the inter-layer dielectric film 220, a cap dielectric film (not shown) is suitably formed to create a two-layer structure. For example, a cap dielectric film may be formed by the CVD method. By forming a cap dielectric film, a low-k film having weak mechanical strength can be protected. A cap dielectric film is suitably formed by using at least one dielectric material whose relative dielectric constant is equal to or higher than 2.5 selected from a group consisting of silicon oxycarbide (SiOC), TEOS (tetraethoxy silane), SiC, silicon carbohydrate (SiCH), silicon carbonitride (SiCN), and SiOCH. Other methods than the CVD method may also be used as the formation method.

Figure 2C:
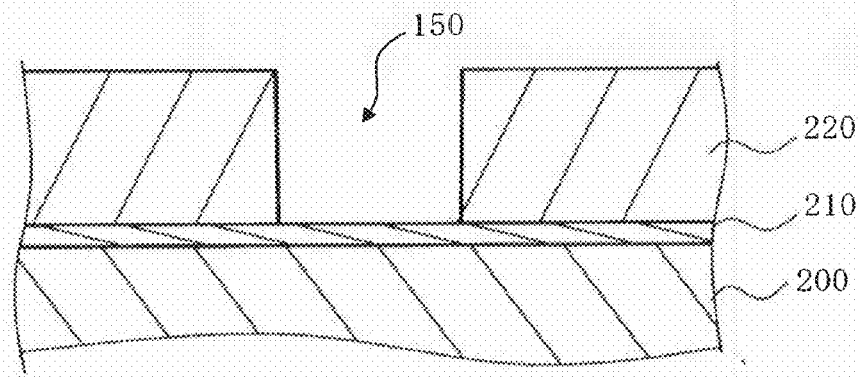

In FIG. 2C, as the opening formation process (S106), an opening 150, which becomes a trench or a via hole to produce a damascene wire in lithography and dry etching processes, is formed in the inter-layer dielectric film 220. The opening 150 may be formed by removing the exposed inter-layer dielectric film 220 from the substrate 200 having a resist film, which is formed on the inter-layer dielectric film 220 through the lithography process such as a resist application process and an exposure process (not shown), by the anisotropic etching method using the etching stopper film 210 as an etching stopper. By using the anisotropic etching method, the opening 150 can be formed substantially perpendicularly to the surface of the substrate 200. For example, the opening 150 may be formed by the reactive ion etching method.

Figure 2D:
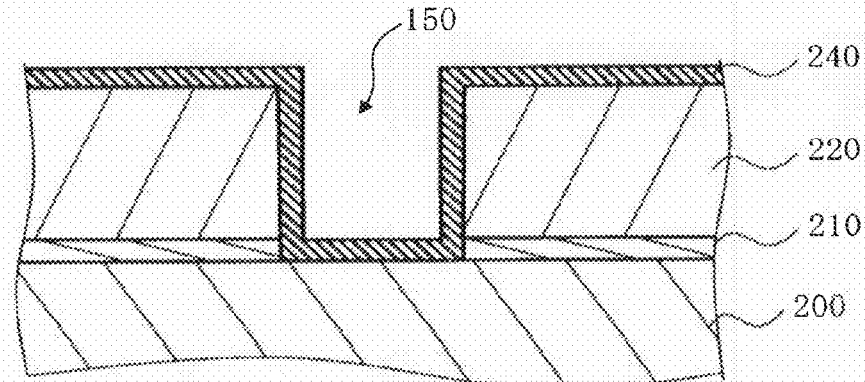

In FIG. 2D, as the barrier metal (BM) film formation process (S108), a barrier metal (BM) film 240 using a barrier metal material is formed in the opening 150 formed by the opening formation process and on the surface of the inter-layer dielectric film 220. A titanium (Ti) film is deposited to a thickness of, for example, 10 nm in a sputtering device using the sputter process, which is a kind of the physical vapor deposition (PVD) method, to form the barrier metal film 240. The deposition method of barrier metal material is not limited to the PVD method and the atomic layer deposition (ALD) method (or the atomic layer chemical vapor deposition (ALCVD) method) and the CVD method can also be used. The coverage factor can be improved compared with the PVD method. In the first embodiment, a film containing at least one metal whose energy for forming silicide thereof is lower than that of Cu silicide is used as the material of the barrier metal film 240. Thus, in the first embodiment, the barrier metal film 240 is an example of the film containing at least one metal whose energy for forming silicide thereof is lower than that of Cu silicide. In addition to Ti, first material of the first embodiment may be cobalt (Co), nickel (Ni), manganese (Mn), molybdenum (Mo), and hafnium (Hf) and it is suitable to use at least one of these materials.

Energies for forming silicides of a part of elements to be the first metals in the first embodiment are shown in Table 1.

TABLE 1

| Element | Composition | $-\Delta H_{298}$(kJ/mol) |
|---|---|---|
| Cu | $Cu_3Si$ | 13.6 |
| Ta | $Ta_2Si$ | 125.6 |
|  | $Ta_5Si_3$ | 334.9 |
|  | $TaSi_2$ | 119.3 |
| Ti | $Ti_5Si_3$ | 579.8 |
|  | TiSi | 129.8 |
|  | $TiSi_2$ | 134.4 |
| Co | Co2Si | 117.2 |
|  | CoSi | 95 |
|  | $CoSi_2$ | 98.8 |
| Ni | $Ni_2Si$ | 142.7 |
|  | $Ni_3Si_2$ | 232.3 |
|  | NiSi | 89.6 |
|  | $NiSi_2$ | 94.2 |
| Mn | $Mn_2Si$ | 79.5 |
|  | $Mn_5Si_3$ | 200.9 |
|  | MnSi | 60.7 |
|  | $Mn_4Si_7$ | 308.5 |
| Mo | $Mo_3Si$ | 116.4 |
|  | $Mo_5Si_3$ | 310.2 |
|  | $MoSi_2$ | 131.9 |

As shown in Table 1, elements such as Ti, Co, and Ni have larger absolute reaction energy ($-\Delta H$) when silicides are formed than that of Cu and thus, it can be said that the elements produce reactants more stable than those of Cu.

When the barrier metal film 240 is formed, it is suitable to perform annealing at a temperature between 200° C. and 350° C. in a vacuum or a reducing atmosphere such as a hydrogen ($H_2$) gas in a state in which the opening 150 is formed in advance. By this annealing, $H_2O$ contained in the inter-layer dielectric film 220 or oxide species of carbon based residues and the like remaining in the inter-layer dielectric film 220 due to cut of bond therebetween when the opening 150 is formed is removed by this annealing.

FIGS. 3A to 3D show from the seed film formation process (S110) to the cap film formation process (S120).

Figure 3A:
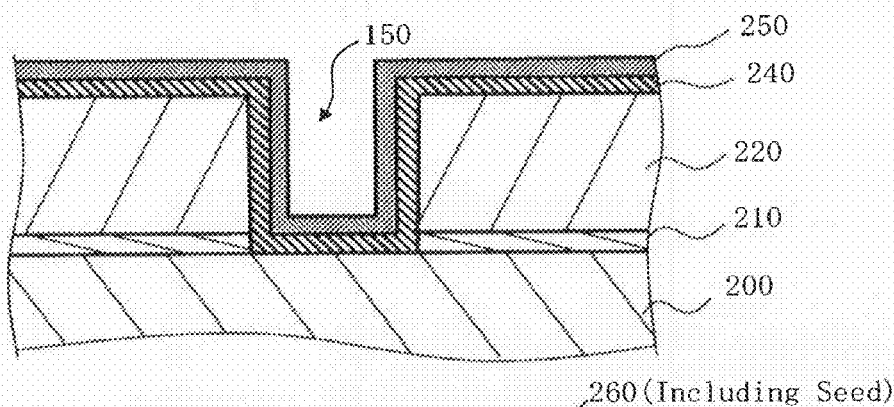

In FIG. 3A, as the seed film formation process (S110), a Cu thin film to be a cathode electrode in the following plating process, is deposited (formed) as a seed film 250 on inner walls and at the bottom of the opening 150 where the barrier metal film 240 is formed and on the surface of the substrate 200 by the physical vapor deposition (PVD) method. Here, the seed film 250 is deposited to a thickness of, for example, 50 nm.

In the above example, single-layer films of the above metals or a film containing at least one of such metals may be applied to the barrier metal film 240. Moreover, a film forming nitride of each element including, for example, TiN and CoN may be applied. Further, when a barrier metal of alloy is applied, $TiW_x$, $TiTa_x$, $TiRu_x$, $TiCo_x$, and $TaCo_x$ can be applied and any composition/structure in which a desired metal can diffuse into a Cu film may be selected. Further, Ta nitride or a laminated film obtained by layering a Ti film on a Ta film may be used. In the above example, a case in which the barrier metal film 240 contains at least one metal whose energy for forming silicide thereof is lower than that of Cu silicide is described, but the present embodiment is not limited to this case and the seed film 250 may contain the above metals. In such a case, Ta, TaN, W, WN, or the like may be used as the material of the barrier metal film 240. The aforementioned case is an example in which the seed film 250 is a film containing a metal whose formation energy as silicide is lower than that of Cu silicide. Alternatively, a metal whose energy for forming a silicide thereof is lower than that of Cu silicide may be contained in both the barrier metal film 240 and the seed film 250. For example, barrier metals containing the above metals such as TiN and CuMn may be used together. In this case, in contrast to the case in which the above metals are applied to a barrier metal film, conditions for allowing the above metals to diffuse from inside the barrier metal film may not necessarily be selected.

Figure 3B:
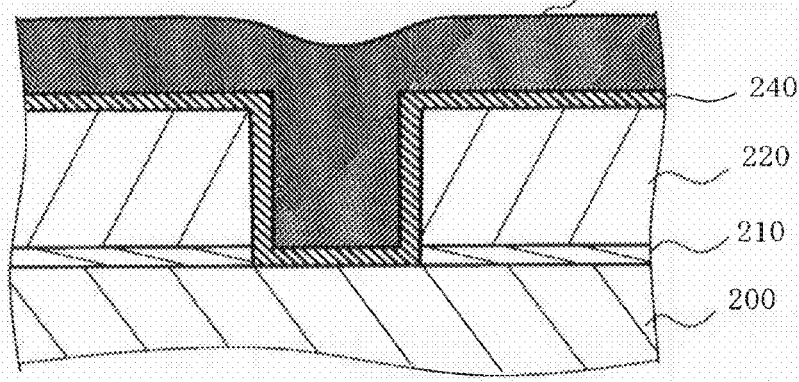

In FIG. 3B, as the plating and annealing process (S112), a Cu film 260 is deposited inside the opening 150 and on the surface of the substrate 200 by the electrochemical growth method such as electro-plating using the seed film 250 as a cathode electrode. Here, the Cu film 260 is deposited in such a way that the opening 150 is completely filled. For example, the Cu film 260 having a thickness twice the depth of the opening 150 is suitably formed. After the plating, annealing (heat treatment) is performed, for example, at 250° C. With the annealing, Ti, which is the material of the above barrier metal film 240 can diffuse to grain boundaries in the Cu film 260.

Figure 3C:
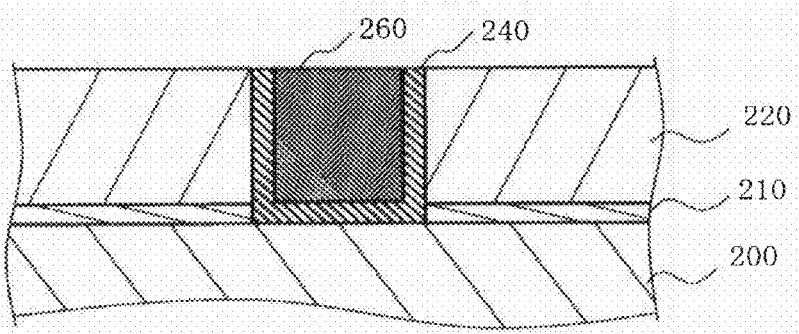

In FIG. 3C, as the polishing process (S114), the excessive Cu film 260 swelling out of the opening 150 of the substrate 200 and the excessive barrier metal film 240 are polished by the CMP method for planarization. Accordingly, a Cu wire shown in FIG. 3C can be formed.

Figure 3D:
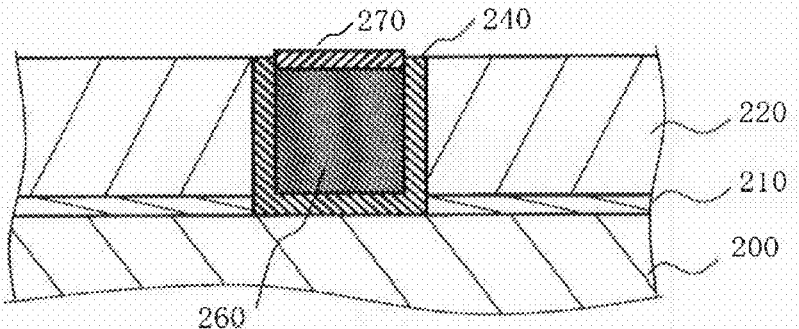

In FIG. 3D, as the cap film formation process (S120), a cap film 270 is selectively formed in a portion where Cu is exposed. As the cap film 270, for example, a CuSiN film that is a compound film of Cu, silicon (Si), and nitrogen (N) or a CuSix film that is a silicide film of Cu is suitably formed (it is needless to say that the ratio of composition of CuSiN and CuSix can be varied when necessary). CuSiN or CuSix can be formed as to be described. Modify the surface of the exposed Cu film 260 by supplying a silane (SiH$_4$) gas and a hydrogen (H$_2$) gas or ammonium (NH$_3$) gas to a reaction vessel in which the substrate 200 is arranged, pressure can be controlled, an RF power supply and electrodes are provided, and a supplied gas can be discharged. More specifically, after the Cu wire is formed, the substrate 200 is arranged on a stage whose temperature can be controlled in the reaction vessel and a C containing protective film and oxide film (Cu—O) on the surface of the exposed Cu film 260 are thermally decomposed and reduced by using H$_2$ or NH$_3$ plasma or a thermal reaction using H$_2$ or NH$_3$, thereby removed. Then, the surface of the exposed Cu film 260 is exposed in an atmosphere containing an Si containing gas such as an SiH$_4$ gas to cause Si to diffuse into Cu. Accordingly, CuSix can be formed. Further, from this state, the bond of Si—N is formed on the surface of the exposed Cu film 260 by exposing to an NH$_3$ gas or NH$_3$ plasma, whereby CuSiN may be formed. CuSix or CuSiN is formed to a thickness of, for example, 5 nm. By forming CuSiN or CuSix, diffusion of Cu into a dielectric film can be suppressed. When the cap film 270 is formed, the temperature (substrate temperature) of the substrate is preferably set to below 300° C. Particularly preferably, the substrate temperature is set to 250° C. to 275° C.

Figure 4:
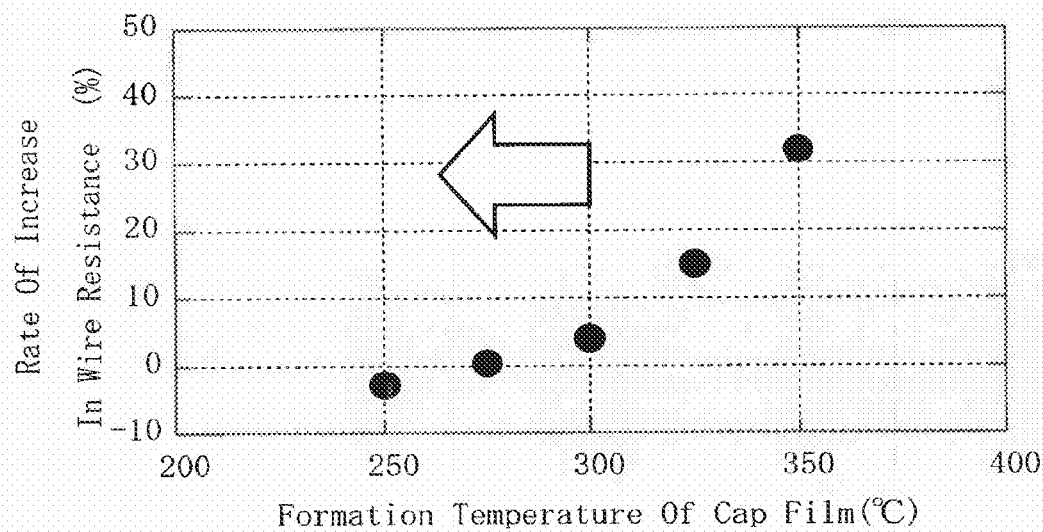
FIG. 4 is a graph showing a relationship between a formation temperature of a cap film and a rate of increase in wire resistance in the first embodiment.

FIG. 4 is a graph showing a relationship between the formation temperature of a cap film and the rate of increase in wire resistance in the first embodiment. As shown in FIG. 4, the rate of increase in wire resistance after forming the cap film 270 increases as a temperature when forming the cap film 270 increases. By setting the substrate temperature to below 300° C., the rate of increase in wire resistance can be suppressed to about 5% or below. Moreover, by setting the substrate temperature to 250° C. to 275° C., an increase in wire resistance can be avoided. Measured temperatures in FIG. 4 are 250° C., 275° C., 300° C., and 350° C. of the substrate temperature.

Table 2 shows the improvement factor of EM characteristics in the first embodiment.

TABLE 2

|  | Ta | | Ti | |
|---|---|---|---|---|
| Cap Film | Not Formed | formed | Not Formed | Formed |
| MTF | 3.5 hrs | 4.4 hrs | 31 hrs | 310 hrs |

When CuSiN or CuSix is formed by a conventional technique, improvement of EM characteristics and suppression of increase of the rate in wire resistance are in a tradeoff relationship and when, for example, Ta is used as the BM film 240, it is necessary to form a cap film at 300° C. or higher to achieve an improvement effect of EM characteristics. However, as shown in FIG. 4, if a cap film is formed at 300° C. or higher, the rate of increase in wire resistance increases at an accelerated pace. Nonetheless, according to the first embodiment, EM characteristics can be improved even if a cap film is formed below 300° C. by using Ti as the BM film 240. Table 2 shows MTF results when Ta is used as the BM film 240 and Ti is used as the BM film 240 respectively, when the cap film 270 is formed at 275° C. of the substrate temperature and when the cap film 270 is not formed. When the cap film 270 is formed at 275° C., MTF becomes 310 hours by using Ti as the BM film 240, so that, compared with a case when Ta is used as the BM film 240, EM characteristics can be improved by almost 100 times. Moreover, even if the cap film 270 is not formed, MTF becomes 31 hours by using Ti as the BM film 240, so that, compared with a case when Ta is used as the BM film 240, EM characteristics can be improved by almost 10 times. Conversely, when Ta is used, even if the cap film is formed below 300° C., EM characteristics cannot be improved compared with a case when no cap is formed. In other words, when Ta is used as the BM film 240, EM characteristics cannot be improved unless the cap film is formed at 300° C. or higher, as long as the conventional technique is used.

With the combination of Ti and the cap film 270 formed below 300° C. of the substrate temperature, as described above, EM characteristics can be significantly improved while an increase in wire resistance being suppressed.

Figure 5A:
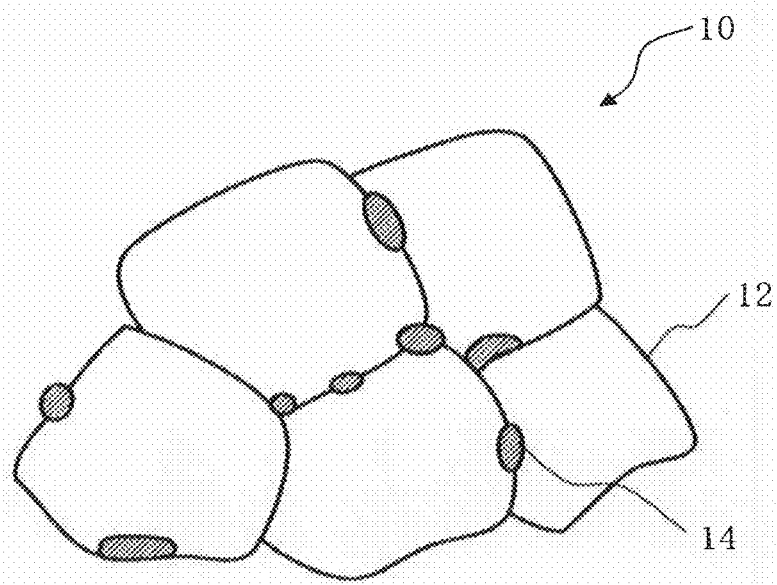
FIGS. 5A and 5B are conceptual diagrams showing examples of diffusion conditions of Ti in a surface of Cu film in the first embodiment.
Figure 5B:
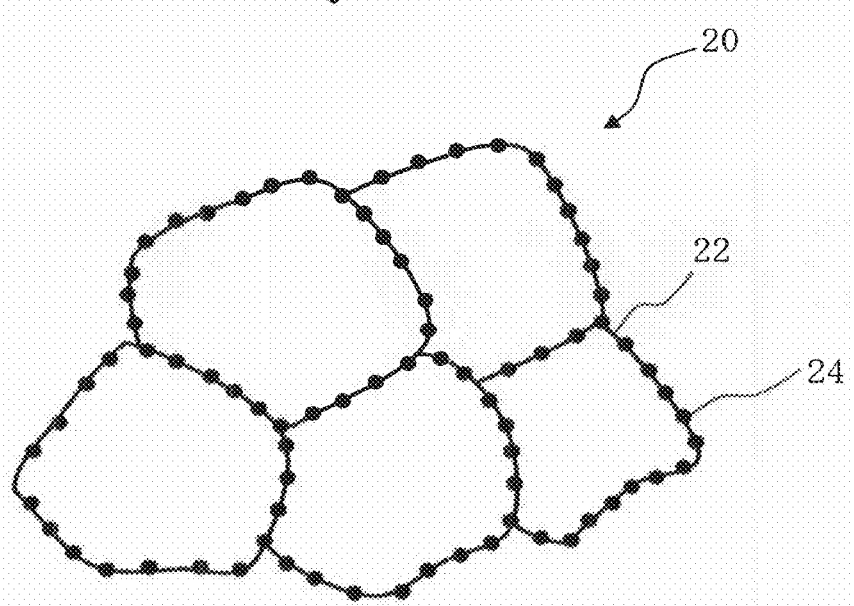

FIGS. 5A and 5B are conceptual diagrams showing examples of diffusion conditions of Ti in the surface of Cu film in the first embodiment. When the cap film 270 is not formed, as shown in FIG. 5A, Ti 14 of the BM film 240 is segregated on a grain boundary 12 in the surface of a Cu film 10 as a lump. When the cap film 270 is formed, by contrast, as shown in FIG. 5B, Ti 24 of the BM film 240 is substantially uniformly distributed on a grain boundary 22 in the surface of a Cu film 20.

Figure 6D:
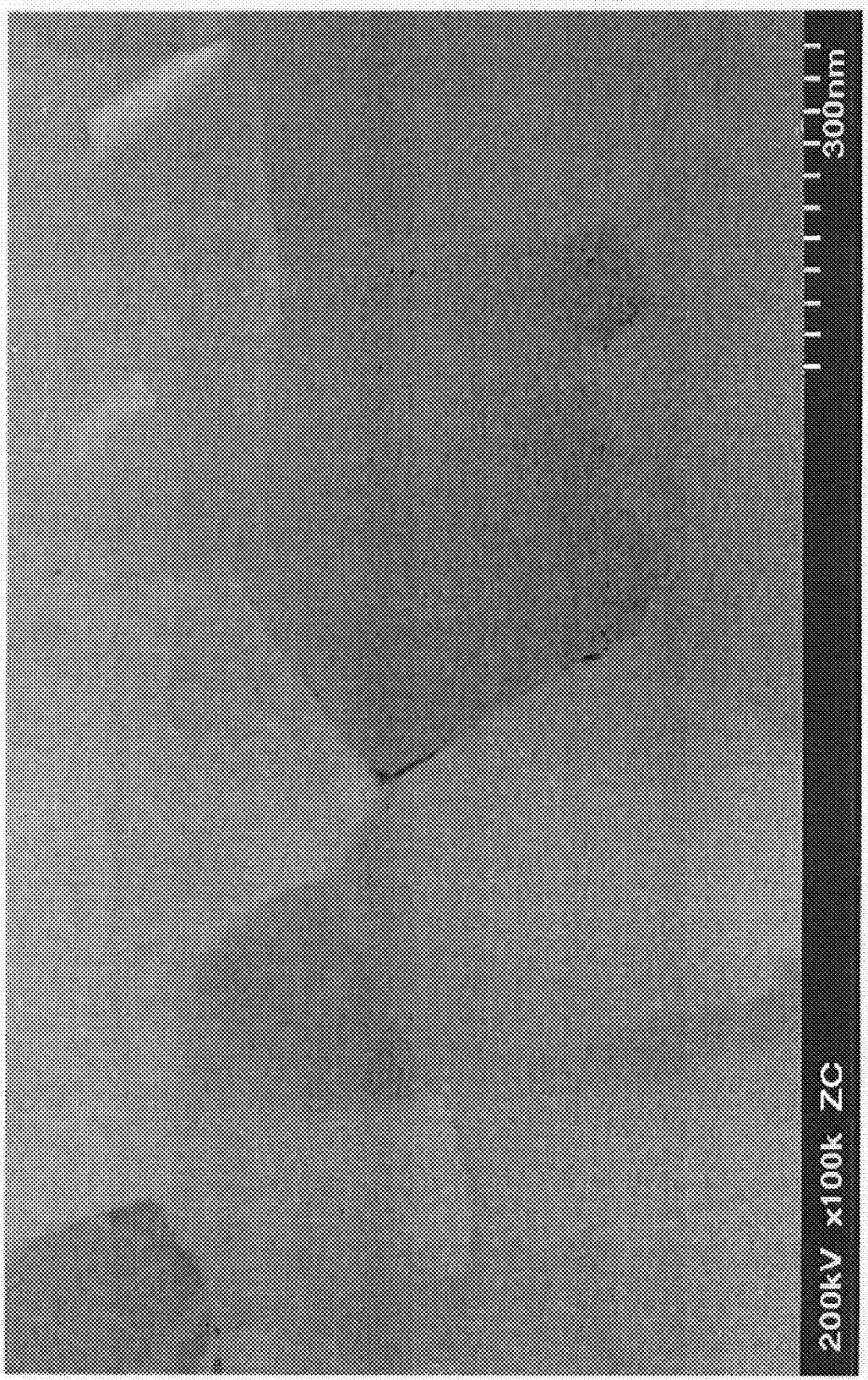
Figure 6E:
Figure 7A:
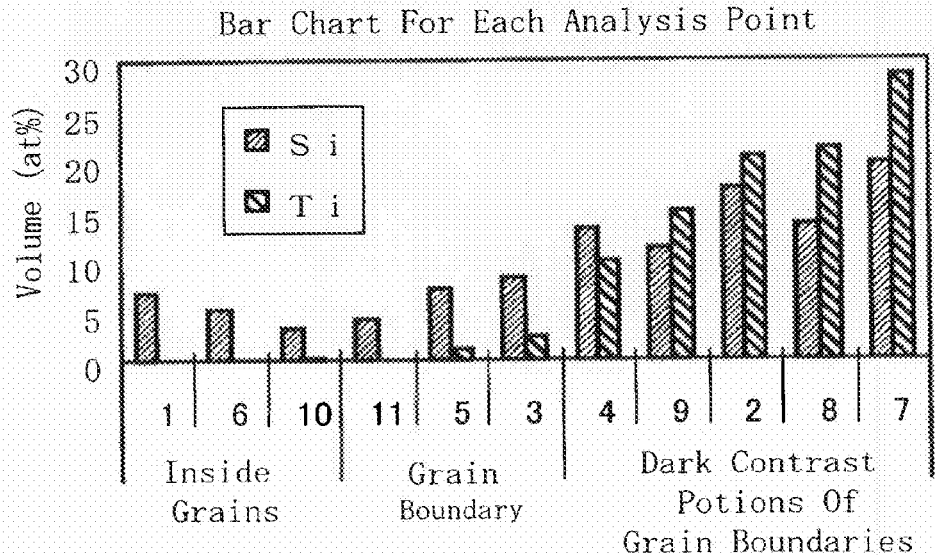
FIGS. 7A and 7B are graphs showing results of analyzing amounts of Si and Ti on the surface of the Cu film shown in FIGS. 6A to 6F.
Figure 7B:
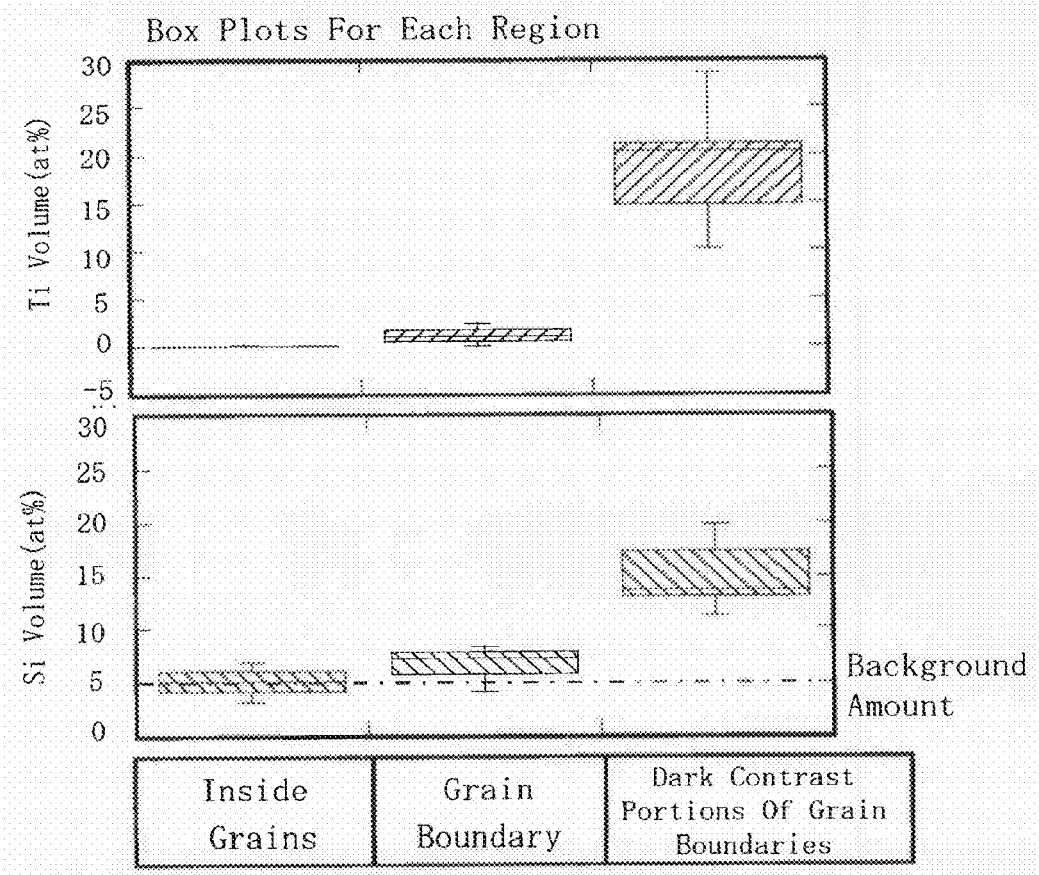

FIGS. 6A to 6F are photos showing examples of diffusion conditions of Ti in the surface of the Cu film when no cap film is formed. FIGS. 6A to 6C are STEM photos, FIG. 6D is an HAADF-STEM photo corresponding to FIG. 6A, FIG. 6E is an HAADF-STEM photo corresponding to FIG. 6B, and FIG. 6F is an HAADF-STEM photo corresponding to FIG. 6C. An HAADF-STEM image is for viewing a contrast of intensity differences of a scattered electron beam by using a function of the atomic weight and density of an element. These observations and analyses were performed over a Cu diffusion barrier film of SiC or the like formed when an upper-layer wire layer is formed on a Cu film. It can be seen that the contrast of grain boundary portions of HAADF-STEM photos is high in the vicinity of points of number 2 in FIG. 6A and number 7 in FIG. 6B of these STEM images. FIGS. 7A and 7B shows analysis results by EDX, confirming deposition of Ti. It can be seen that when no cap film is formed, Ti is locally segregated on grain boundaries of the surface of the Cu film.

FIGS. 7A and 7B are graphs showing results of analyzing amounts of Si and Ti on the surface of the Cu film shown in FIGS. 6A to 6F. Amounts of Si and Ti inside grains of the surface of the Cu film, in grain boundaries and particularly dark contrast portions among grain boundaries shown in FIGS. 6A to 6C were analyzed. FIG. 7A shows amounts of Si and Ti side by side as bar charts. FIG. 7B shows amounts of Si and Ti separately. A portion of the detected amount of Si includes Si in an upper-layer dielectric film and the assumed Si amount of the upper-layer dielectric film is indicated by a dotted line as a background. Also from these results, it can be seen that Ti is segregated in particularly dark contrast portions among grain boundaries. These results also show that a large amount of Si is present where a large amount of Ti is present. Si detected when no cap film is formed indicates excessive Si having partially no bond when a diffusion barrier film of SiC and the like that is formed when an upper-layer wiring layer is formed on the Cu film.

Figure 8C:
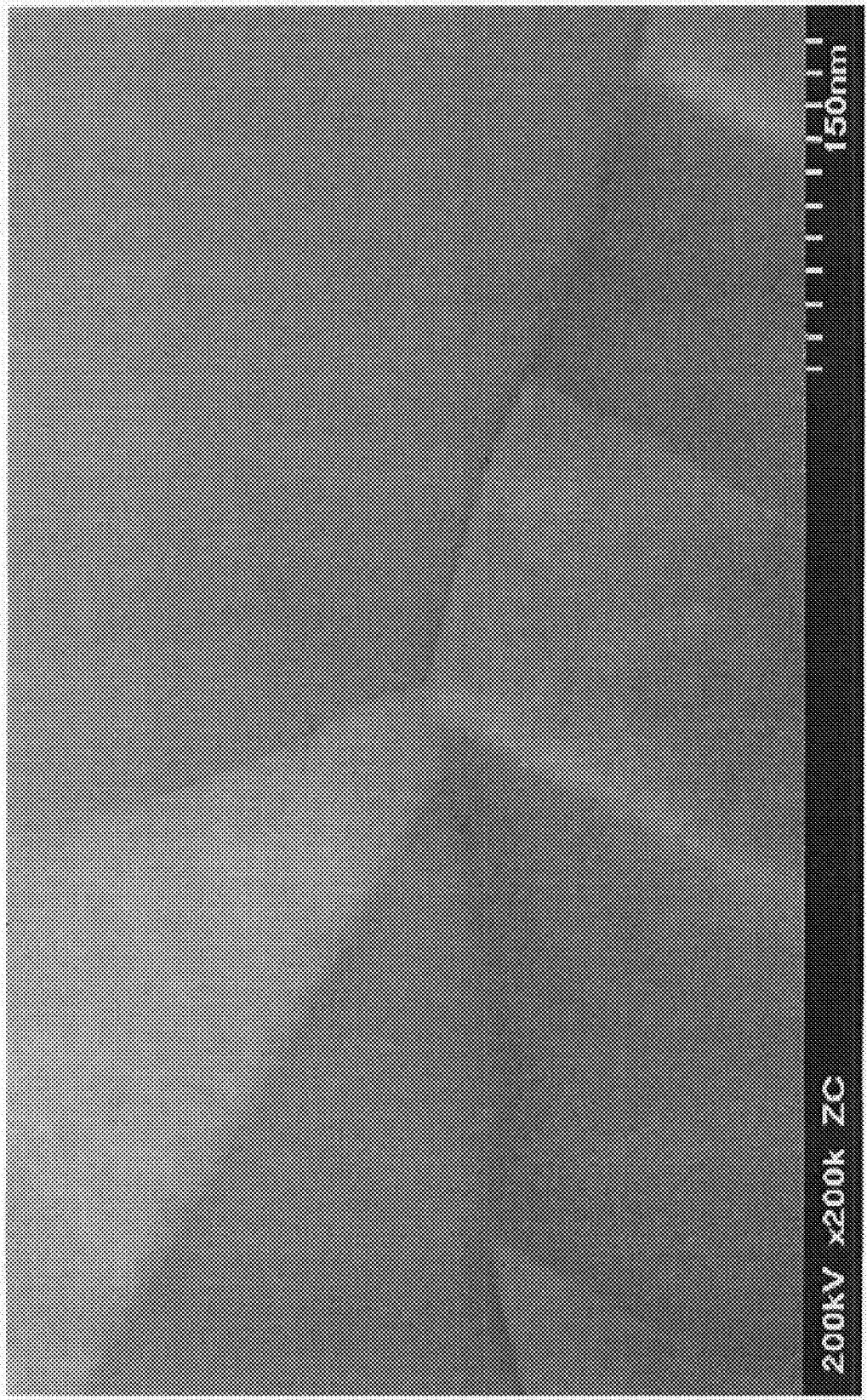
Figure 8D:
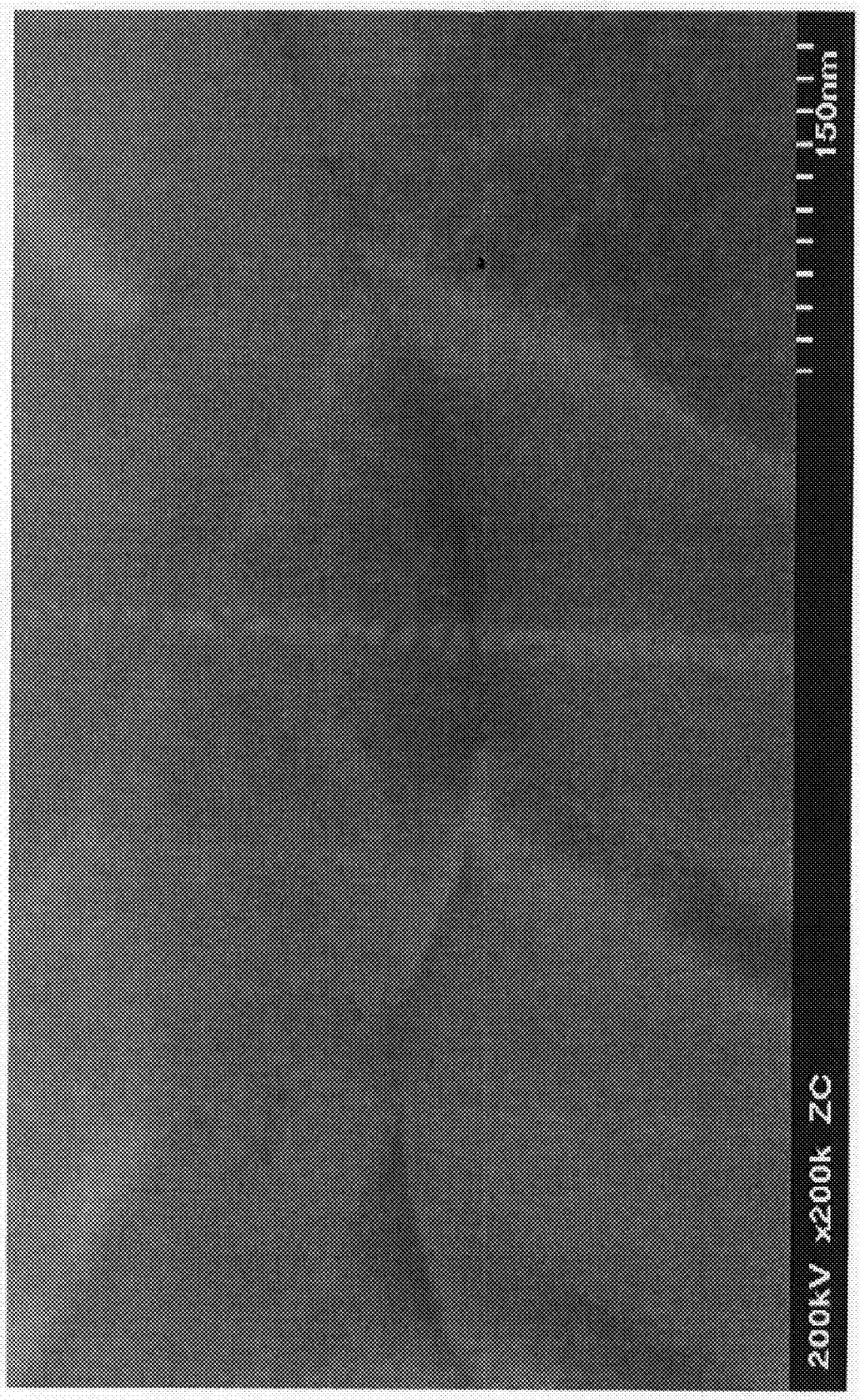

FIGS. 8A to 8D are photos showing examples of diffusion conditions of Ti on the surface of the Cu film when a cap film is formed. FIGS. 8A and 8B are STEM photos, FIG. 8C is an HAADF-STEM photo corresponding to FIG. 8A, and FIG. 8D is an HAADF-STEM photo corresponding to FIG. 8B. Comparison with FIGS. 6A to 6F shows that no local deposition of high Ti contrast is observed. Also from these STEM photos, it can be seen that Ti is widely distributed in grain boundaries of the surface of the Cu film when a cap film is formed.

Figure 9A:
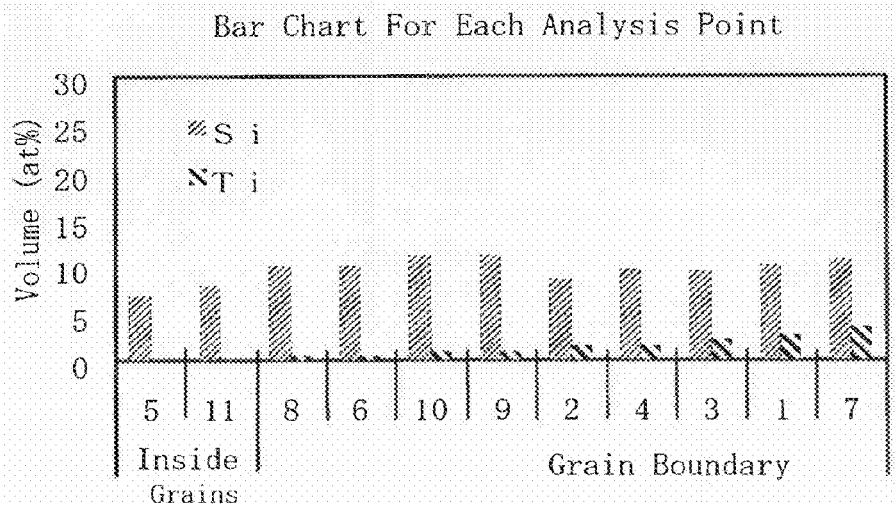
FIGS. 9A and 9B are graphs showing results of analyzing the amounts of Si and Ti on the surface of the Cu film shown in FIG. 8.
Figure 9B:
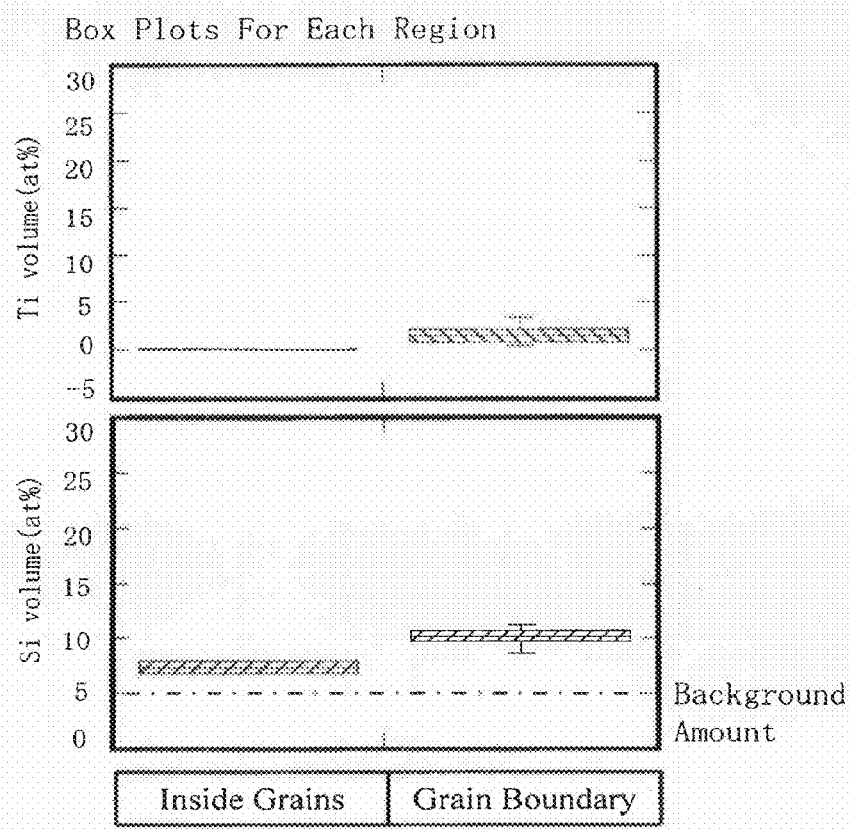

FIGS. 9A and 9B are graphs showing results of analyzing the amounts of Si and Ti on the surface of the Cu film shown in FIG. 8. Since there is no dark contrast portion among grain boundaries, amounts of Si and Ti inside grains and in grain boundaries were analyzed. FIG. 9A shows amounts of Si and Ti side by side as bar charts. A portion of the detected amount of Si includes Si in an upper-layer dielectric film and the assumed Si amount of the upper-layer dielectric film is indicated by a dotted line as a background. FIG. 9B shows amounts of Si and Ti separately. Also from these results, it can be seen that Ti is substantially uniformly distributed in grain boundaries. These results also show that a large amount of Si is present where a large amount of Ti is present. Si detected when a cap film is formed indicates Si supplied when the cap film 270 is formed.

This phenomenon will be described below. When CuSix is formed in the process of forming the CuSiN film 270, Si is relatively uniformly supplied to the surface of Cu. The Si is present in as state having bond with Cu or without having bond with Cu. On the other hand, Ti diffuses through grain boundaries in Cu at temperature of annealing after plating and even at a temperature of cap Si formation. While silicide of Ti is formed into a compound at 550° C. or higher, it is known that an inter-diffused micro-crystal region is formed in a portion in contact with Si even at a lower temperature. Generally, an initial layer of the reaction starts an interdiffusion reaction close to about 200 to 250° C. or lower, which is the formation temperature of stable silicide. On the other hand, as shown in Table 1, TiSix is more stable than CuSiX and thus, TiSix is mainly formed in an Si region uniformly formed on the surface of Cu and locations where Si is present. When SiC, which is a dielectric film (etching stopper film) formed on a Cu wire, is formed without undergoing a cap process, there is not a sufficient amount of Si having no bond is present Cu during a cap film formation process and thus uniform Si that can react is not present on the surface of Cu. Therefore, Ti is locally deposited and Si is concentrated in portions of high Ti concentrations when SiC is formed due to a thermal process thereafter and it can be considered that regions with high concentrations of both Ti and Si. That is, a supply process of a sufficient amount of Si that can react with Ti turns out to be necessary to form a uniform distribution of Ti.

Figure 10A:
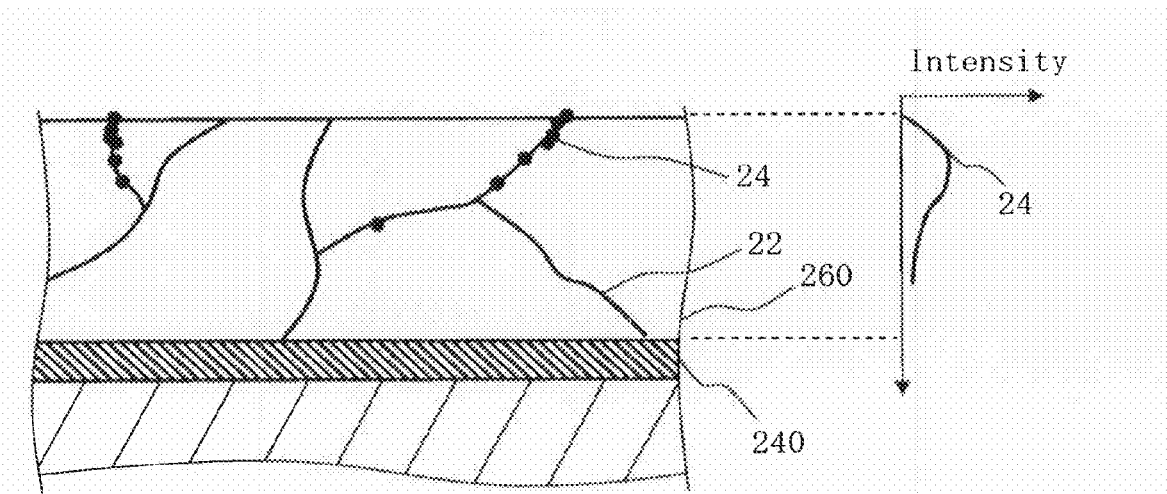
FIGS. 10A and 10B are conceptual diagrams showing examples of diffusion conditions of Ti in a cross section of the Cu film in the first embodiment.
Figure 10B:
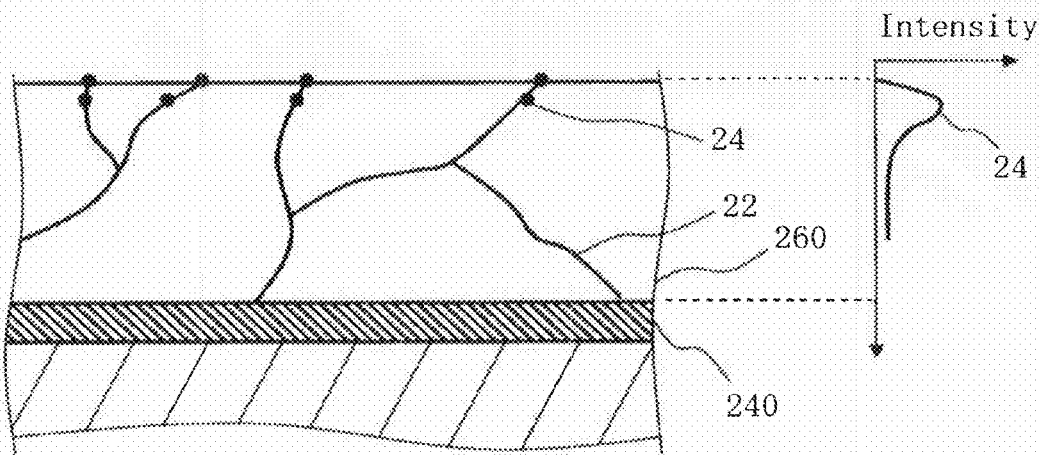

FIGS. 10A and 10B are conceptual diagrams showing examples of diffusion conditions of Ti in a cross section of the Cu film in the first embodiment. FIG. 10A shows a case in which the cap film 270 is not formed and FIG. 10B shows a case in which the cap film 270 is formed. As has been described above, Ti is locally segregated in grain boundaries when the cap film 270 is not formed and thus, Ti is smoothly distributed in the depth direction by averaging segregation portions and other portions. However, if the cap film 270 is formed, as shown in FIG. 10B, it can be seen that the Ti 24 is distributed and stabilized in an Si region on a Cu wire so that the Ti 24 of the BM film 240 is relatively concentrated on the grain boundary 22 in an upper part of the Cu film 260. Accordingly, EM is effectively improved. When Ti is applied as BM, for example, if Ti-rich TiN is applied and the amount of supply of Ti in a wire is suppressed in order to make resistance lower, Ti is concentrated in Si regions and thus, it becomes possible to effectively utilize Ti necessary for EM improvement. Incidentally, the figures do not show that the Ti 24 diffused to the grain boundary 22 does not present in a lower part or center part of the Cu film 260 present, but show that the Ti 24 is relatively more concentrated in the grain boundary 22 in the upper part of the Cu film 260.

Figure 11B:
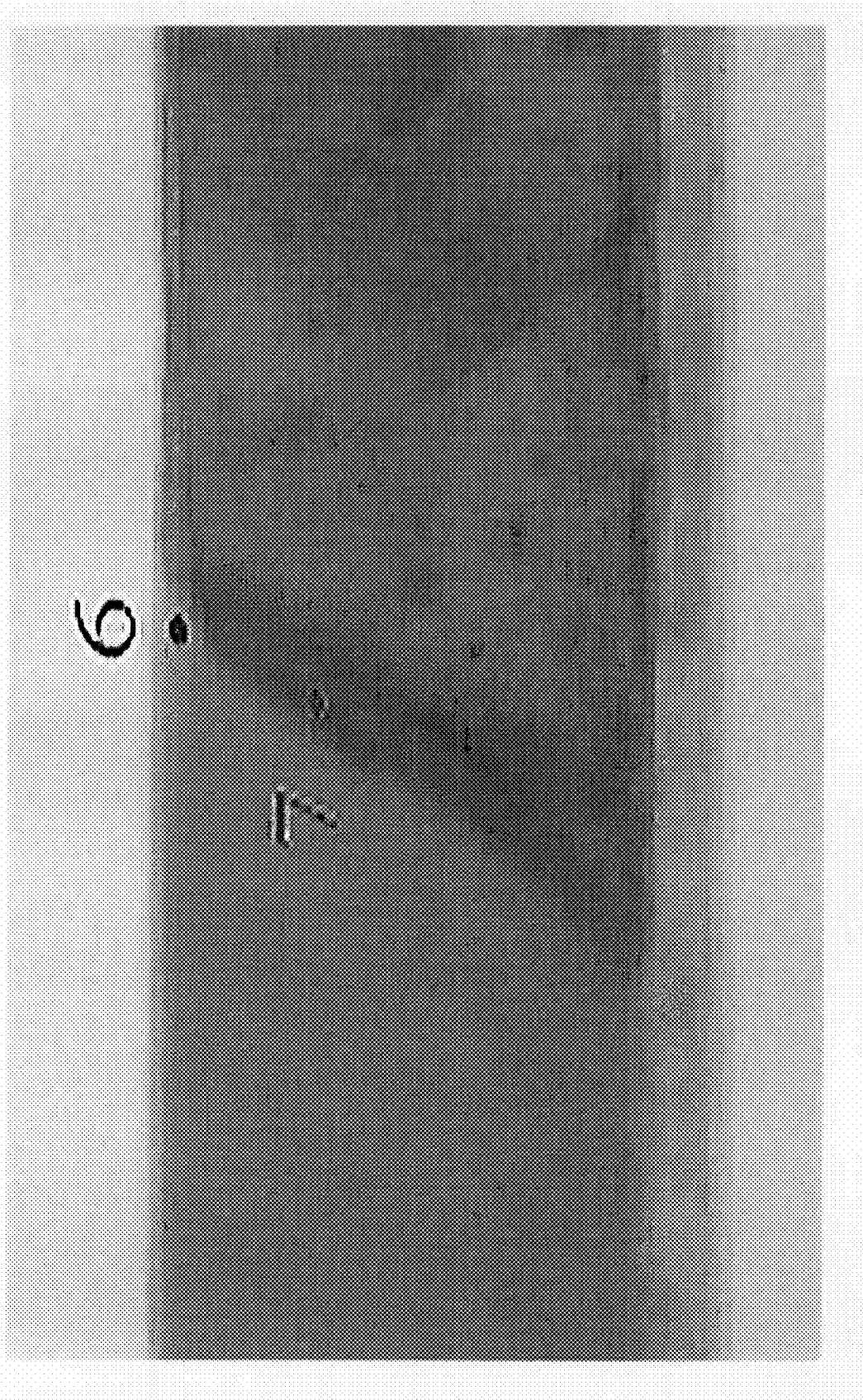
Figure 11C:
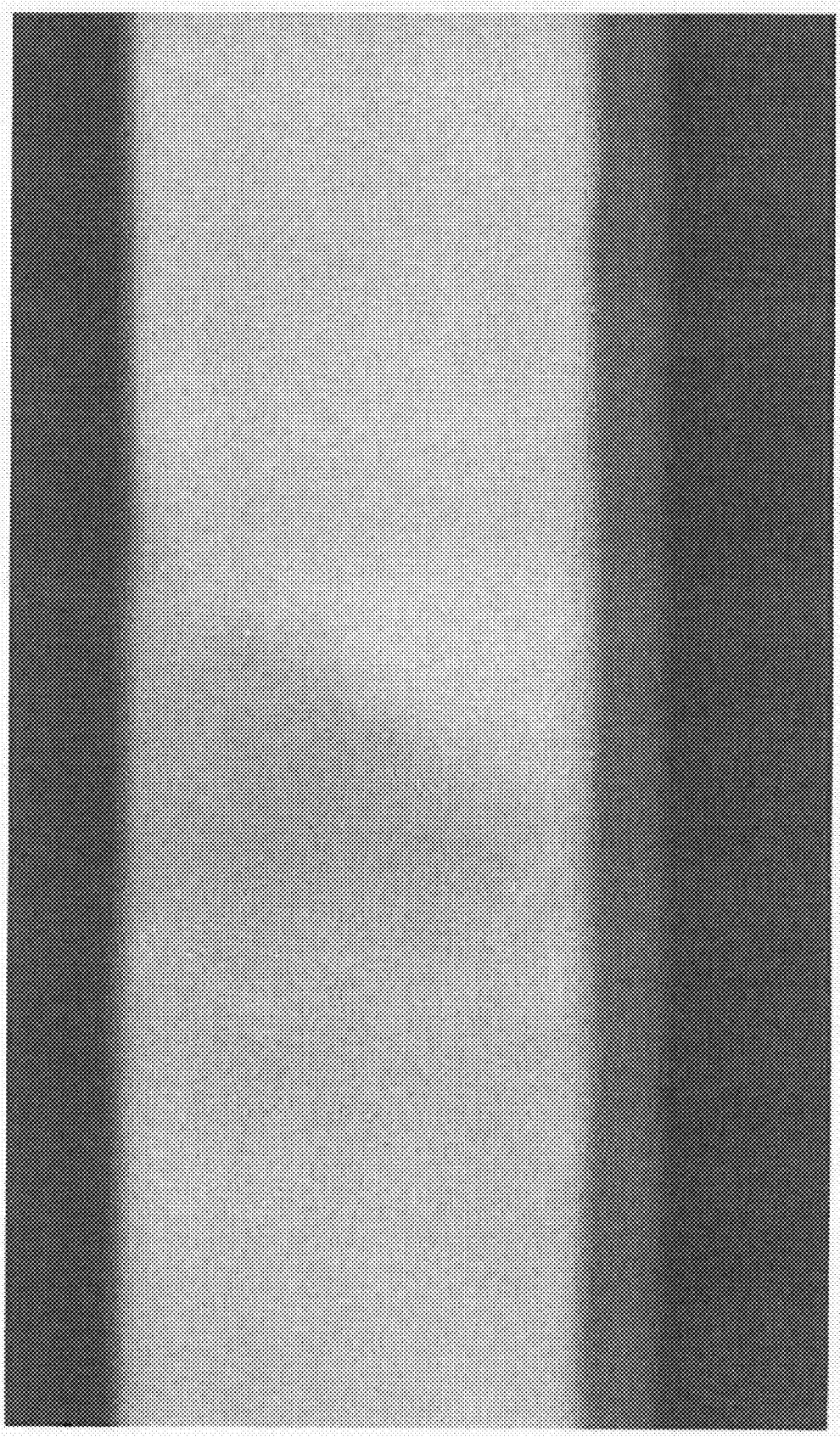
Figure 11D:
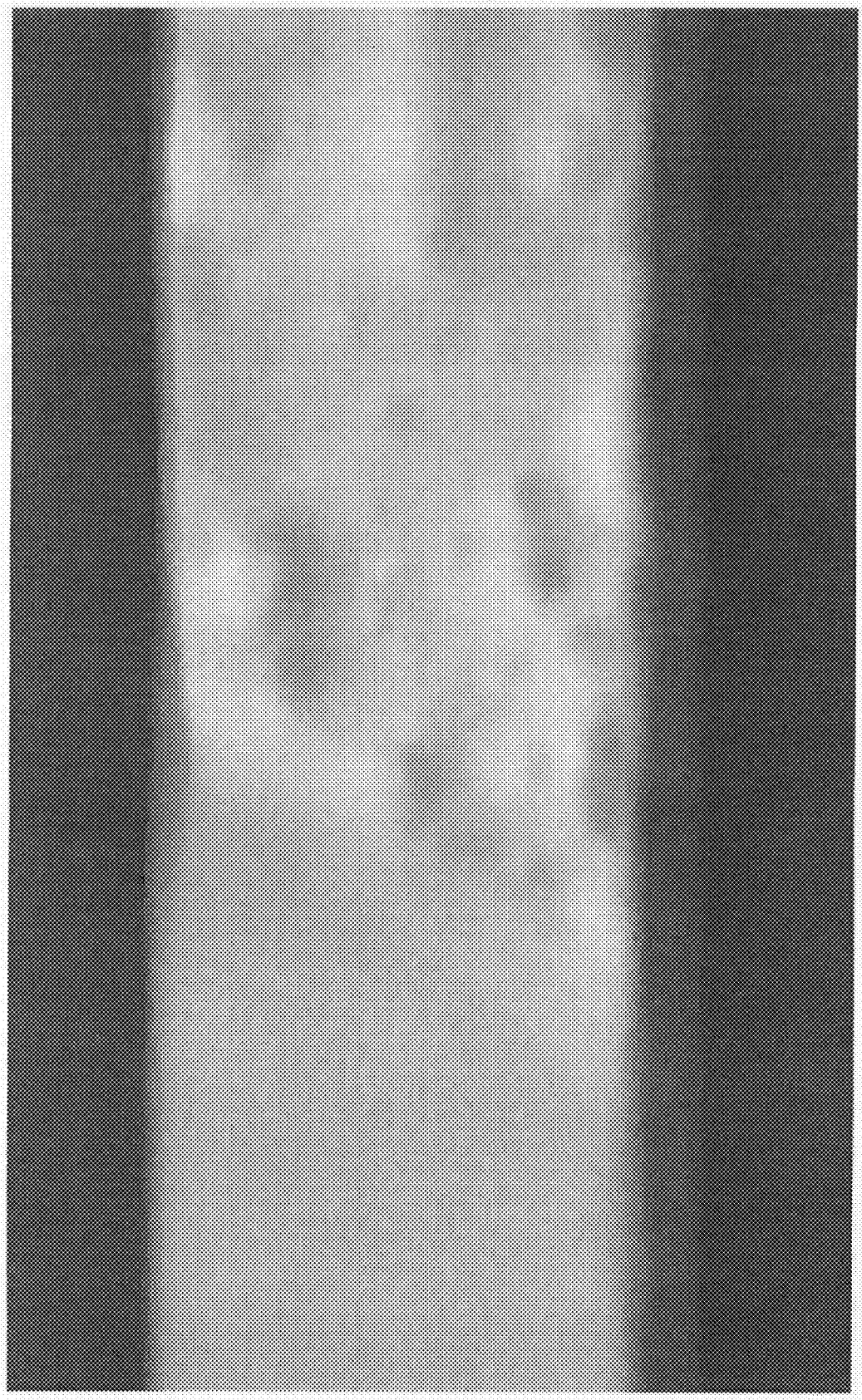

Next, results of examination of the diffused element distribution in the depth direction in the present embodiment are shown. FIGS. 11A to 11D are photos showing examples of diffusion conditions of Ti in the cross section of the Cu film when no cap film is formed. FIGS. 11A and 11B show STEM photos. FIG. 11C shows an analysis point portion corresponding to FIGS. 11A and 11D shows an HAADF-STEM photo corresponding to FIG. 11B.

Figure 12A:
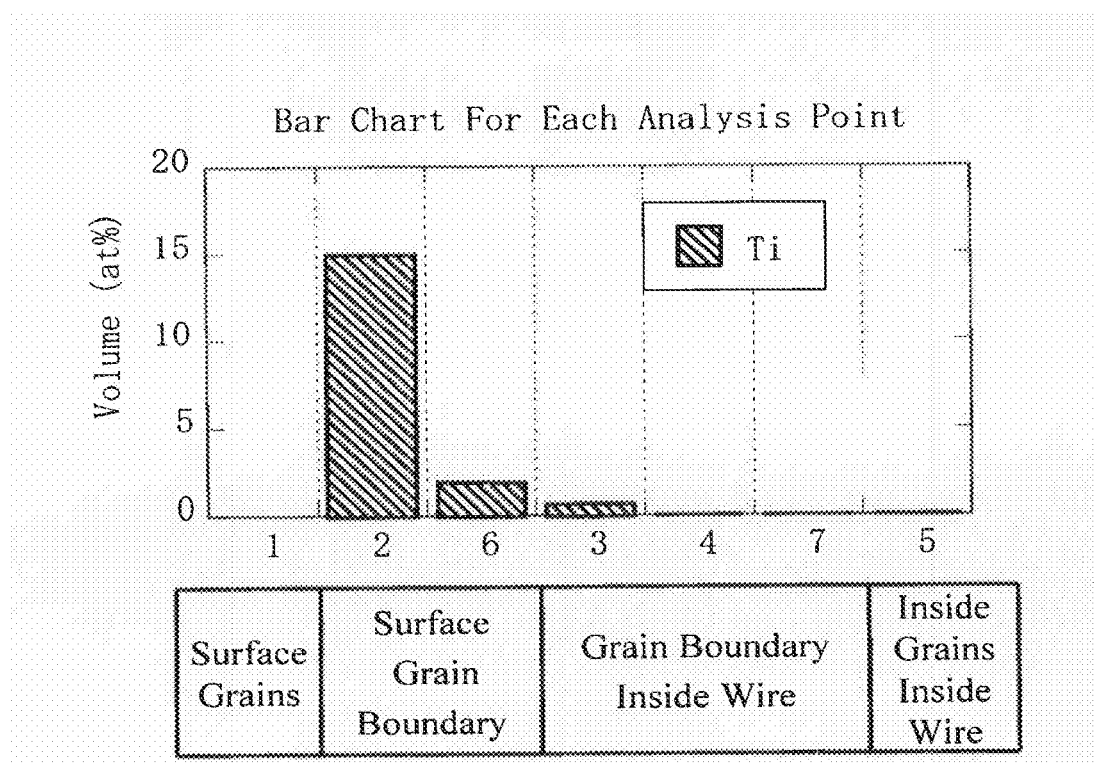
FIGS. 12A and 12B are graphs showing results of analyzing the amount of Ti in the cross section of the Cu film shown in FIGS. 11A to 11D.
Figure 12B:
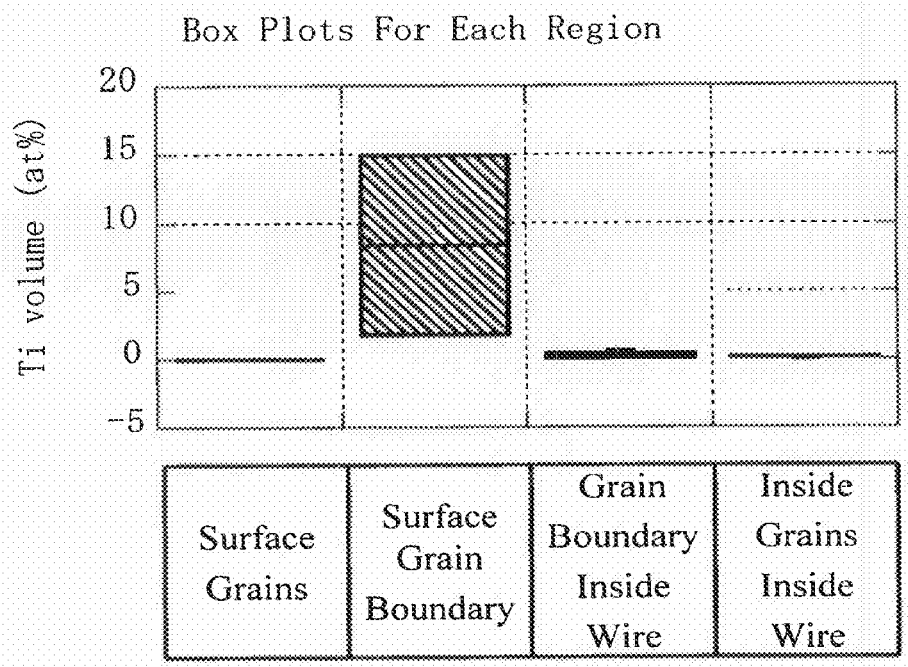

FIGS. 12A and 12B are graphs showing results of analyzing the amount of Ti in the cross section of the Cu film shown in FIGS. 11A to 11D. FIG. 12A shows the amounts of Ti at analysis points side by side as bar charts. FIG. 12B shows total amounts of Ti at all analysis points in each of Cu film surface grains, grain boundaries of the surface of Cu film, grain boundaries inside the Cu film, and inside grains inside the Cu film side by side as bar charts. Analysis points in grain boundaries of the surface of Cu film and grain boundaries inside the Cu film are assumed to be positions where Ti is segregated on the surface. From these results, it can be seen that almost all Ti diffused into the Cu film 260 from the BM film 240 is concentrated in locations of grain boundaries of the surface of Cu film.

Figure 13A:
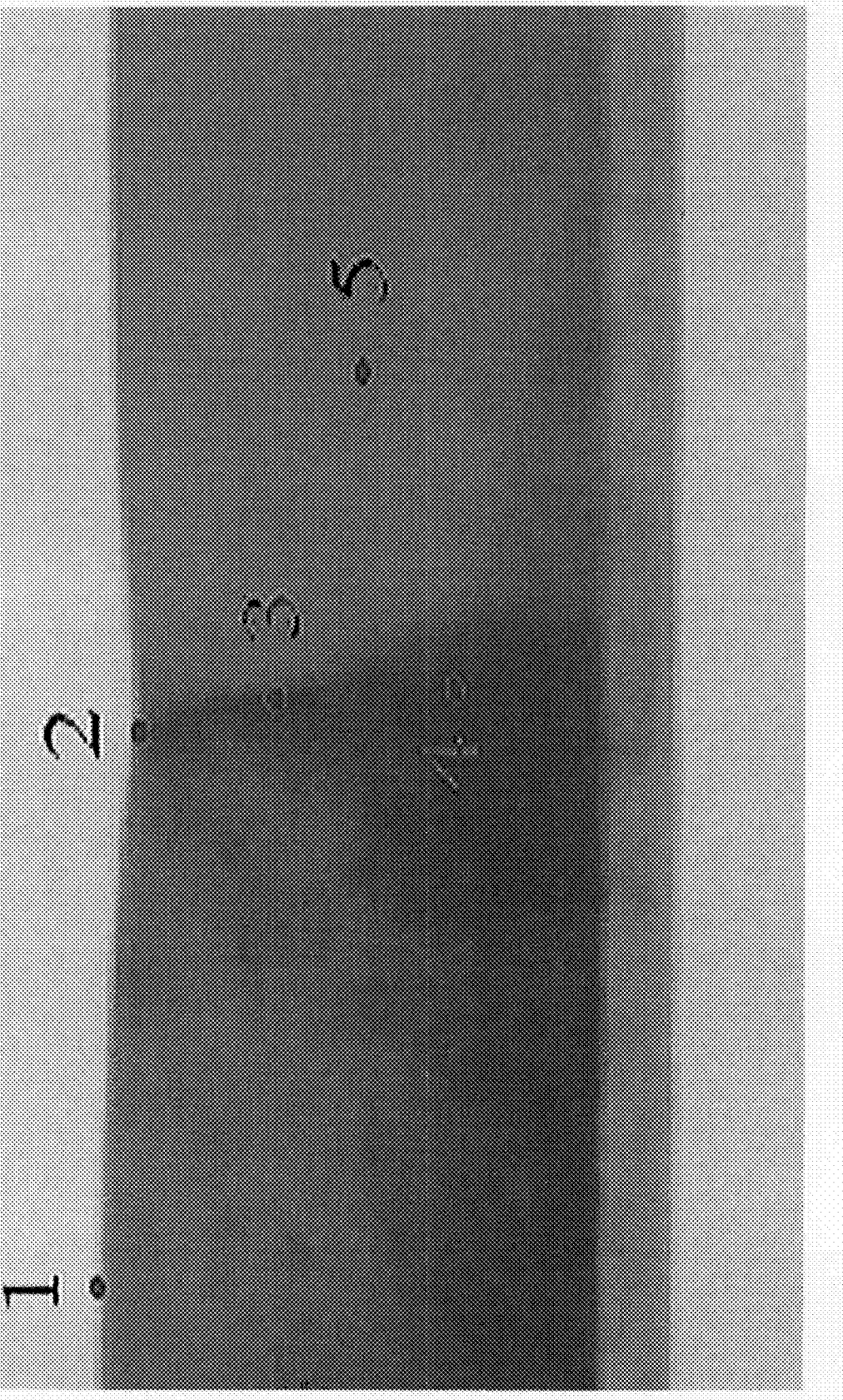
FIGS. 13A to 13D are photos showing examples of diffusion conditions of Ti in the cross section of the Cu film when the cap film is formed.
Figure 13B:
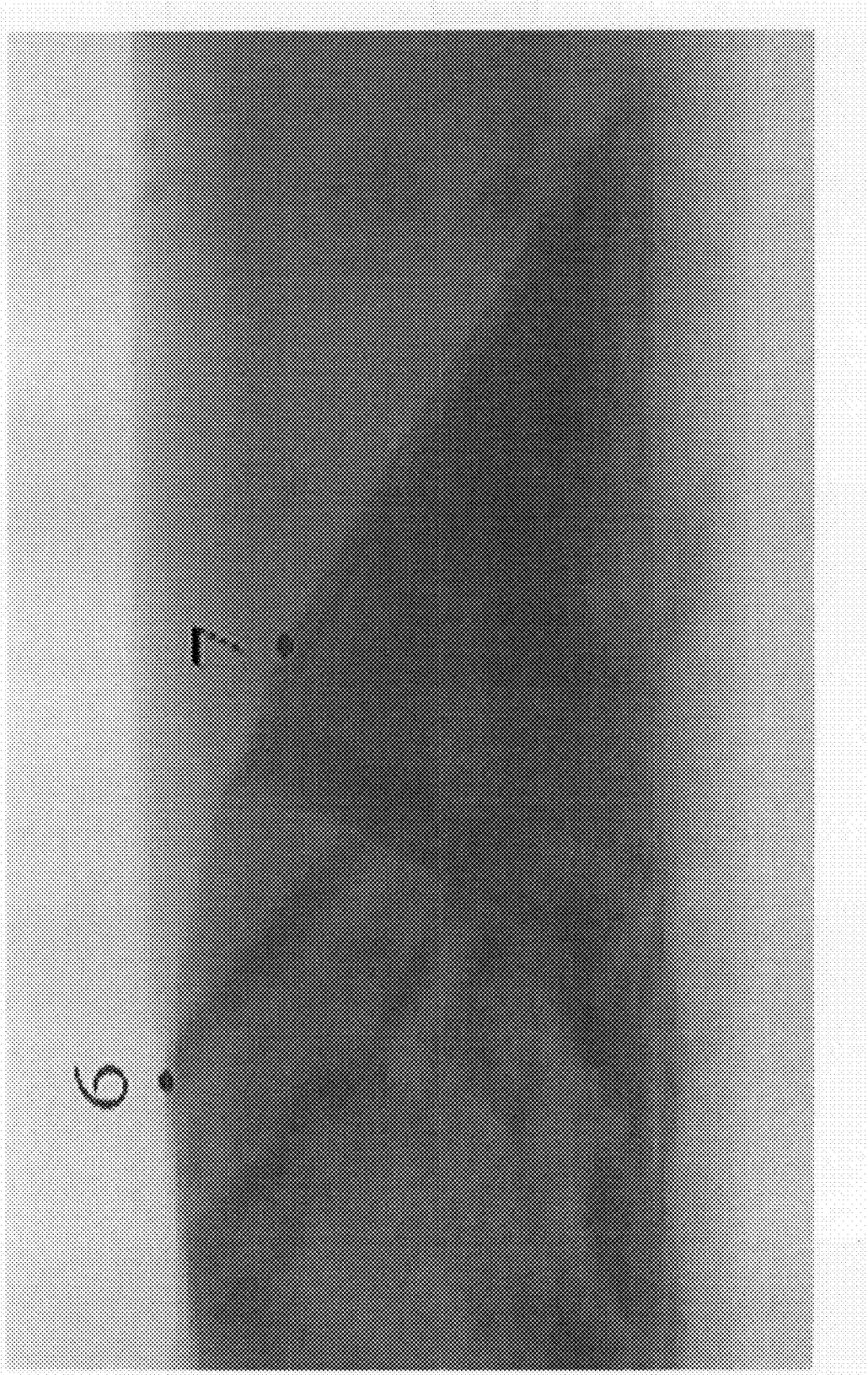
Figure 13C:
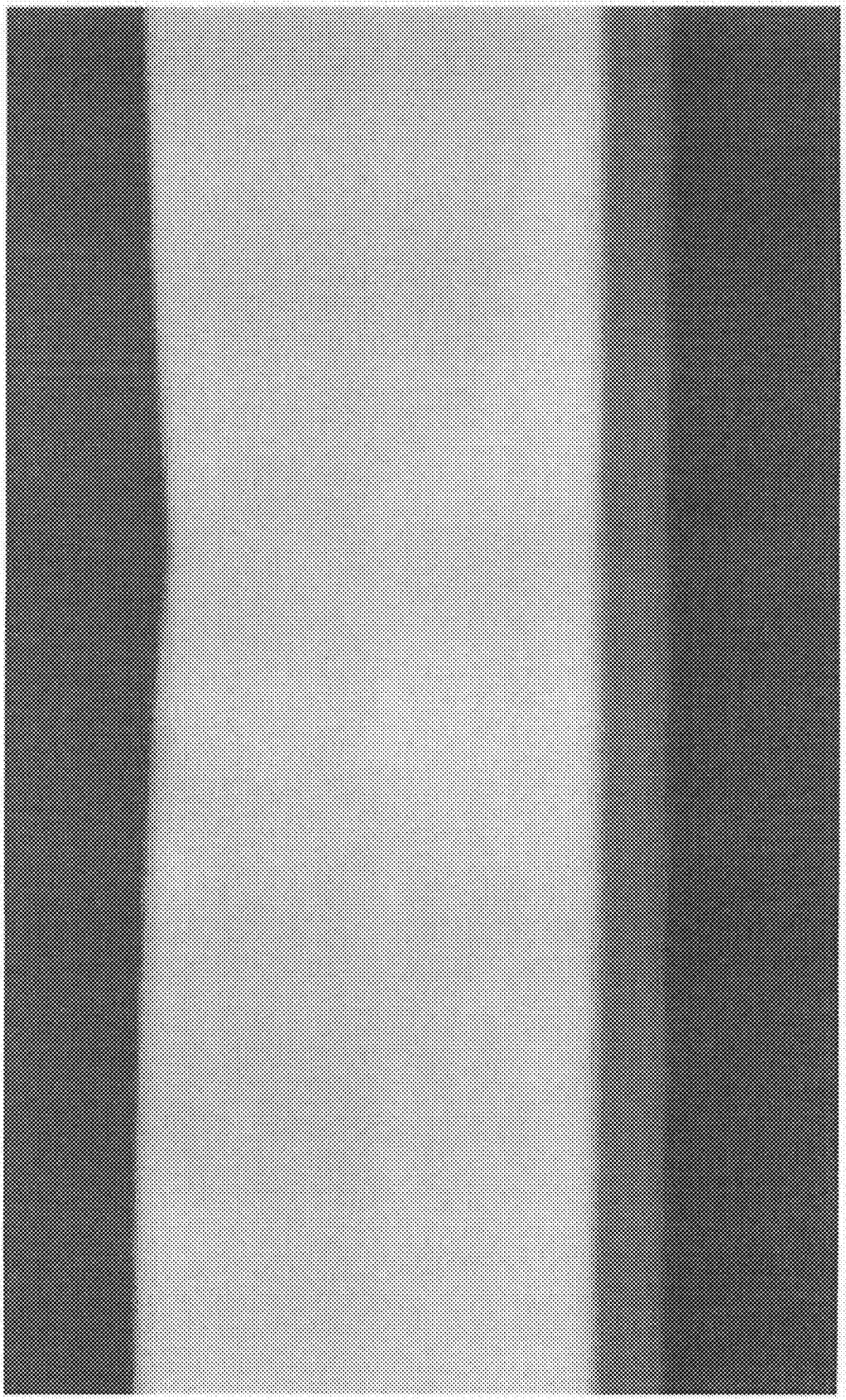
Figure 13D:
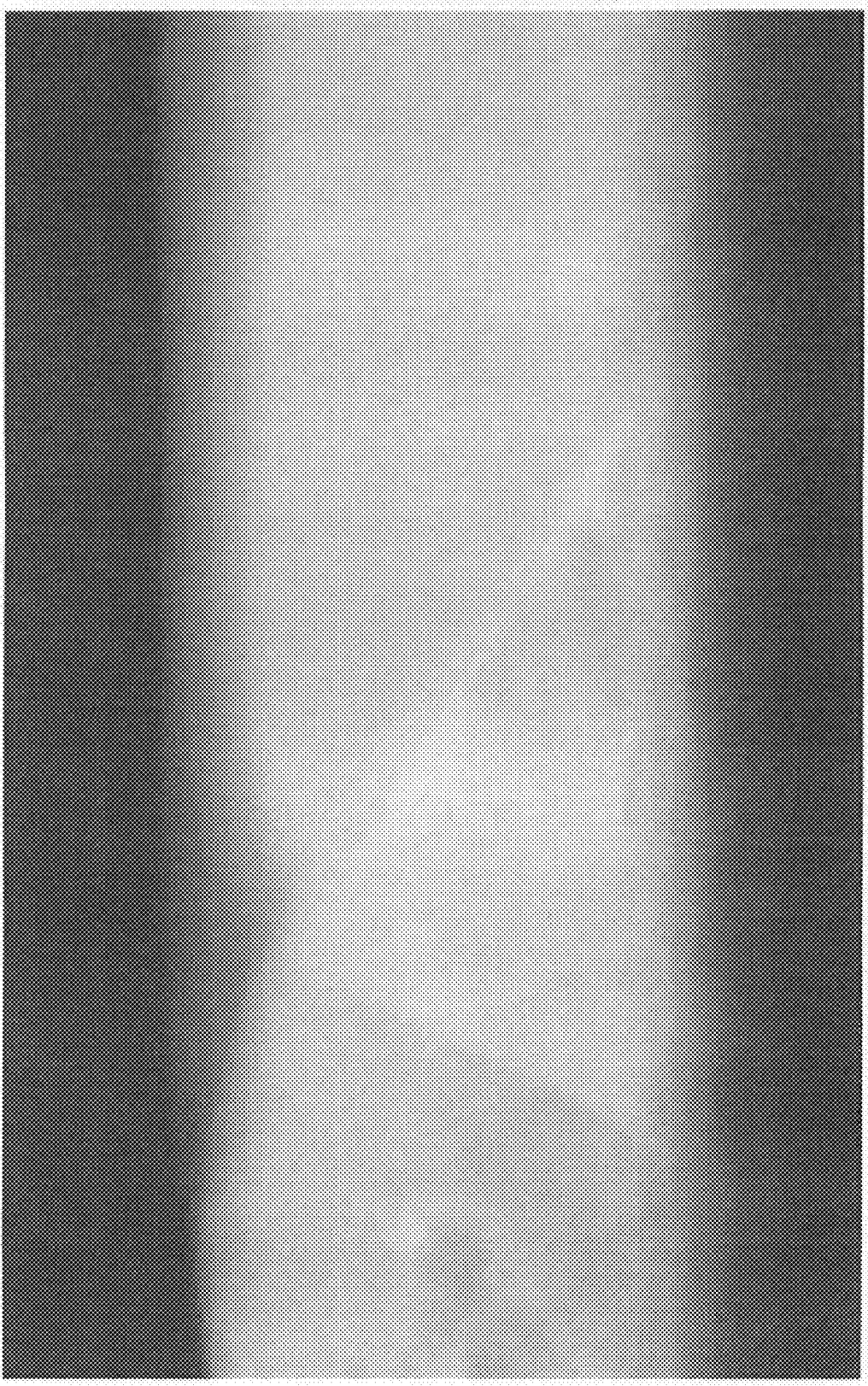

FIGS. 13A to 13D are photos showing examples of diffusion conditions of Ti in the cross section of the Cu film when the cap film is formed. FIGS. 13A and 13B show STEM photos. FIG. 13C shows an analysis point portion corresponding to FIGS. 13A and 11D show an HAADF-STEM photos corresponding to FIG. 11A.

Figure 14A:
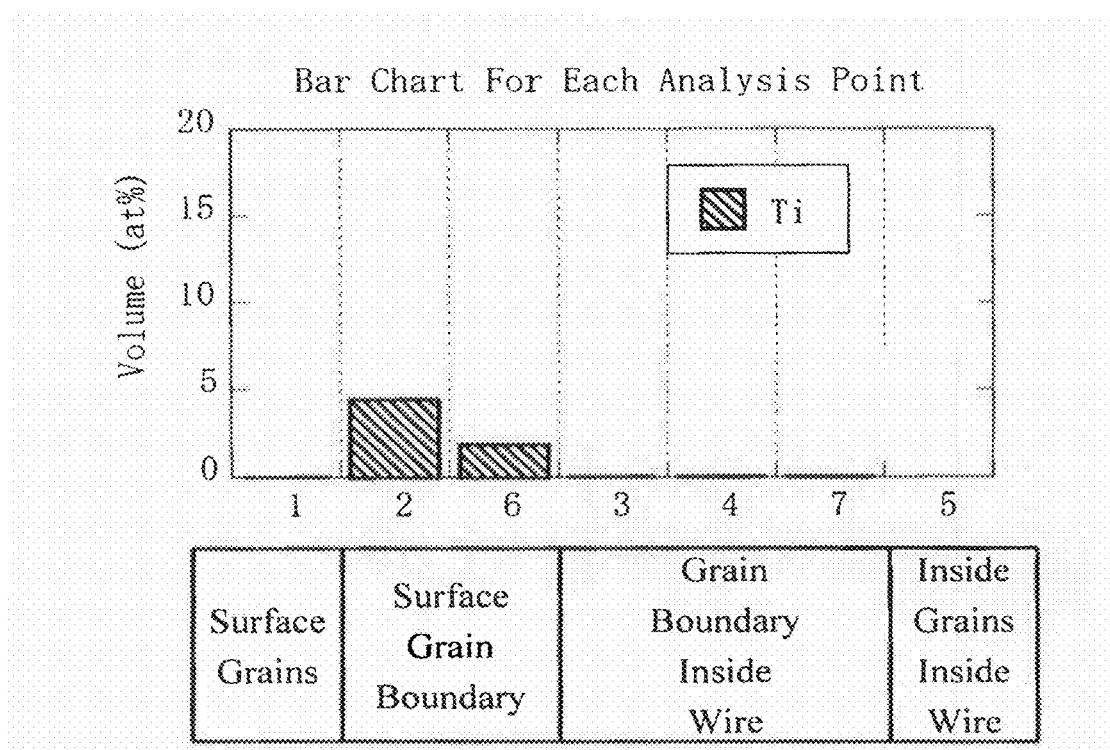
FIGS. 14A and 14B are graphs showing results of analyzing the amount of Ti in the cross section of the Cu film shown in FIGS. 13A to 13D.
Figure 14B:
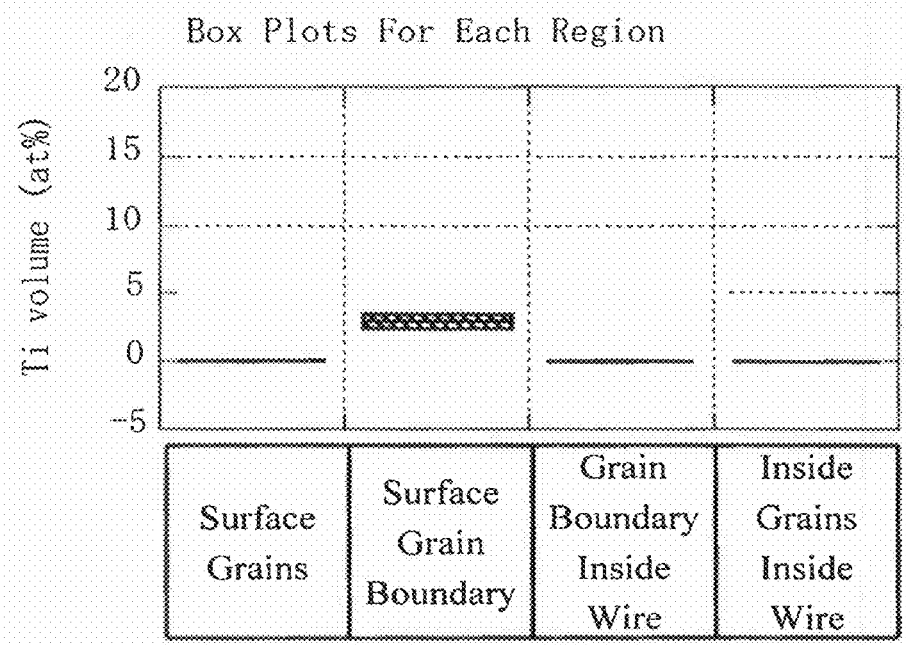

FIGS. 14A and 14B are graphs showing results of analyzing the amount of Ti in the cross section of the Cu film shown in FIGS. 13A to 13D. FIG. 14A shows the amounts of Ti at analysis points side by side as bar charts. FIG. 14B shows total amounts of Ti at all analysis points in each of Cu film surface grains, grain boundaries of the surface of Cu film, grain boundaries inside the Cu film, and inside grains inside the Cu film side by side as bar charts. Also from these results, it can be seen that almost all Ti diffused into the Cu film 260 from the BM film 240 is concentrated in locations of grain boundaries of the surface of Cu film. Because the amount of Ti at analysis points when a cap film is formed is smaller than that in the example shown in FIGS. 12A and 12B in which Ti is segregated, it can be said that Ti is substantially uniformly distributed in grain boundaries of the surface of Cu film when a cap film is formed.

Figure 15:
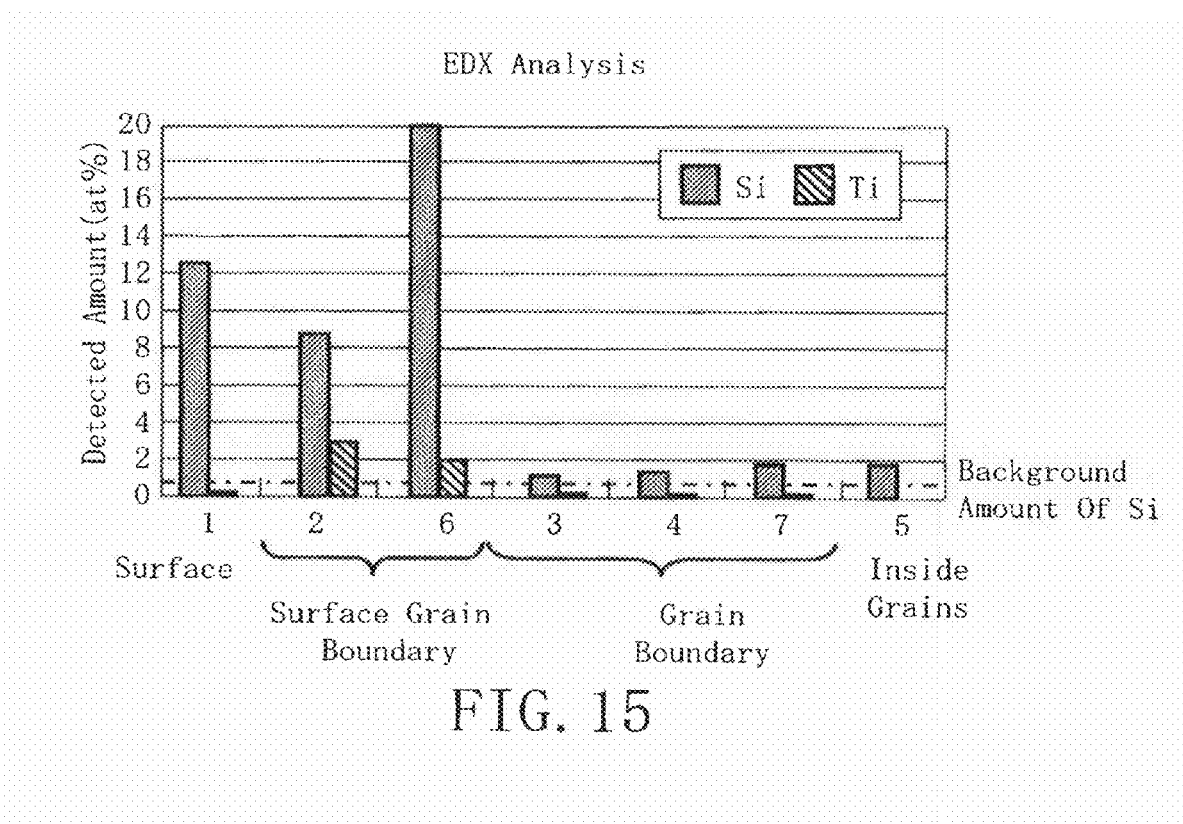
FIG. 15 is a graph showing a result of analyzing the amounts of Si and Ti in the cross section of the Cu film where the cap film in the first embodiment is formed.

FIG. 15 is a graph that shows results of analyzing Ti and Si in the cross section of the Cu film shown in FIGS. 13A to 13D. Since a portion of the amount of Si in FIG. 15 includes a background of analysis, the assumed background amount is shown by a dotted line. As shown in FIG. 15, Si is formed on a wire and is distributed in grain boundaries of Cu and also relatively in a deeper direction of the wire depth. On the other hand, even though Ti is supplied below the wire as a barrier metal, it is observed that Ti is present in Si regions above the wire in the highest concentrations and decreases in the depth direction.

A further description of why it is preferable to set the formation temperature of the cap film 270 to below 300° C. will be provided below.

Figure 16A:
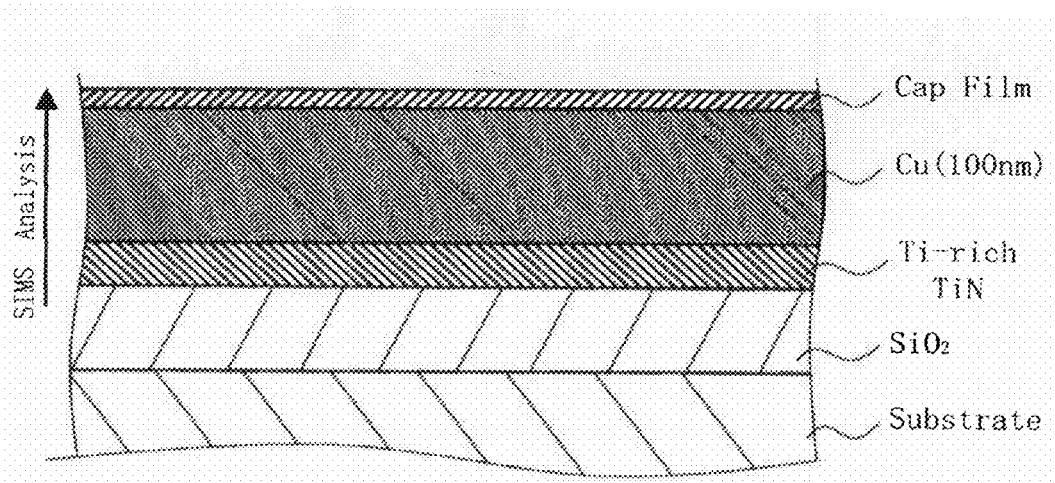
FIGS. 16A to 17B are diagrams showing results of detecting the amount of Si in Cu by a secondary ion mass spectrometry (SIMS analysis).
Figure 16B:
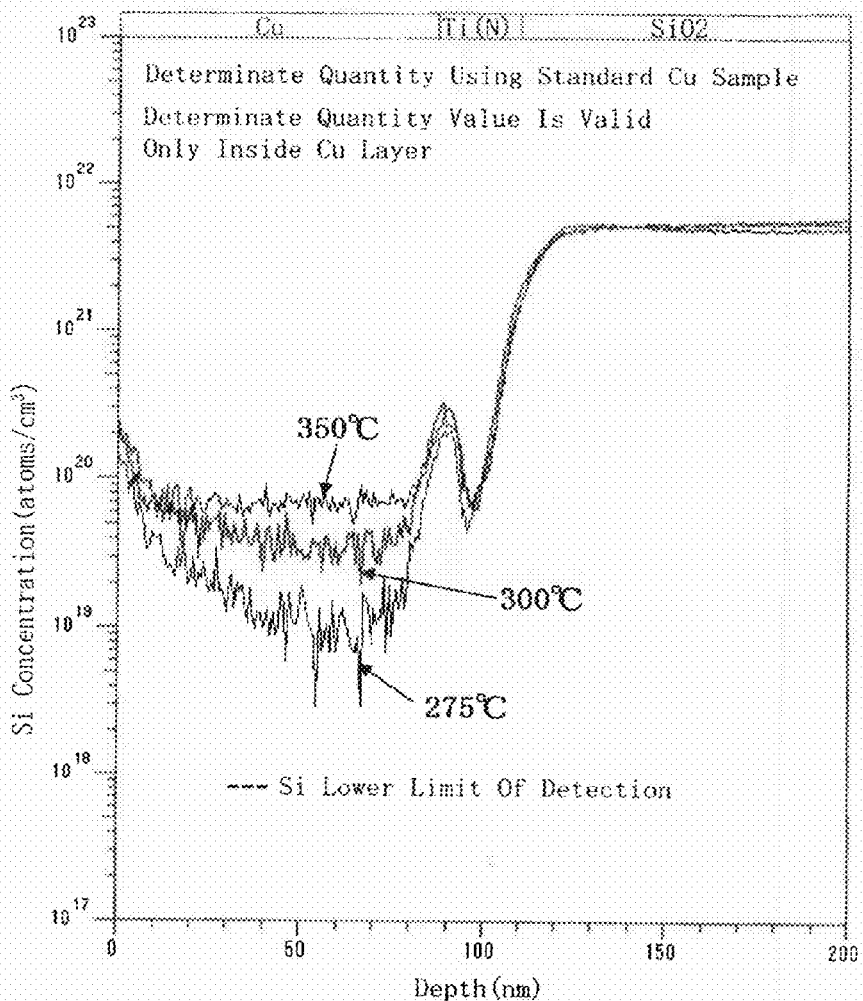

FIGS. 16A and 16B are diagrams showing results of detecting the amount of Si in Cu by a secondary ion mass spectrometry (SIMS analysis). A sample used for measurement were obtained by forming a cap film on the surface of Cu film without any pattern as shown in FIG. 16A and the analysis was performed from the rear side of the Si substrate as shown by an arrow in FIG. 16A. FIG. 16A shows a sample obtained by forming an SiO$_2$ film, the barrier metal film 240, the Cu film 260, and the cap film 270 on a substrate in this order. Here, a Ti-rich TiN film (hereinafter, may be denoted as Ti (N)) is used as the barrier metal film 240. To form a Ti-rich TiN film, first Ti is formed, and then an N$_2$ gas is introduced into the same chamber at the flow rate of 50 to 200 sccm, whereby a TiN is formed on the surface of the Ti film. It is suitable that the Ti-rich TiN film is formed with Ti of about 80% and TiN of about 20%, for example.

In FIG. 16B, the horizontal axis shows the distance in the depth direction by setting the outermost surface of Cu of the sample shown in FIG. 16A as zero. The vertical axis shows Si concentrations at each position. The temperature of each graph shown in FIG. 16B shows the formation temperature of a cap film. Regarding the formation method of a cap film, other conditions than the temperature are the same in all cases and the supply amount of Si to Cu from the surface is constant.

As shown in FIG. 16B, the amount of Si in Cu increases as the film formation temperature of a cap film rises. Thus, Si diffused into Cu increases wire resistance. The reason is considered that Si present in grain boundaries of Cu is more likely to penetrate into grains of Cu if the film formation temperature of a cap film becomes higher and Si present in grains of Cu increases wire resistance. Thus, as shown in FIG. 16B, if the film formation temperature of a cap film is lowered to 300° C. of the substrate temperature, the amount of Si in Cu decreases and if the temperature is further lowered to 275° C., diffusion of Si is further reduced. The reason is considered that if the film formation temperature of a cap film is lowered to below 300° C. of the substrate temperature, Si present in grain boundaries of Cu is less likely to penetrate into grains of Cu compared with when the film formation temperature of a cap film is 300° C. or higher. Thus, by lowering the film formation temperature of a cap film to below 300° C., an increase in wire resistance by the formation of a cap film is suppressed (see FIG. 4 for resistance).

Also as shown in FIG. 16B, the amount of Si has a peak value near an interface between the barrier metal film and Cu film. It can be explained that the peak of Si in the interface between the barrier metal film and Cu film exists on the grain boundaries of a Cu wire from other analysis results (FIG. 28) described below. The peak of Si near the interface between the Cu film and barrier metal is also present when a cap film is formed below 300° C. Wire resistance is not increased or is increased only slightly even if another element such as Si is present in grain boundaries in Cu, but is increased when another element penetrates into grains of Cu. As shown in FIG. 4, when the cap film 270 is formed below 300° C., an increase in wire resistance due to the formation of the cap film is not observed. That is, Si has not penetrated into grains of Cu. Si in the interface between the Cu film and barrier metal shown in FIG. 16B has moved to the interface between the Cu film and barrier metal by passing through grain boundaries in a Cu wire and thus does not affect the wire resistance. That is, as shown in FIG. 16B, there is an accumulation region (high-concentration region) of Si attracted by Ti, which is the barrier metal film 240, in the interface with the barrier metal film 240 in the Cu film 260. Si is present in this accumulation region in higher concentrations than in a center part of the Cu film as silicide of Ti. Until the accumulation region of Si is filled, diffusion of Si into grains of Cu is suppressed. On the other hand, if Ta is used as the barrier metal film 240, no peak as shown in FIG. 16B is observed in the interface between the Cu film and cap film. In other words, if Ta is used as the barrier metal film 240, Si that has penetrated into grain boundaries of Cu is not attracted by Ta. Thus, Si penetrates into grains of Cu, leading to an increase in wire resistance. Since an actual Cu wire has the barrier metal film 240 present contacting with the side and at the bottom, such an accumulation region of Si is present near the interface between the barrier metal film 240 and the Cu film 260 on the side and at the bottom, to be a region where Si concentrations are higher than those in the center part of the Cu film 260. Like the bottom, Si is also present as silicide of Ti in such an accumulation region of the side in higher concentrations than in the center part of the Cu film.

It is considered that by setting the formation temperature of a cap film to below 300° C., Si is made less likely to penetrate into grains from grain boundaries of Cu, Si is passes through grains, and accumulates near the interface with the barrier metal 240 of the Cu film 260.

Figure 17A:
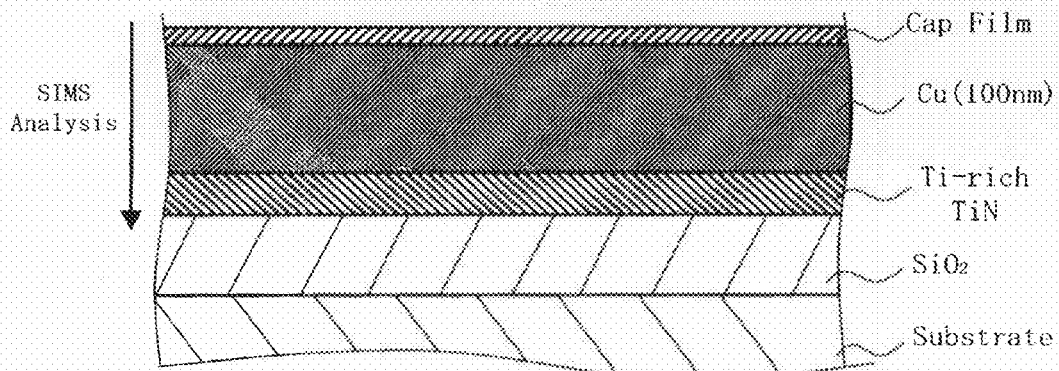
Figure 17B:
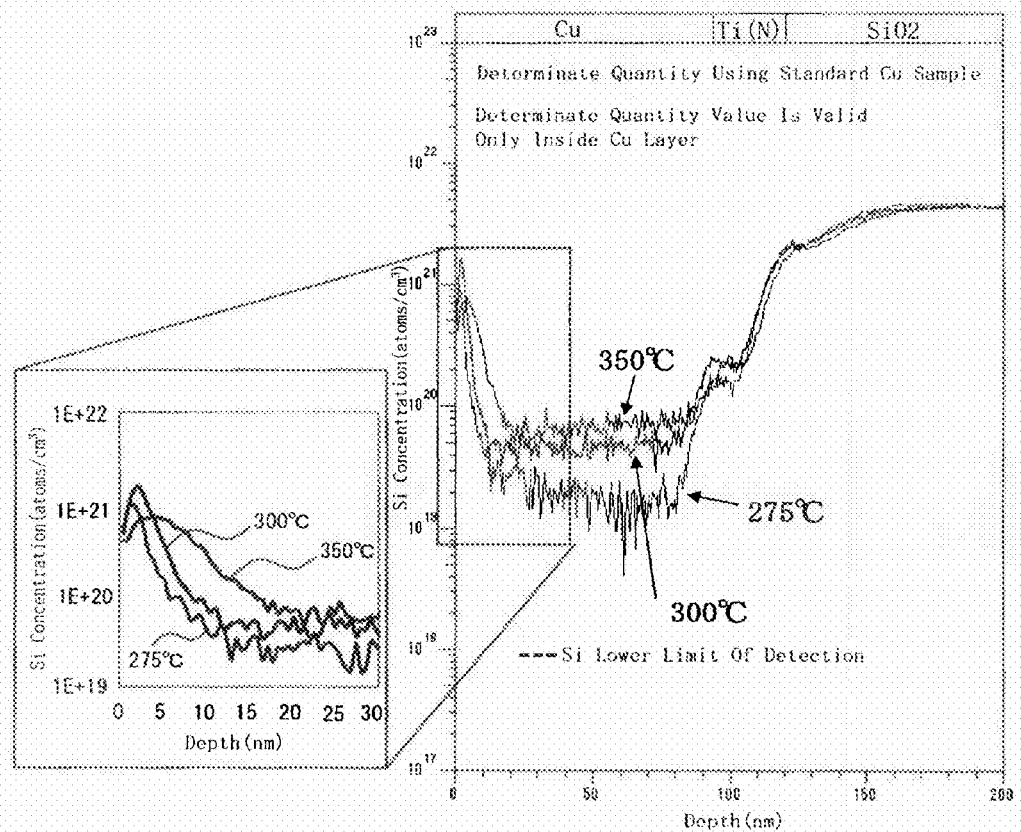

FIGS. 17A and 17B are other results of detecting the amount of Si in Cu by the secondary ion mass spectrometry (SIMS analysis). As shown in FIG. 17A, a sample used for measurement is the same as that shown in FIG. 16A. While FIGS. 16A and 16B show results of analysis from the rear (substrate) side, FIGS. 17A and 17B shows analysis results from the front (cap film) side. In FIG. 17B, the horizontal axis shows the distance in the depth direction by setting the outermost surface of Cu as zero. The vertical axis shows Si concentration at each position. Regarding the formation method of a cap film, other conditions than the temperature are the same in all cases and the supply amount of Si to Cu from the surface is constant. Ti-rich TiN is used, as described above, as the barrier metal film 240. Since detection sensitivity of the outermost surface decreases when an analysis is performed from the rear side as shown in FIG. 16B, FIG. 17B shows results of performing an analysis again by focusing on the outermost surface.

FIG. 17B shows an enlarged view of results in a region of the depth 0-30 nm of the Cu film on the left side thereof. Comparison of Si concentration at each temperature on the outermost surface, for example, in a region up to the depth of 5 nm shows that the amount of Si on the outermost surface reaches a peak value at 300° C. At 350° C., Si diffuses in the depth direction of Cu and the amount of Si in Cu increases so that the amount of Si on the outermost surface is smaller that that at 300° C. While a sample at 275° C. and 300° C. have a stable amount of Si up to the depth of about 15 nm (the same constant value as in Cu), that is, the thickness of an Si high-concentration layer in a surface region is 15 nm or less, while the thickness of the Si high-concentration layer becomes larger to about 20 nm if the formation temperature of a cap film is raised up to 350° C. Though the thickness of the Si high-concentration layer shown in FIG. 17B does not exactly match the thickness of the cap film due to characteristics of the SIMS analysis, when the formation temperature of the cap film is 350° C., the thickness of the cap film increases by about 30% compared with a case of 275° C. or 300° C. Also for reasons described later, it is preferable that the thickness of the Si high-concentration layer (that is, the thickness of the cap film) is thinner and the amount of Si on the outermost surface is larger. First of all, if the cap film is thick, the thickness of Cu film contributing to conduction decreases by the thickness of the cap film and thus, it is preferable that a cap film on the outermost surface can be formed thinner. Also from the viewpoint of the EM life, higher Si concentrations means a larger amount of Si contributing to the formation of silicide with Cu or Ti, achieving more effective suppression of Cu atom transport during EM testing.

Figure 18:
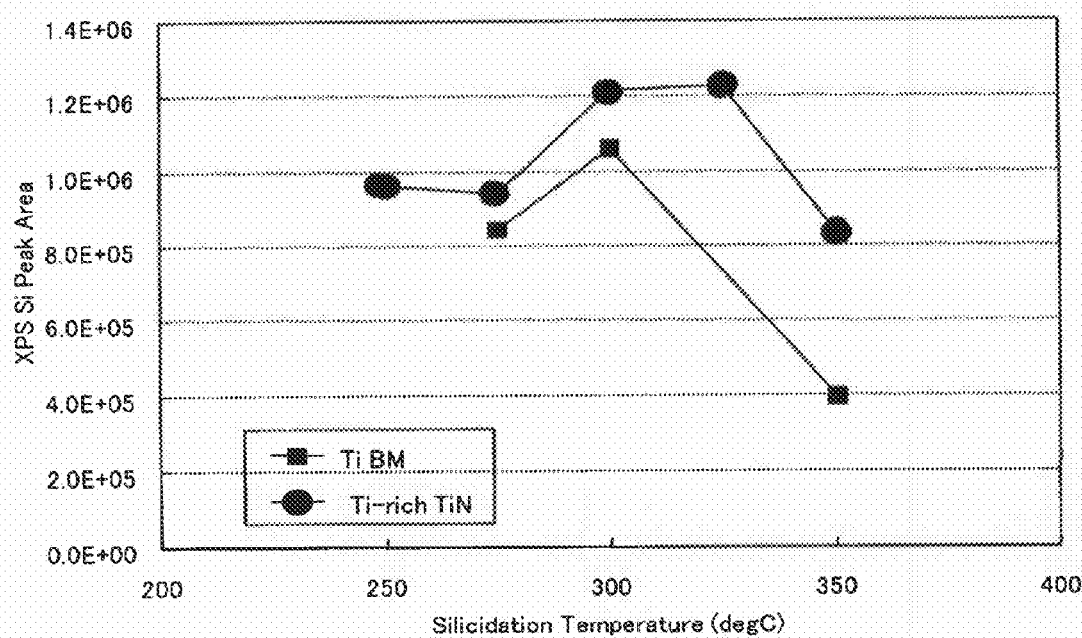
FIG. 18 is a diagram showing results of calculating a peak amount of Si on the surface Cu, that is, the amount of Si in a surface portion of Cu based on results obtained from an XPS analysis of the same sample as that in FIG. 17A.

FIG. 18 is a diagram showing results of calculating the peak amount of Si on the surface Cu, that is, the amount of Si in a surface portion of Cu based on results obtained from an XPS analysis of the same sample as that in FIG. 17A. It can be seen from FIG. 18 that the amount of Si on the surface of Cu has a peak near 300° C. This matches the results shown in FIG. 17B.

From the above results, the formation temperature of the cap film 270 is preferably set to a temperature below 300° C. and also near 300° C., for example, 275° C.

Figure 19A:
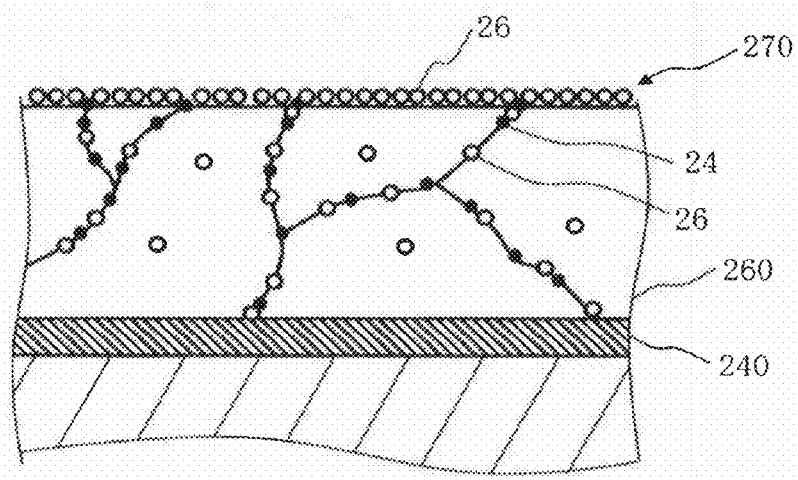
FIGS. 19A and 19B are conceptual diagrams showing examples of diffusion conditions of Ti and Si in the cross section of the Cu film where the cap film is formed in the first embodiment.
Figure 19B:
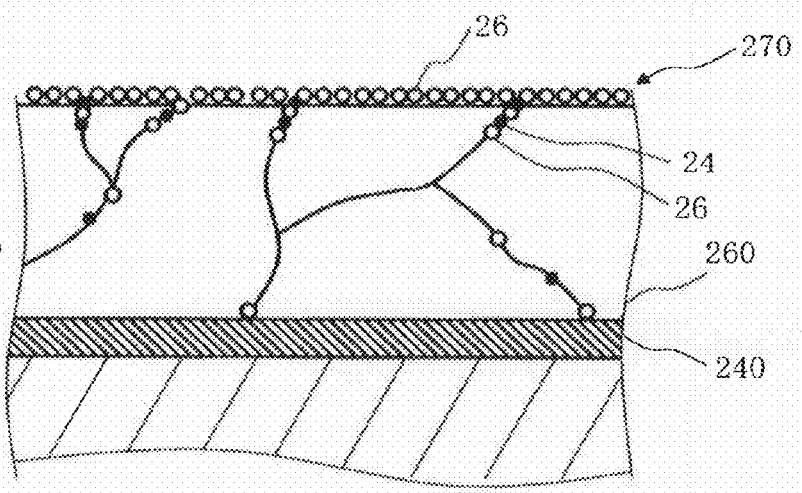

FIGS. 19A and 19B show conceptual diagrams of examples of diffusion conditions of Ti and Si in the cross section of the Cu film where the cap film is formed in the first embodiment. As a result of examination by extrapolating a diffusion coefficient determined at a high temperature to a temperature range up to near 450° C. that is used in a BEOL process, the diffusion coefficient of Si in Cu is faster than that of Ti. Thus, if a cap process is performed, Si diffuses in the direction into a Cu wire even though a large amount of Si is present on the surface of Cu. If, according to a conventional technique, the cap film 270 is formed at 300° C. or higher, excessive Si 26 when the cap film 270 with increased diffusion energy does not only diffuse through grain boundaries, but also penetrates into crystals (inside grains) from the surface of the Cu film 260 as shown in FIG. 19A. As a result, wire resistance increases. Moreover, Ti 24 also diffuses due to Cu film annealing after plating or a thermal process of the cap film formation, which promotes a reaction with the Si 26 and results in an increase in resistance. Thus, it is necessary that firstly diffusion of the Si 26 into grains of Cu is suppressed and then a high-concentration region of Si is formed near the surface of the Cu wire in such a manner that Si is distributed to the extent that does not cause an increase in resistance. If, like the first embodiment, the cap film 270 is formed below 300° C., as shown in FIG. 19B, a large amount of the Si 26 is collected by the Ti 24 in grain boundaries of Cu on the surface of Cu, Ti is dispersed/stabilized on the surface of a Cu wire whose Cu atom transport is fast, excessive Si is also stabilized at the same time by forming a diffusion/distribution of Si that does not cause an increase in resistance on the surface of a Cu wire. As a result, resistance in a multi-layer wire formation process can also be stabilized and EM can be improved. The Si 26 that has penetrated into grain boundaries of Cu is attracted, as shown in FIG. 19B, by Ti, which is a material of the barrier metal film 240 at the bottom of Cu and on the side of a Cu film (not shown) so that penetration into grains of Cu from grain boundaries of Cu can be suppressed.

If the cap film 270 is formed at a temperature below 300° C., as described above, EM characteristics can be improved while an increase in wire resistance being suppressed.

A semiconductor device fabricated by a fabrication method according to the first embodiment includes, as described above, a metal containing film containing at least one metal whose energy for forming silicide thereof is lower than that of Cu silicide, the inter-layer dielectric film 220 arranged on a side surface side of a Cu wire, and the cap film 270 (a compound film containing Cu and Si) selectively formed on the Cu wire at a temperature below 300° C.

Here, by providing heat treatment at 150 to 450° C., the metal such as Ti whose energy for forming silicide thereof is lower than that of Cu silicide can diffuse into the Cu film. In the above example, Ti is diffuses by annealing immediately after plating or heating during formation of the cap film 270, but the present embodiment is not limited to these examples.

The silicide reaction of Si and Ti is not limited to a reaction when the cap film 270 is formed. The silicide reaction may be a reaction by heat treatment thereafter. Therefore, heat treatment may be provided after the cap film 270 is formed.

In the present embodiment, Ti is described as a metal whose energy for forming silicide thereof is lower than that of Cu silicide, but the metal may be Co, Ni, Mn, Mo, or Hf. Here, a metal that can diffuse into a Cu film in a temperature range of about 450° C. or lower, which is used in the BEOL process, and whose initial layer of a silicide reaction is formed in the temperature range may be selected. Generally, the temperature below of the formation temperature of a stable compound layer of silicide by about 200 to 250° C. only needs to fall within the temperature range of about 450° C. or lower and as a reference, a metal that forms silicide stable compound formation layer at 600° C. or lower may be selected.

The essence of the present embodiment is to form a cap film at a formation temperature below 300° C. and preferably close to 250° C. to 280° C. By forming a cap film at such a temperature, Si is formed uniformly on the surface of a Cu wire so as to suppress diffusion of Si into the wire to a minimum. A compound more stable than a CuSix formation reaction is formed in an Si formation region after diffusion being realized to stabilize Si and also elements capable of improving adhesiveness to a diffusion prevention layer on the Cu wire are caused to diffuse/distribute from the barrier metal or Cu seed film. Accordingly, these elements can be dispersed onto the Cu wire and the interface of the diffusion prevention layer more efficiently than when these elements simply diffuse into the Cu wire.

In the first embodiment, these elements are especially described because a metal whose energy for forming silicide thereof is lower than that of Cu silicide is effective for an object, however, an effect may be also achieved by elements that form a eutectic with Si, for example, as another desirable embodiment. This is because these elements also have properties to diffuse into Si and to deposit. For example, these elements include Al, Ag, and Au that are generally used as wire materials.

Second Embodiment

In the first embodiment, a case in which the cap film 270 is formed below 300° C. is described as a technique to make an Si distribution in a desired distribution, but the technique is not limited to this. In the second embodiment, a semiconductor device and a method for fabricating a semiconductor device capable of improving EM characteristics while an increase in wire resistance being suppressed will be described when the cap film 270 is formed at 300° C. or higher.

Figure 20:
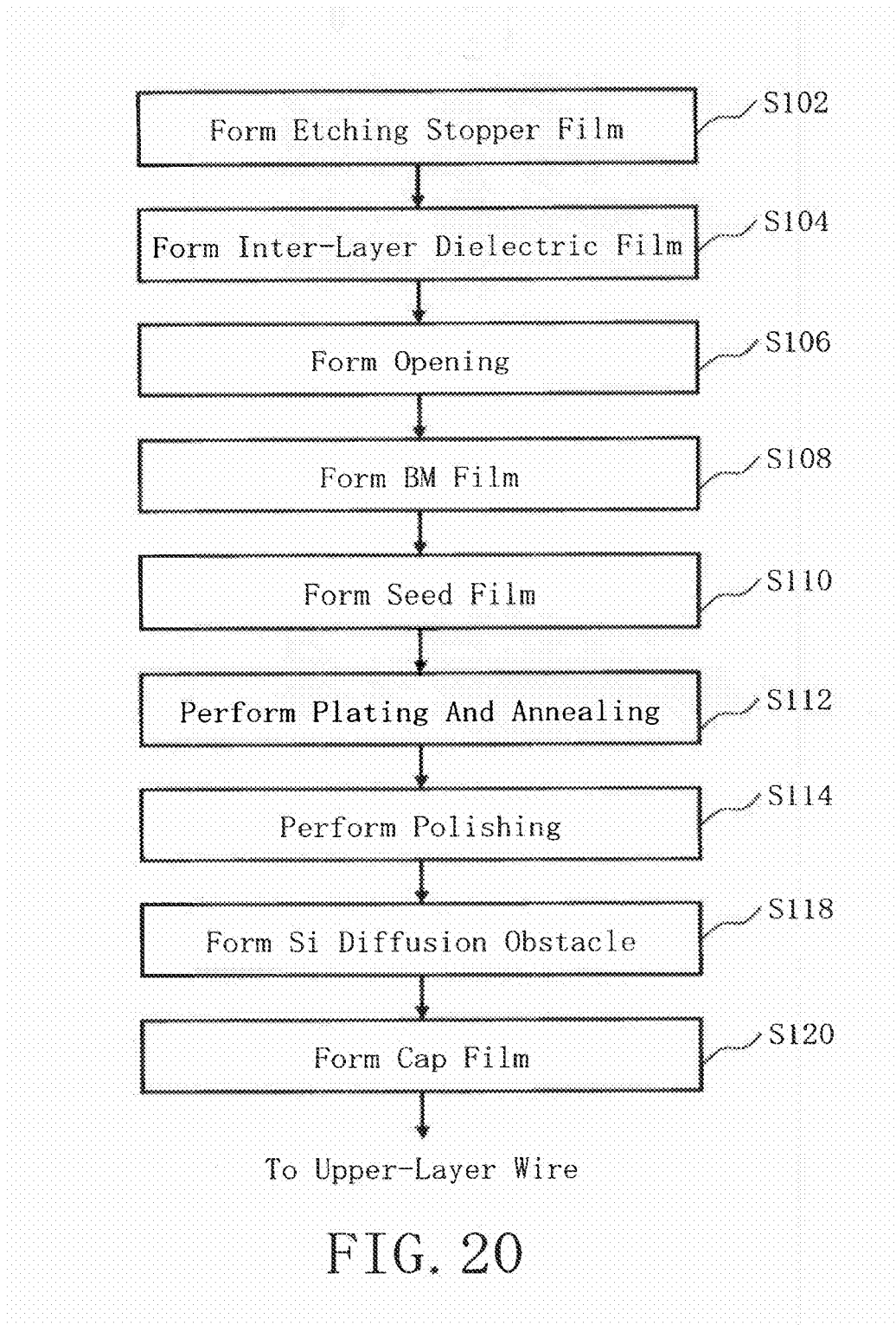
FIG. 20 is a flow chart showing principal parts of the method for fabricating a semiconductor device in a second embodiment.

FIG. 20 is a flow chart showing principal parts of the method for fabricating a semiconductor device in the second embodiment. In FIG. 20, the method for fabricating a semiconductor device in the present embodiment is the same as that shown in FIG. 1 except that an Si diffusion obstacle formation process (S118) is added between the polishing process (S114) and the cap film formation process (S120). Each process from the etching stopper film formation process (S102) to the polishing process (S114) is the same as that in the first embodiment. Like the first embodiment, the etching stopper film formation process (S102) may be included or omitted.

As the Si diffusion obstacle formation process (S118), an Si diffusion obstacle to prevent diffusion of Si into the Cu film 260 is formed from a material different from the above metal whose energy for forming silicide thereof is lower than that of Cu silicide such as Ti in at least a portion of the surface of the Cu film 260.

Figure 21A:
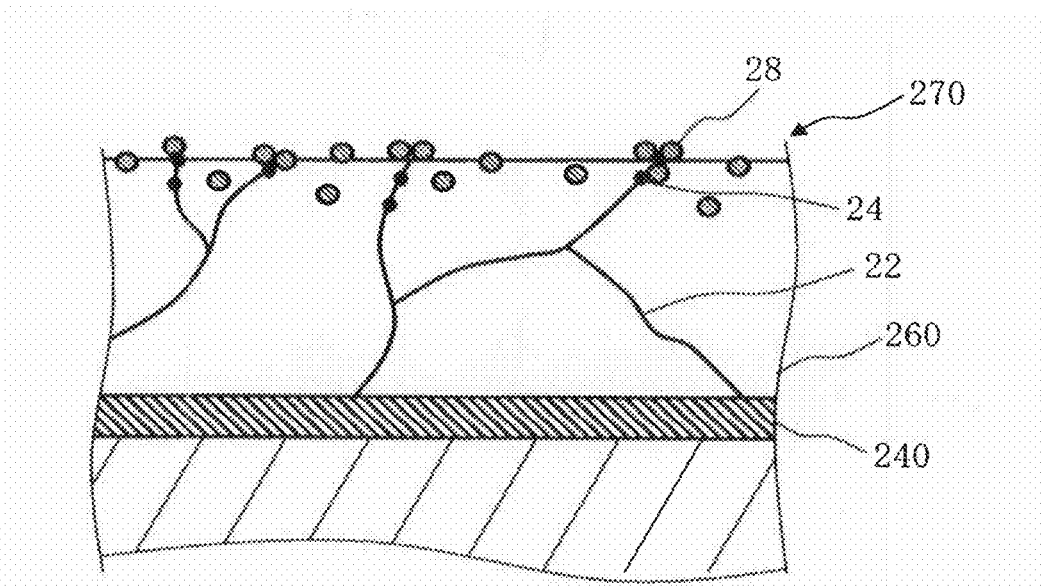
FIGS. 21A to 22B are conceptual diagrams showing examples of distribution conditions of Ti and an Si diffusion obstacle separate from Ti in the cross section of the Cu film in the second embodiment.
Figure 21B:
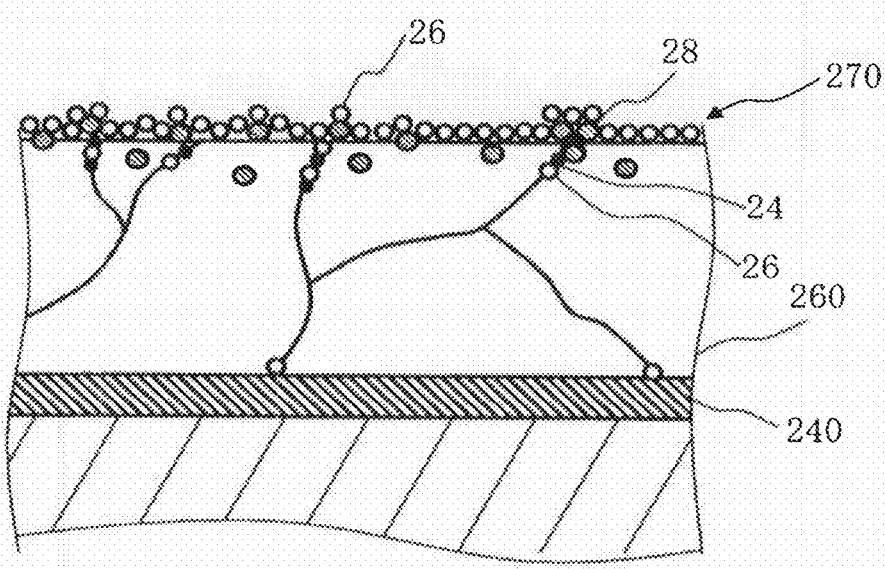

FIGS. 21A and 21B, and FIGS. 22A and 22B are examples of conceptual diagrams showing distribution conditions of Ti and an Si diffusion obstacle separate from Ti in the cross section of the Cu film in the second embodiment. FIGS. 21A and 21B are conceptual diagrams in the cross section of the Cu film when oxygen (O) is used as a material of an Si diffusion obstacle 28, FIG. 21A is a conceptual diagram after oxygen (O) to be a material of the Si diffusion obstacle 28 is supplied before Si atoms being supplied, and FIG. 21B is a conceptual diagram when Si atoms are supplied after FIG. 21A.

Figure 22A:
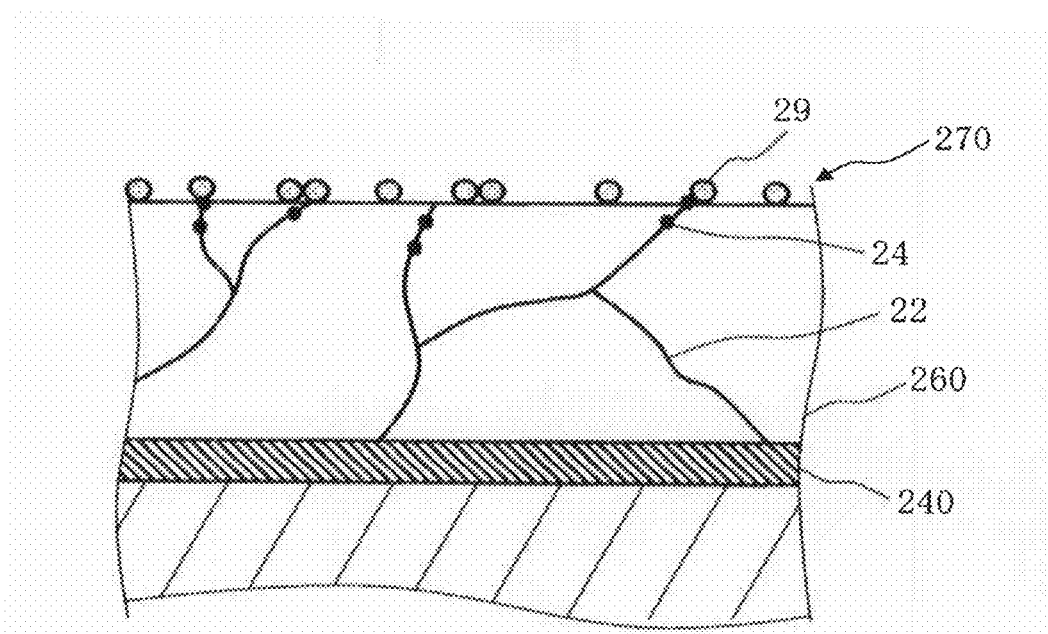
Figure 22B:
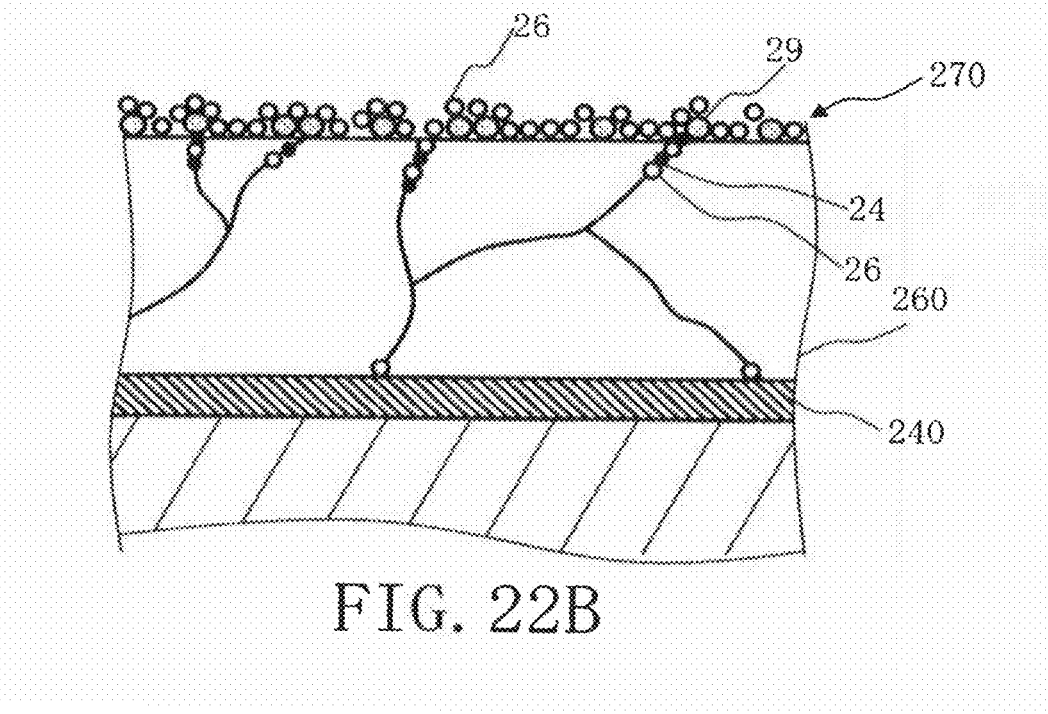

FIG. 22A and FIG. 22B are conceptual diagrams in the cross section of the Cu film when carbon (C) is used as a material of an Si diffusion obstacle 29, FIG. 22A is a conceptual diagram after carbon (C) to be a material of the Si diffusion obstacle 29 is supplied before Si atoms being supplied, and FIG. 22B is a conceptual diagram when Si atoms are supplied after FIG. 22A. Like the first embodiment, the Ti 24 of the BM film 240 is relatively more concentrated in the grain boundary 22 in the upper part of the Cu film 260. Here, the Si diffusion obstacle 28 (FIG. 21A and FIG. 21B) and the Si diffusion obstacle 29 (FIG. 22A and FIG. 22B) are formed on the surface of the Cu film 260. The Si diffusion obstacle 28 and the Si diffusion obstacle 29 may be formed at least on the surface of the Cu film 260 or on the grain boundary 22 in the vicinity beneath the surface. Oxygen (O) is suitable as the material of the Si diffusion obstacle 28 and carbon (C) is suitable as the material of the Si diffusion obstacle 29.

If, as shown in FIG. 21A and FIG. 21B, O is used as the material of the Si diffusion obstacle 28, the Si diffusion obstacle 28 can be formed as to be described below. While a C containing protective film and oxide film (native oxide film, for example) on the Cu film 260 are first thermally decomposed and reduced for removal in the first embodiment when the cap film 270 is formed, in the second embodiment, as shown in FIG. 21A, O can be formed as the Si diffusion obstacle 28 in at least a portion of the surface of the Cu film 260 or in the vicinity beneath the surface by, for example, eliminating reduction treatment or terminating the reduction treatment in an incomplete state so as to leave O (O of a native oxide film formed on the Cu film 260, for example) behind. Alternatively, the cap film 270 may be formed after O is formed as the Si diffusion obstacle 28 in at least a portion of the surface of the Cu film 260 by exposing the surface to a gas containing O by reducing a C containing protective film and oxide on the Cu film 260. Alternatively, O may be formed as the Si diffusion obstacle 28 by mixing O with a gas to form the cap film 270.

Then, as shown in FIG. 21B, after or at the same time as the Si diffusion obstacle 28 is formed, the cap film formation process (S120) is performed.

In the second embodiment, because the Si diffusion obstacle 28 such as O is further present above the Ti 24 present in grain boundaries near the surface, it is more difficult for the Si 26 to penetrate into the Cu film 260. Therefore, even if a cap film formation process is performed at 300° C. or higher, an optimum Si distribution can be formed and Ti becomes distributable in the Si region.

If, as shown in FIG. 22A and FIG. 22B, C is used as the material of the Si diffusion obstacle 29, the Si diffusion obstacle 29 can be formed as to be described below. While a C containing protective film and oxide on the Cu film 260 are first thermally decomposed and reduced for removal in the first embodiment when the cap film 270 is formed, in the second embodiment, C can be formed as the Si diffusion obstacle 29 in at least a portion of the surface of the Cu film 260 or in the vicinity beneath the surface by, for example, eliminating thermal decomposition and reduction treatment or terminating the thermal decomposition in an incomplete state so as to leave C behind. Alternatively, C may be formed as the Si diffusion obstacle 29 by mixing C with a gas for reduction treatment. For example, a gas containing a hydrocarbon radical such as ethylene ($C_2H_4$) is mixed with a reducing $NH_3$ gas or $H_2$ before being supplied. Accordingly, the hydrocarbon radical is adsorbed onto the surface of the Cu film 260 while a C containing protective film is thermally decomposed and oxide is removed, making penetration of Si into the Cu film 260 more difficult when the cap film 270 is formed. A gas containing Si as a gas containing the hydrocarbon radical may be mixed and supplied. For example, a $SiH_3CH_3$ gas, $H_2(CH_3)_2$ gas, or $SiH(CH_3)_3$ gas may be mixed. Accordingly, molecules having a large molecular weight such as the Si—$CH_3$ bond is adsorbed onto the surface of the Cu film 260, making penetration of Si into the Cu film 260 more difficult when the cap film 270 is formed. Alternatively, O may be formed as the Si diffusion obstacle 29 by mixing C with a gas to form the cap film 270. For example, a $SiH_3CH_3$ gas, $SiH_2(CH_3)_2$ gas, or $SiH(CH_3)_3$ gas may be mixed. Accordingly, molecules having a large molecular weight such as the Si—$CH_3$ bond are similarly adsorbed onto the surface of the Cu film 260, making penetration of Si into the Cu film 260 more difficult.

Then, after or at the same time as at least one of the Si diffusion obstacles 28 and 29 is formed, the cap film formation process (S120) is performed. In the former case, the formation technique of the cap film 270 is the same as that in the first embodiment, but in the latter case of processing at the same time, a methyl group containing Si gas can also form Cu silicide by partial thermal decomposition and thus, a methyl group containing Si gas may be used instead of an SiH$_4$ gas or a mixed gas of an SiH$_4$ gas and methyl group containing Si gas may be used.

A semiconductor device fabricated by the fabrication method according to the second embodiment includes: as described above, a Cu wire; a metal containing body whose energy for forming silicide thereof formed in grain boundaries of the Cu wire is lower than that of Cu silicide; an Si diffusion obstacle formed in a portion of the surface of the Cu wire from a different material from that of the metal containing body to prevent diffusion of Si into the Cu wire; the inter-layer dielectric film 220 arranged on a side surface side of the Cu wire; and the cap film 270 (compound film containing Cu and Si) selectively formed on the Cu wire.

As shown in FIG. 22B, after or at the same time as the Si diffusion obstacle 29 is formed, the cap film formation process (S120) is performed. In the second embodiment, because the Si diffusion obstacle 29 such as C is further present above the Ti 24 present in grain boundaries near the surface, it is more difficult for the Si 26 to penetrate into the Cu film 260. Therefore, even if a cap film formation process is performed at 300° C. or higher, an optimum Si distribution can be formed and Ti becomes distributable in the Si region.

In FIG. 21A and FIG. 21B, and FIG. 22A and FIG. 22B, only oxygen or only carbon is schematically shown as a component of an Si diffusion obstacle, both oxygen and carbon may be used as components of the Si diffusion obstacle.

Figure 23:
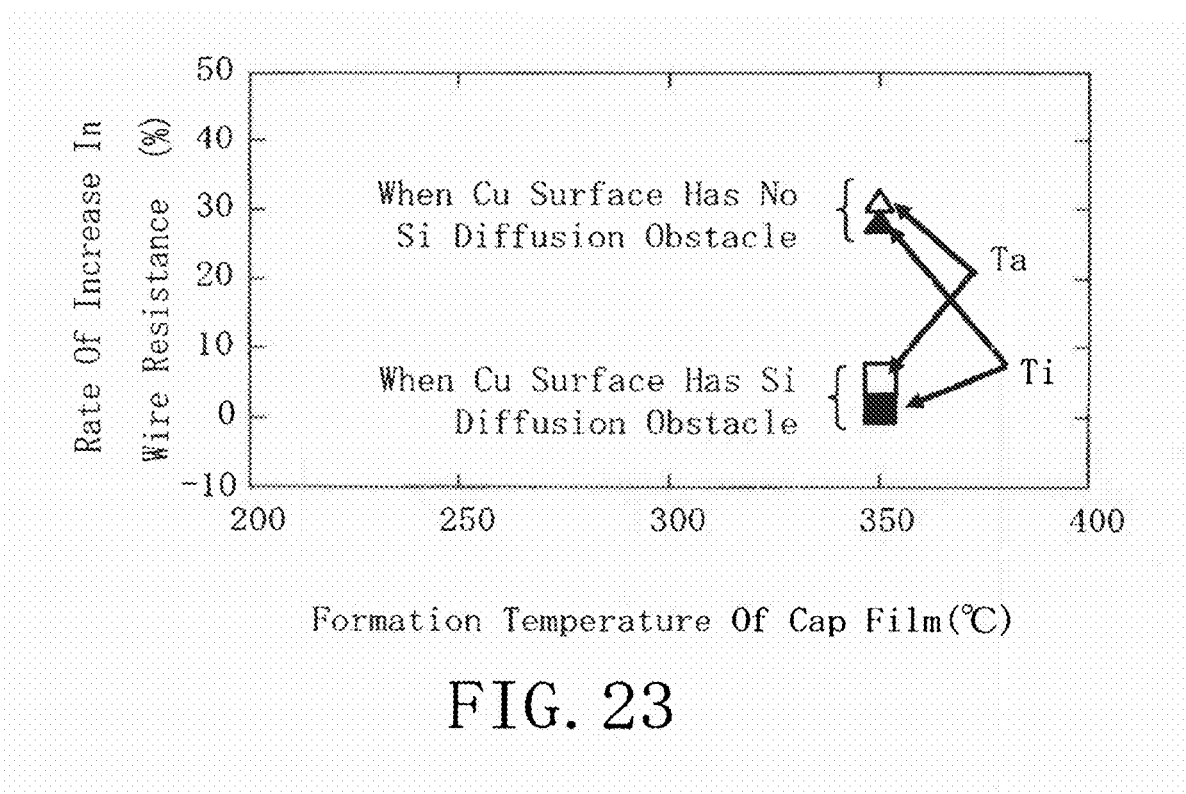
FIG. 23 is a graph showing the relationship between the formation temperature of the cap film and the rate of increase in wire resistance in the second embodiment.

FIG. 23 is a graph showing the relationship between the formation temperature of the cap film and the rate of increase in wire resistance in the second embodiment. Since the Si diffusion obstacle 28 or 29 (or Si diffusion obstacles 28 and 29) such as O or C is present in grain boundaries of the surface of the Cu film 260 in the second embodiment, penetration of Si can be suppressed even if the formation temperature is higher than that in the first embodiment. FIG. 23 shows that there is no increase in wire resistance even if a cap film is formed at 350° C.

Table 3 shows the EM life in the second embodiment as a ratio. The barrier metal film 240 used is the above Ti-rich TiN and the EM life is compared between a case when the cap film 270 is formed on the Si diffusion obstacle 28 of O and a case when a cap film is formed by a known method.

TABLE 3

| Barrier metal | When A Cap Is Formed On An Si Diffusion Obstacle | When A Cap Is Formed Without Si Diffusion Obstacle |
|---|---|---|
| Ti-rich TiN | 1 | 1 |

If, as shown in Table 3, the cap film 270 is formed on the Si diffusion obstacle 28, no deterioration of EM is observed compared with a case without Si diffusion obstacle. Though the EM life deteriorates if reduction treatment after CMP is incomplete, that is, oxygen remains on the surface of Cu after CMP, the EM life can be maintained at a high level if the cap film 270 is formed on the Si diffusion obstacle 28 made of O present on the surface of Cu after CMP, as shown in Table 3.

Thus, in consideration of the rate of increase in wire resistance shown in FIG. 23 and the EM life shown in Table 3, the following can be said. If the cap film 270 is formed after the Si diffusion obstacle 28 being formed on the surface of Cu after CMP, the EM improvement effect can be improved while an increase in wire resistance due to the formation of a cap film being suppressed.

Next, a mechanism capable of maintaining the EM life even if the Si diffusion obstacle 28 made of O is present when Ti-rich TiN-BM is used will be described.

Figure 24B:
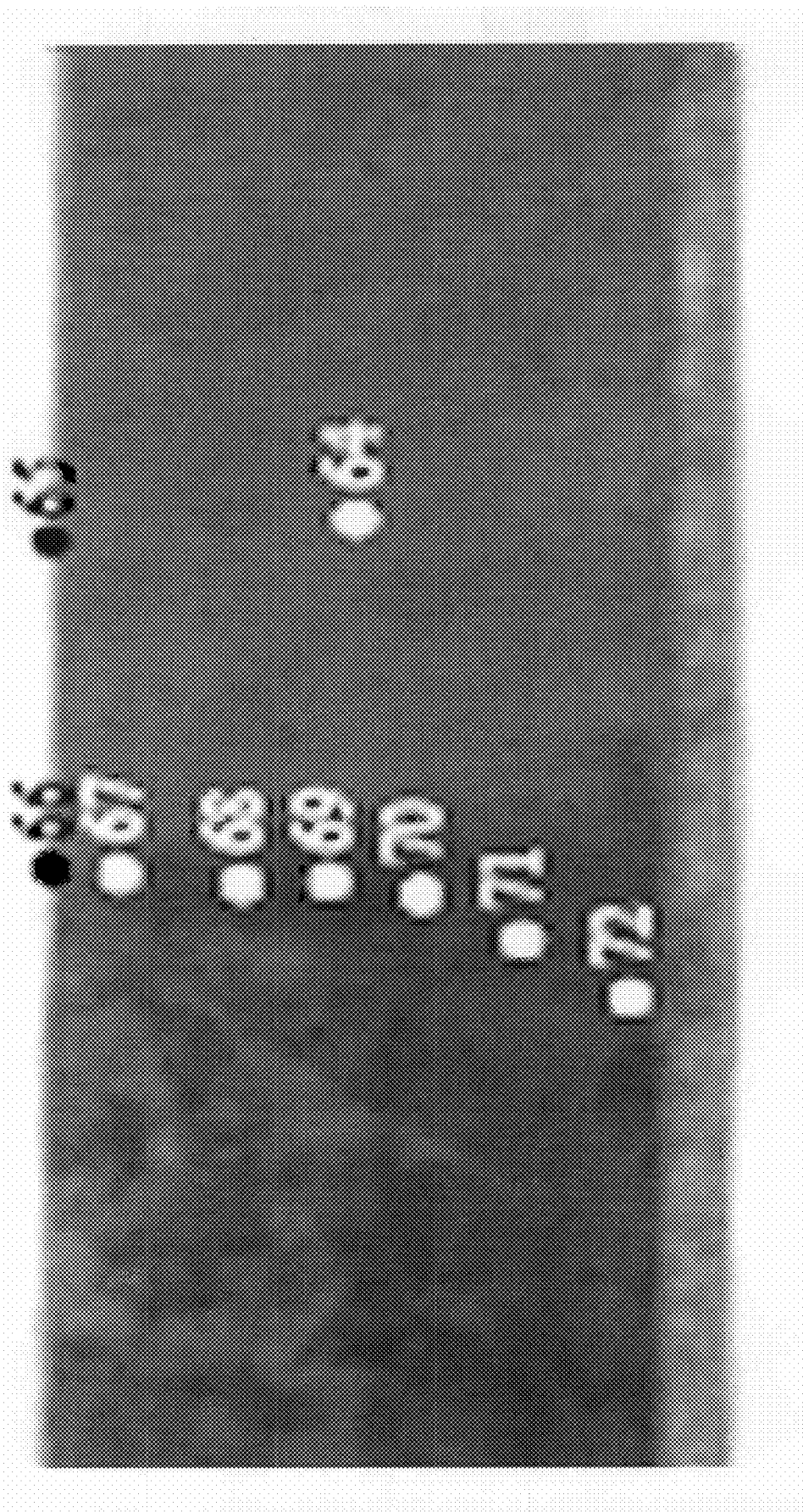
Figure 24C:
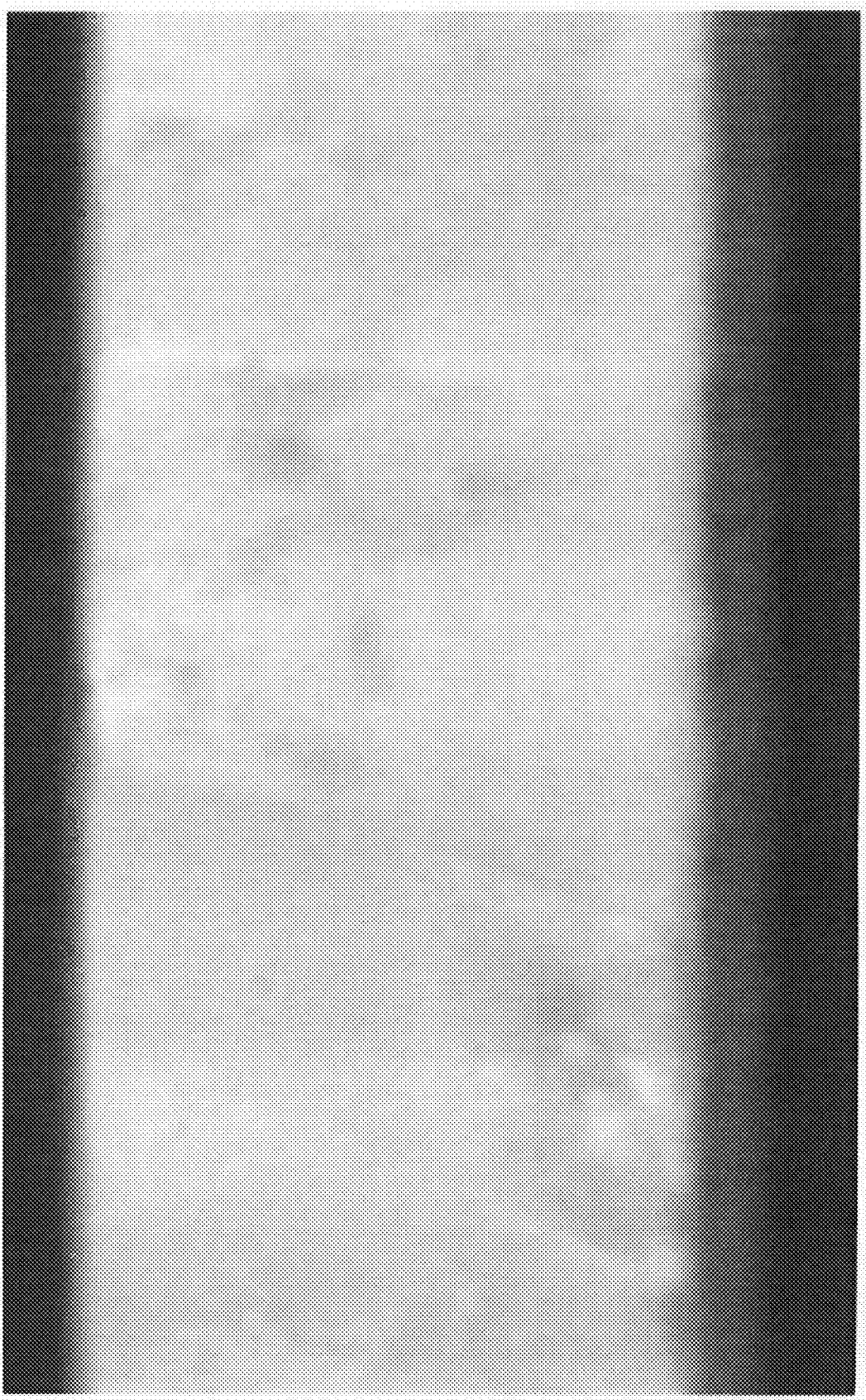

FIGS. 24A to 24D are photos of the cross section of the Cu film when the cap film is formed at 350° C. without the Si diffusion obstacle being formed on the surface of Cu. FIG. 24A and FIG. 24B show STEM photos. FIG. 24C shows an HAADF-STEM photo corresponding to FIG. 24A and FIG. 24D shows an HAADF-STEM photo corresponding to FIG. 24B.

Figure 25A:
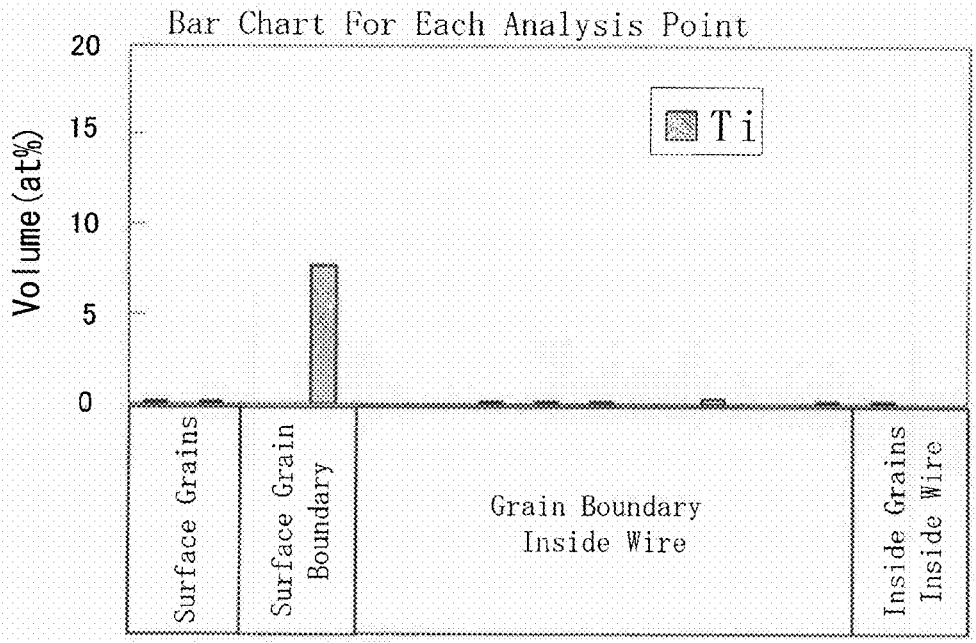
FIGS. 25A and 25B are graphs showing results of analyzing the amount of Ti in the cross section of the Cu film shown in FIGS. 24A to 24D.
Figure 25B:
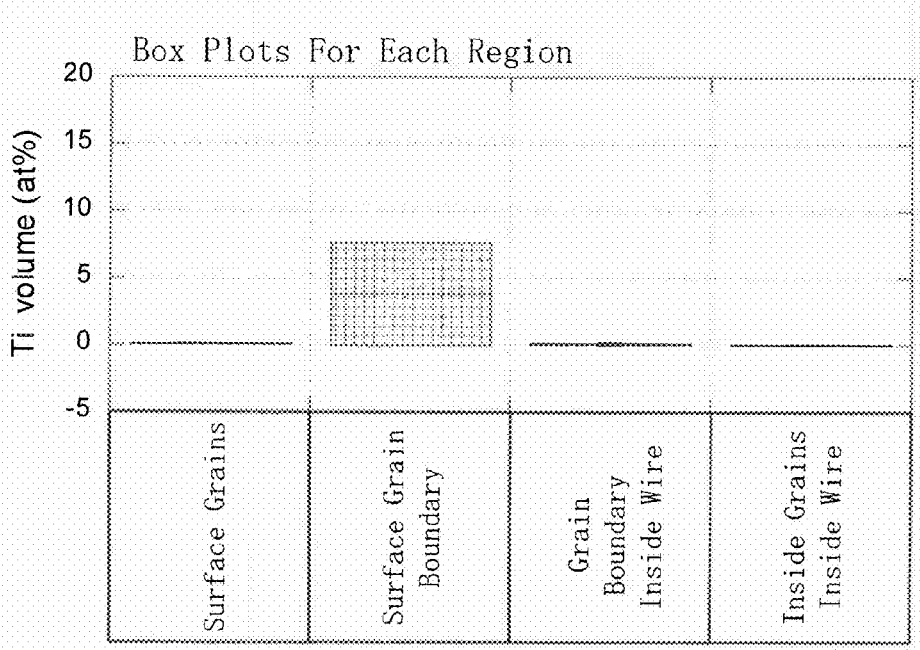

FIG. 25A and FIG. 25B are graphs showing results of analyzing the amount of Ti in the cross section of the Cu film shown in FIGS. 24A to 24D. FIG. 25A shows the amounts of Ti at analysis points shown in FIG. 24A and FIG. 24B side by side as bar charts. FIG. 25B shows total amounts of Ti at all analysis points in each of four regions of a wire being divided into Cu film surface grains, grain boundaries of the Cu film surface, grain boundaries inside the Cu film, and inside grains inside the Cu film as box plots. Here, points 63 and 72 in the lowest part of Cu are excluded from grain boundary points in the Cu wire in FIGS. 25A and 25B because an accumulation layer of Si as shown in FIGS. 16A and 16B may be present in the interface between the Cu wire and barrier metal. It can be seen from FIGS. 25A and 25B that if the cap film is formed at a high temperature (350° C.), points where a large amount of Ti is detected and those where almost no Ti is detected are present in grain boundaries of the surface of the Cu film so that it can be considered that Ti is segregated. Though segregation of Ti in grain boundaries of the surface of the Cu film is not so significant as shown in FIGS. 12A and 12B, but is more significant than when the cap film shown in FIGS. 14A and 14B is formed at a lower temperature (275° C.).

Thus, because Ti is segregated on the surface of the Cu film as shown in the first embodiment, an EM life improvement effect may not be sufficiently achieved even if a cap film is formed.

Figure 26A:
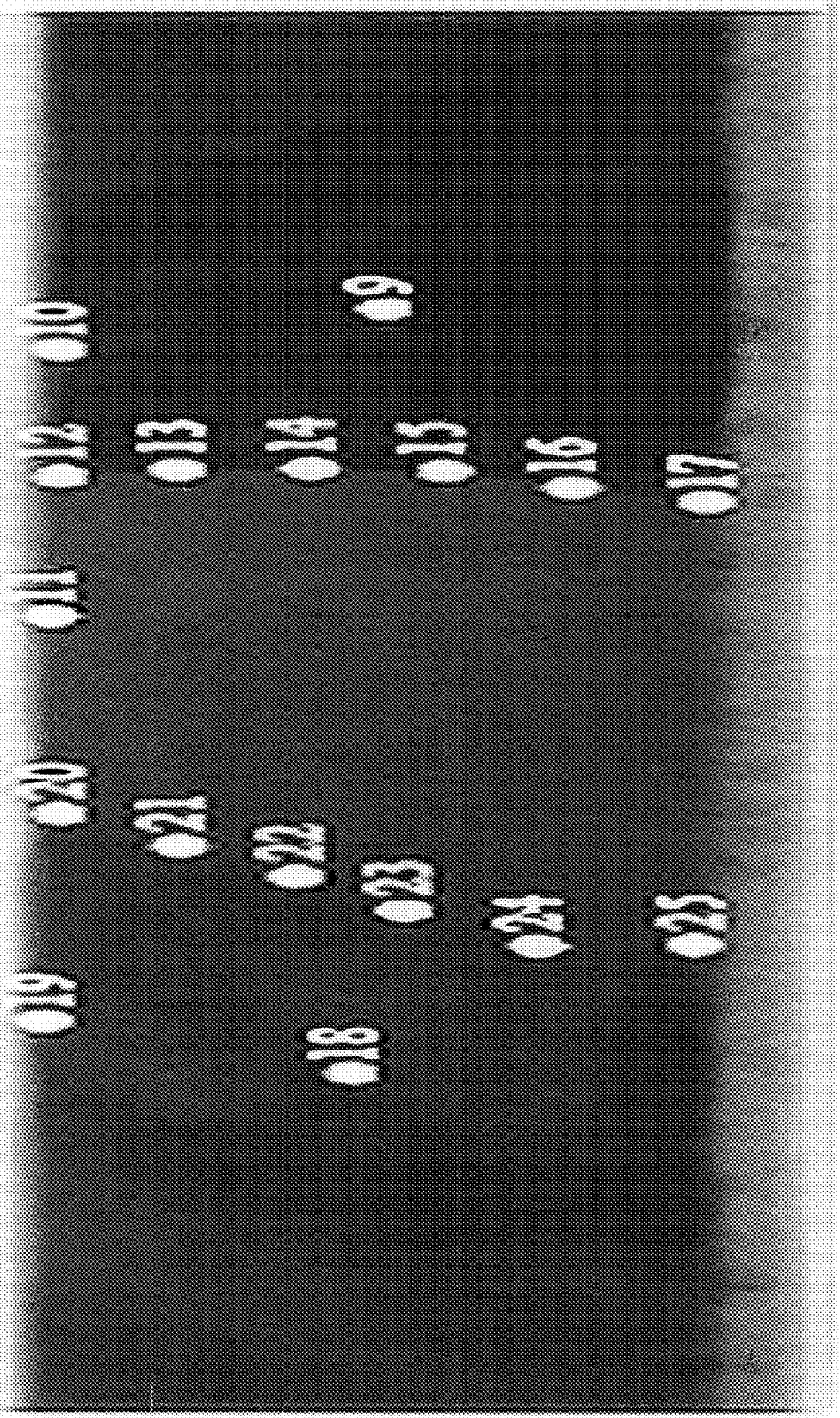
FIGS. 26A to 26D are photos of the cross section of the Cu film when the cap film is formed after the Si diffusion obstacle of oxygen being formed on the surface of Cu.
Figure 26B:
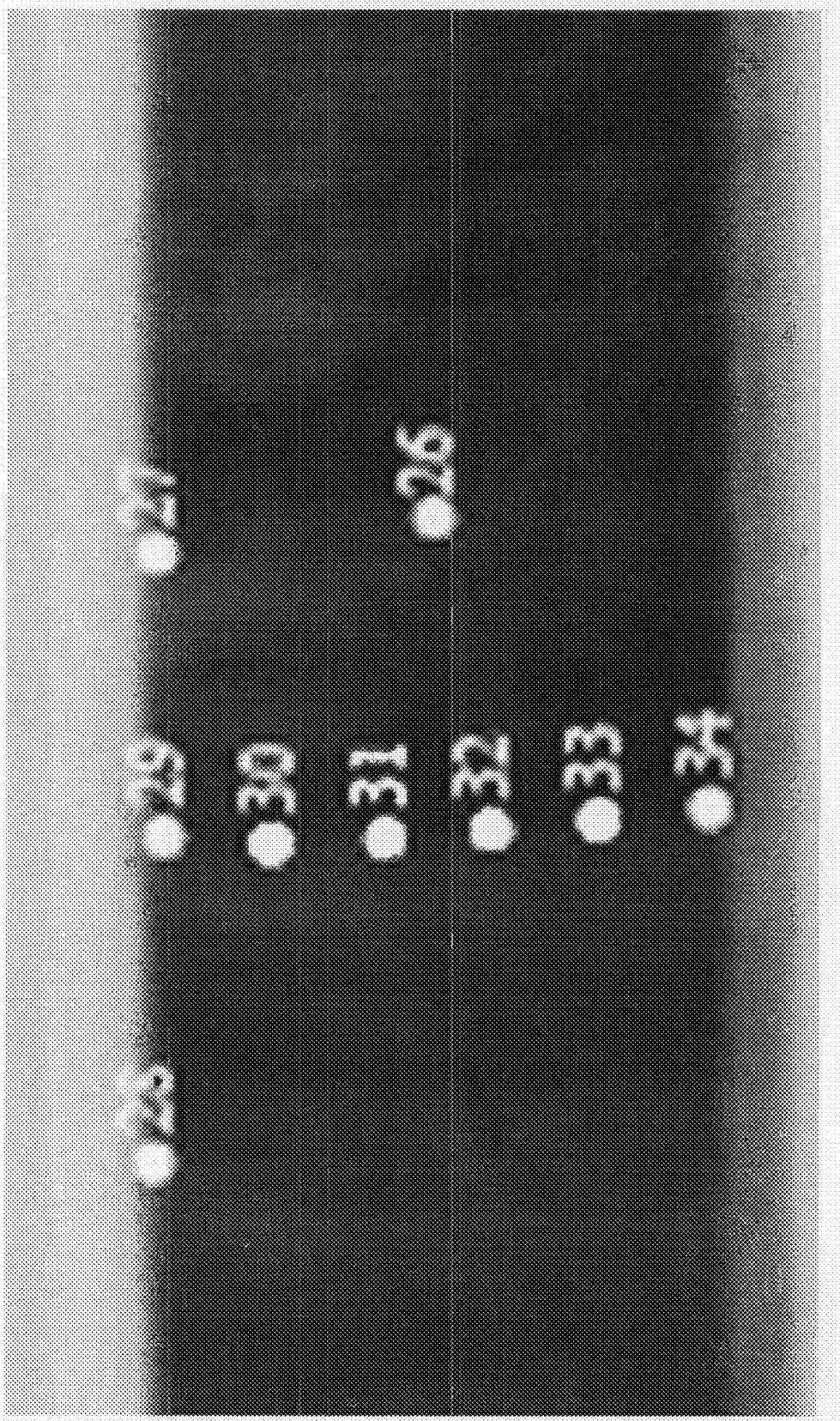
Figure 26C:
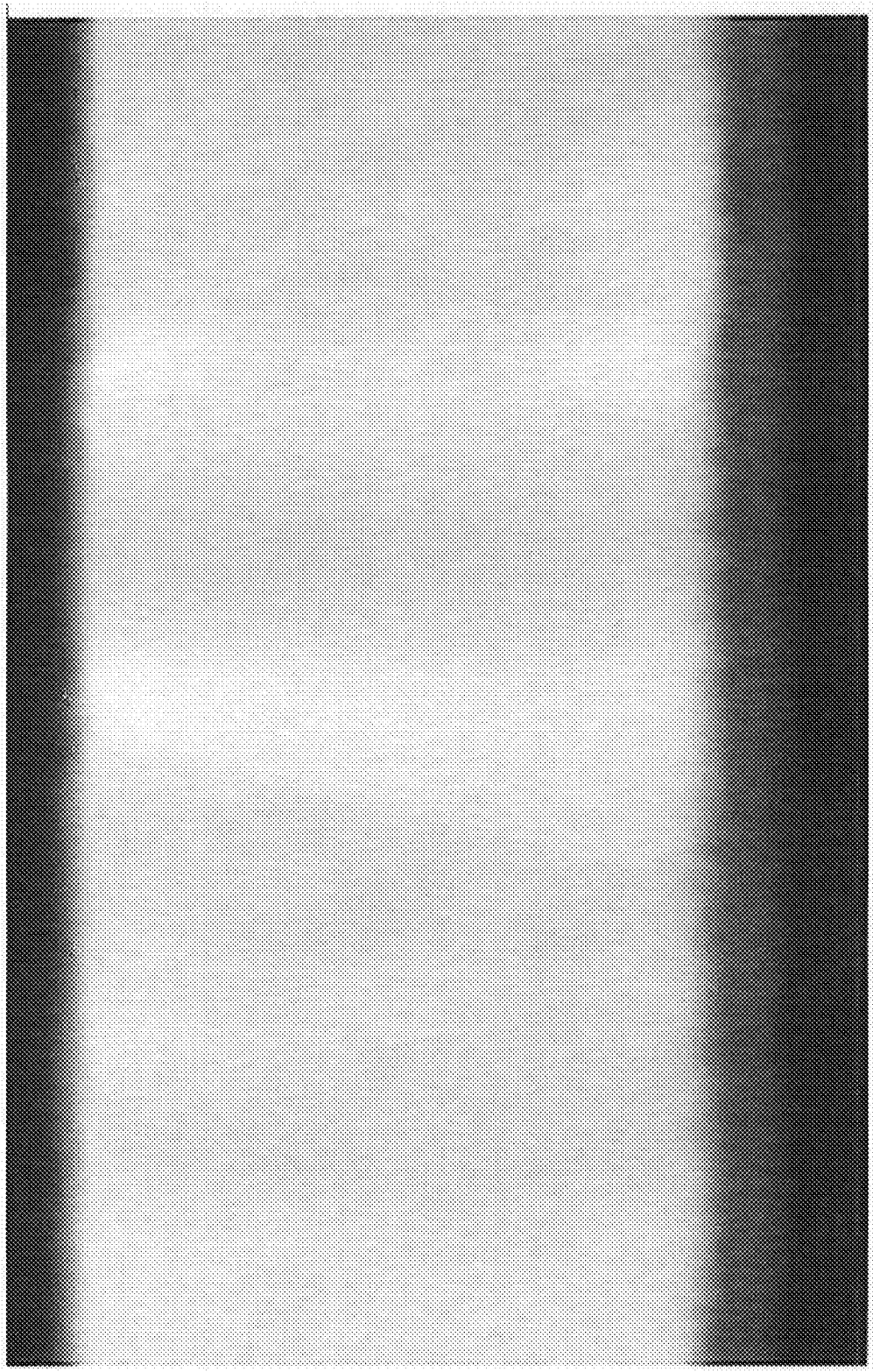
Figure 26D:
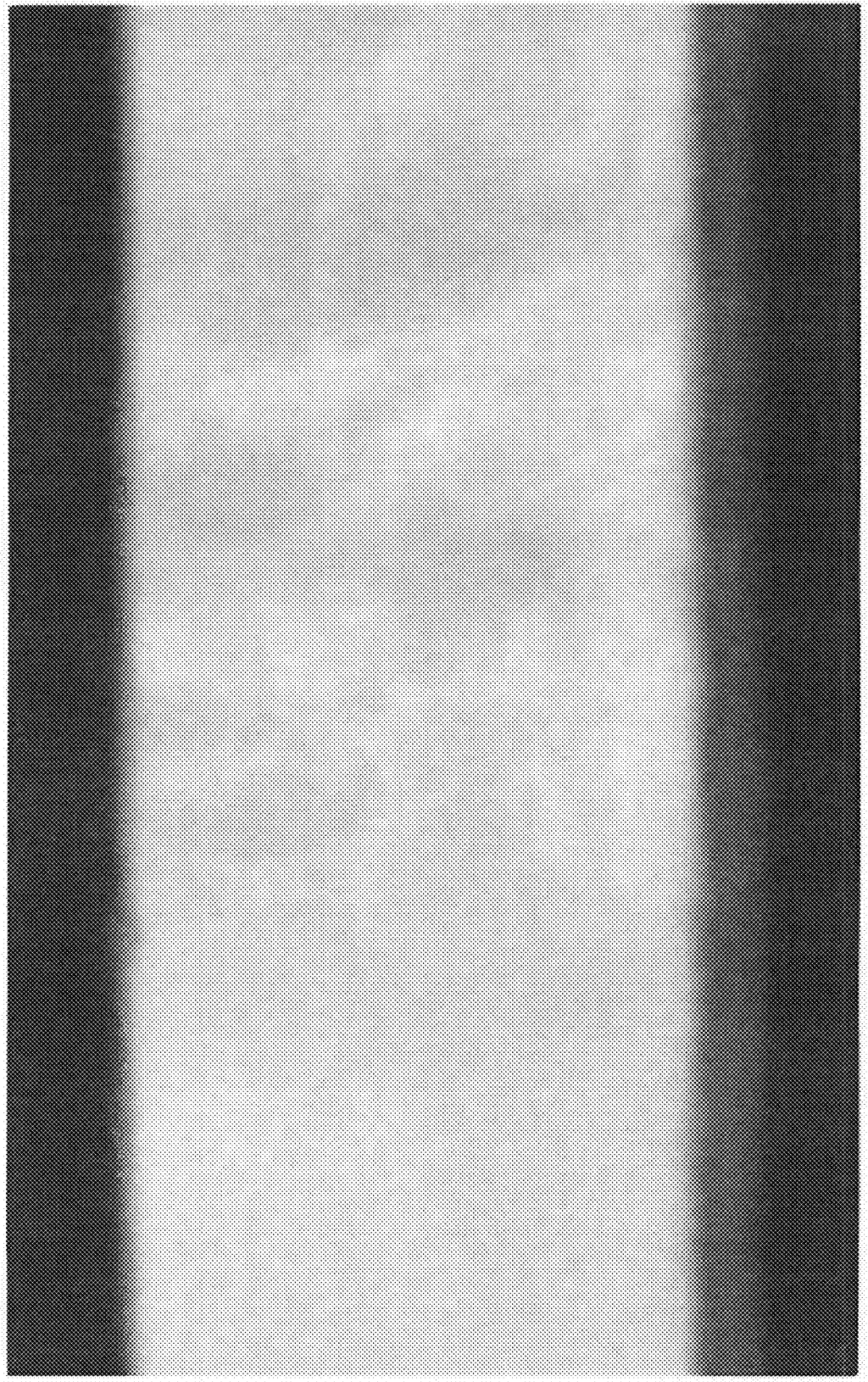

FIGS. 26A to 26D are photos of the cross section of the Cu film when the cap film is formed after the Si diffusion obstacle of oxygen being formed on the surface of Cu. The cap film here is formed at 350° C. FIGS. 26A and 26B show STEM photos. FIG. 26C shows an HAADF-STEM photo corresponding to FIGS. 26A and 26D shows an HAADF-STEM photo corresponding to FIG. 26B.

Figure 27A:
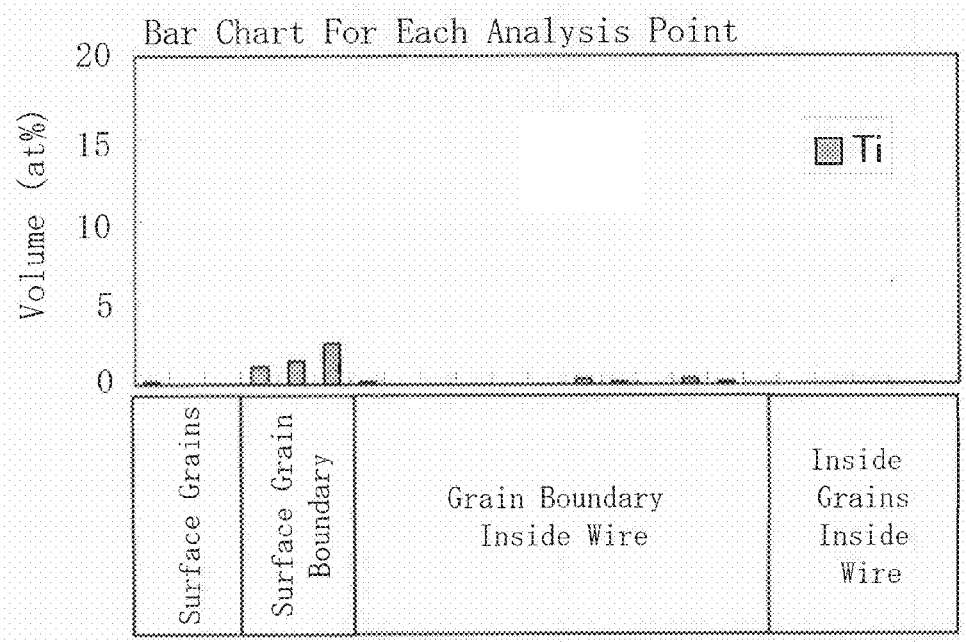
FIGS. 27A and 27B are graphs showing results of analyzing the amount of Ti in the cross section of the Cu film shown in FIGS. 26A to 26D.
Figure 27B:
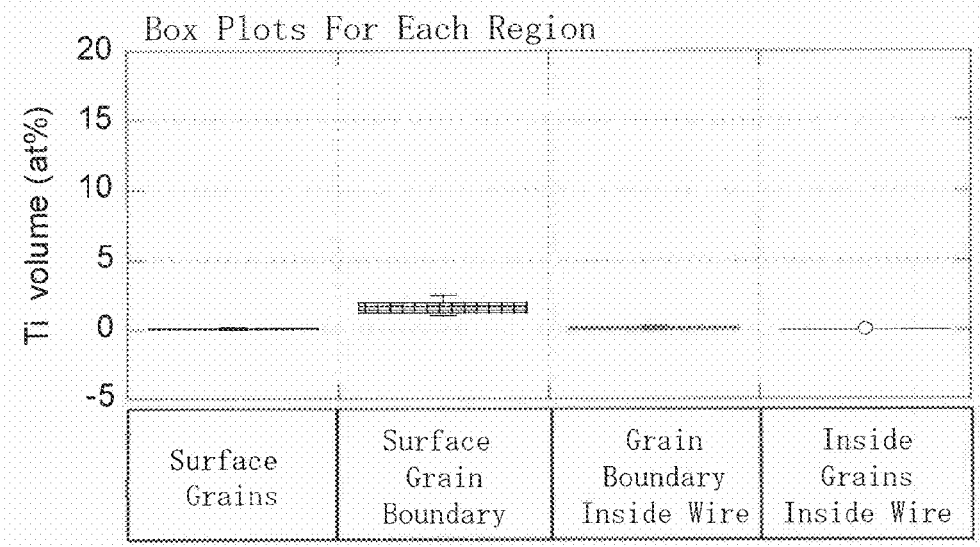

FIGS. 27A and 27B are graphs showing results of analyzing the amount of Ti in the cross section of the Cu film shown in FIGS. 26A to 26D. FIG. 27A shows the amounts of Ti at analysis points shown in FIGS. 26A and 26B side by side as bar charts. FIG. 27B shows total amounts of Ti at all analysis points in each of four regions of a wire being divided into Cu film surface grains, grain boundaries of the Cu film surface, grain boundaries inside the Cu film, and inside grains inside the Cu film as box plots. Here, points 17, 25, and 34 in the lowest part of Cu are excluded from grain boundary points in the Cu wire in FIGS. 27A and 27B because an accumulation layer of Si as shown in FIGS. 16A and 16B may be present in the interface between the Cu wire and barrier metal. It can be seen from FIGS. 27A and 27B that Ti is almost uniformly distributed in grain boundaries of the surface of Cu and variations in the detected amount of Ti in the grain boundary portion of the surface of Cu film are also small. This shows a broadly similar trend to that when a cap film is formed at a lower temperature (275° C.) shown in FIGS. 14A and 14B, which means that a higher level of the EM life improvement effect can be expected compared with a case without Si diffusion obstacle.

Figure 28:
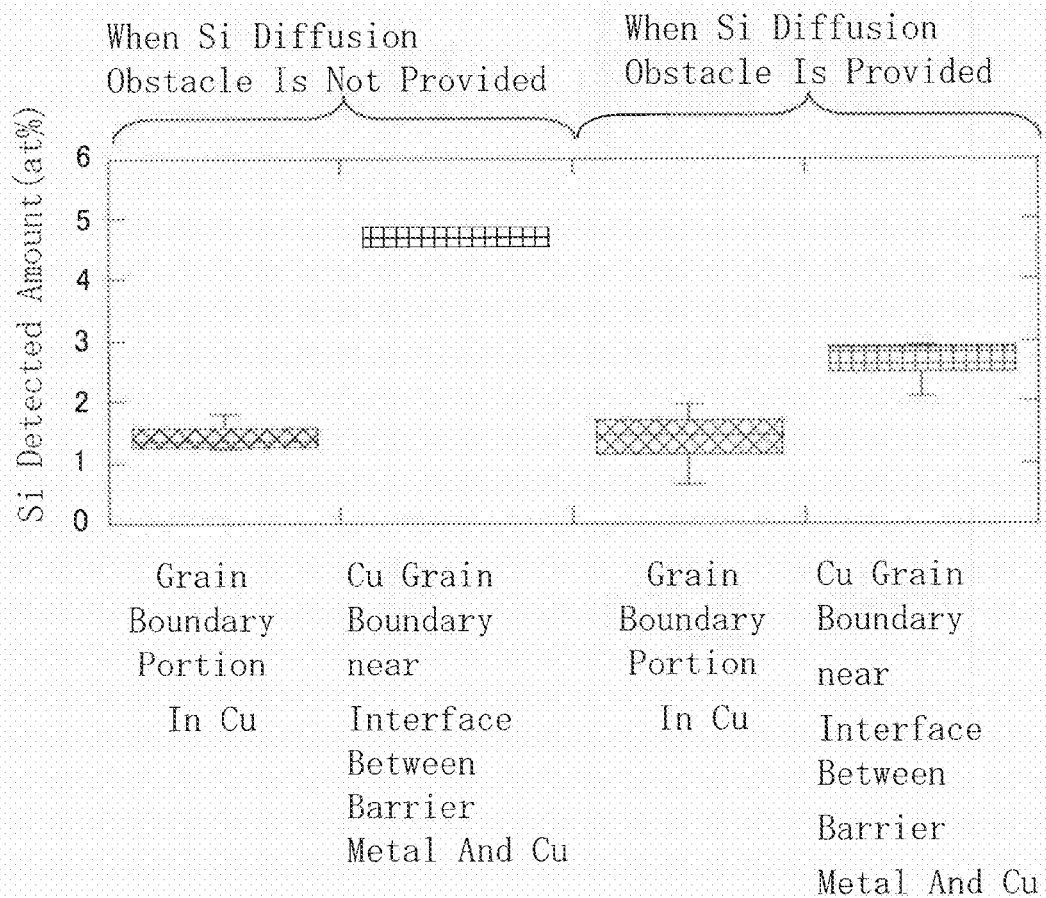
FIG. 28 is a diagram of box plots of the detected amount of Si in a grain boundary portion of a Cu wire for samples with the cap film formed on the surface of the Cu film shown in FIGS. 24A to 24D and FIGS. 26A to 26D separately for grain boundaries at a bottom of the wire and those in the wire.

Subsequently, FIG. 28 shows box plots of the detected amount of Si in a grain boundary portion of a Cu wire for samples with the cap film formed on the surface of the Cu film shown in FIGS. 24A to 24D and FIGS. 26A to 26D separately for grain boundaries at the bottom of the wire (the points 63 and 72 in FIGS. 24A to 24D and the points 17, 25, and 34 in FIGS. 26A to 26D) and those inside of the wire. It can be seen from the graph shown in FIG. 28 that while the amount of Si in grain boundaries in the Cu wire is at a level of detection limit regardless of whether an Si diffusion obstacle is present, the detected amount of Si when there is no Si diffusion obstacle is large in grain boundaries at the bottom of the Cu wire and the amount of Si accumulated at the bottom of the wire decreases, that is, the amount of Si that diffuses through the Cu wire decreases by providing an Si diffusion obstacle. Based on this result, while the amount of Si at the bottom of the wire is not decreased to a level of detection limit even if an Si diffusion obstacle is provided, as shown in FIG. 23, no increase in wire resistance due to the formation of a cap film is observed.

That is, when an Si diffusion obstacle is provided, Si supplied to the surface of the Cu film when a cap film is formed is inhibited from penetrating into grain boundaries of Cu by the Si diffusion obstacle from the beginning. Thus, diffusion into grains of Cu that causes an increase in wire resistance does not occur. Further, Si that has penetrated into grain boundaries of Cu passing through the Si diffusion obstacle can be considered to be accumulated at the bottom of the wire passing through grain boundaries. From the above, as shown conceptually in FIGS. 21A and 21B, and FIGS. 22A and 22B, excessive Si is blocked by the surface of Cu or accumulated at the bottom of the wire as silicide of Ti or the like and thus, Si does not diffuse into grains of Cu, so that an increase in wire resistance is not caused.

Further, in the second embodiment, in addition to Ti, Ni, Co, Mo, Hf, and Mn, Ta, zirconium (Zr), W, or nitride thereof may be used as materials of the BM film 240. Like metal-rich composition, composition that makes diffusion of metal elements easier may effectively be selected for each nitride. By forming the Si diffusion obstacle 28 or 29 (or 28 and 29) such as O or C in grain boundaries of the surface of the Cu film 260, a cap film can be formed at 300° C. or higher, so that EM characteristics can be improved while penetration of Si being suppressed even when Ta or Zr is used. In other words, EM characteristics can be improved while an increase in wire resistance being suppressed.

As has been described in the first embodiment, in addition to the selection of a metal capable of forming silicide, a metal that forms a eutectic with Si diffusible into an Si distributed region such as Al, Ag, and Au may be selected as another desirable embodiment. It is characteristics of the second embodiment that an Si diffusion obstacle is formed in order to form a desirable Si distribution.

In the foregoing, embodiments have been described with reference to concrete examples. However, the present invention is not limited to these concrete examples.

Figure 29A:
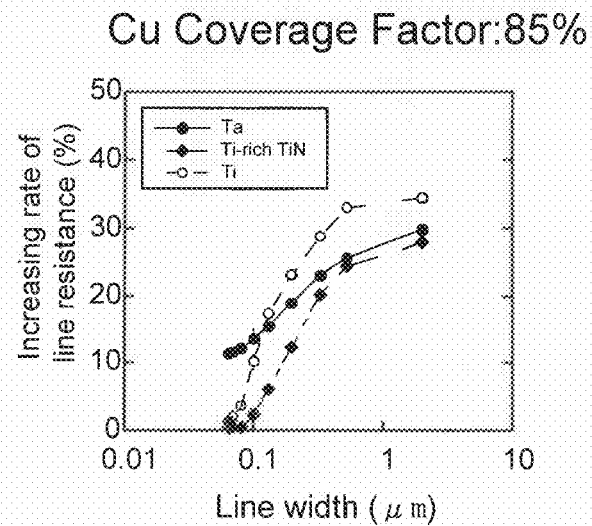
FIGS. 29A and 29B are diagrams showing the relationships between a wire width and the rate of increase in wire resistance when a cap formation process is performed at 350° C.
Figure 29B:
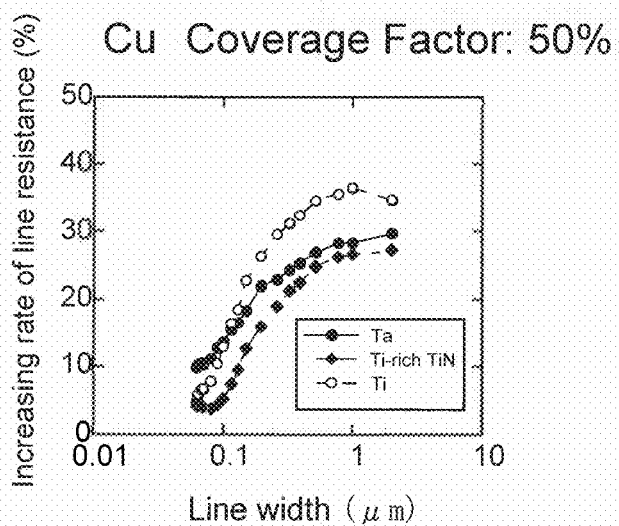

FIG. 29A shows the dependence of the rate of increase in wire resistance on the wire width of a Cu wire whose Cu wire coverage factor is 85% when the cap formation process is performed at 350° C. and FIG. 29B shows the dependence of a Cu wire whose Cu wire coverage factor is 50% when the cap formation process is performed at 350° C. Three barrier metals, Ta, Ti, and Ti-rich TiN, were used. There are various formation methods of Ti-rich TiN and according to the process shown in FIGS. 29A and 29B, Ti-rich TiN is formed on the surface of a Ti film by forming the Ti film and then introducing an $N_2$ gas into the same chamber at the flow rate of 50 to 200 sccm. It can be seen that, compared with when a Ta barrier metal is used, the rate of increase in resistance is suppressed near 0.1 μm or less in wire width when Ti materials are used. When a Ti-rich TiN film is used, the rate of increase in resistance can significantly be reduced up to near 1 μm. It can be also seen that the rate of increase in resistance can be reduced more than that when Ta is used for a thicker width of 1 μm or more.

Thus, it is clear that when a metal whose energy level is lower than energy for forming silicide is used as a barrier metal, there is still a more effective technique even without using an Si formation process by a cap formation process of CuSiNx or CuSix at 300° C. or below depending on the structure to be used. However, because the wire width and coverage factor are limited to specific values, it is needless to say that the cap formation process below 300° C. of the present invention is effective in order to suppressing increase in resistance independently of the wire width.

The semiconductor device can be used while appropriately selecting the film thickness of inter-layer dielectric film and the size, shape, number and the like of openings as needed for semiconductor integrated circuits and various semiconductor elements.

In addition, all semiconductor devices and methods for fabricating a semiconductor device that includes components of the present invention and that can be obtained through design modifications by persons skilled in the art are included in the scope of the present invention.

While techniques normally used in the semiconductor industry, for example, a photolithography process and cleaning before and after treatment and the like are not described for convenience of description, it is needless to say that such techniques may be included in the scope of the present invention. For example, an etching stopper film made of an SiN, SiC, SiCN film, or the like may be formed between the cap film 270 and an inter-layer dielectric film such as a low-k film formed as an upper layer of the cap film 270. The embodiments have been described by using a Cu film as the material of a wire, but in addition to the simple substance of Cu, alloys of Cu or a metal film containing Cu as a main component may also be used.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
   a wire containing copper (Cu);
   a metal containing body formed in grain boundaries of the wire and containing a metal whose energy for forming silicide thereof is lower than that of Cu silicide;
   a dielectric film arranged on a side surface side of the wire;
   a compound film formed selectively on the wire and containing Cu and silicon (Si);
   a barrier metal film formed in contact with the wire at least at a bottom of the wire; and
   a silicide whose concentration is higher in an interface of the wire with the barrier metal film compared with a center part of the wire.

2. The device according to claim 1, wherein the compound film is formed at a temperature lower than 300° C.

3. The device according to claim 1, wherein at least one of titanium (Ti), nickel (Ni), cobalt (Co), molybdenum (Mo), manganese (Mn), and hafnium (Hf) is used as the metal whose energy for forming silicide thereof is lower than that of the Cu silicide.

4. The device according to claim 1, wherein the compound film is containing Cu, Si, and nitrogen (N).

5. The device according to claim 1, wherein the dielectric film includes a foundation film formed by using silicon nitride (SiN), silicon carbonitride (SiCN), silicon carbide (SiC), or silicon oxycarbide (SiOC) as a material, in a lower portion of the dielectric film.

6. The device according to claim 5, wherein the foundation film is arranged in contact with the barrier metal film.

7. A semiconductor device, comprising:
a wire containing copper (Cu);
a metal containing body formed in grain boundaries of the wire and containing a metal whose energy for forming silicide thereof is lower than that of Cu silicide;
a dielectric film arranged on a side surface side of the wire;
a compound film formed selectively on the wire at a temperature lower than 300° C. and containing Cu and silicon (Si); and
a silicide whose concentration is higher in a bottom surface of the wire compared with a center part of the wire.

8. The device according to claim 7, wherein at least one of titanium (Ti), nickel (Ni), cobalt (Co), molybdenum (Mo), manganese (Mn), and hafnium (Hf) is used as the metal whose energy for forming silicide thereof is lower than that of the Cu silicide.

9. The device according to claim 7, wherein the compound film is containing Cu, Si, and nitrogen (N).

10. The device according to claim 7, wherein the dielectric film includes a foundation film formed by using silicon nitride (SiN), silicon carbonitride (SiCN), silicon carbide (SiC), or silicon oxycarbide (SiOC) as a material, in a lower portion of the dielectric film.

11. The device according to claim 1, wherein a concentration of a silicide on an upper surface of the wire is higher than that of the center part of the wire.

12. The device according to claim 1, wherein a concentration of a silicide in grain boundaries of the wire at an interface of the wire with the barrier metal film is higher than that in grain boundaries at the center part of the wire.

13. The device according to claim 7, wherein a concentration of a silicide on an upper surface of the wire is higher than that of the center part of the wire.

14. The device according to claim 7, further comprising a barrier metal film formed in contact with the wire, wherein a concentration of a silicide in grain boundaries of the wire at an interface of the wire with the barrier metal film is higher than that in grain boundaries at the center part of the wire.

15. The device according to claim 1, wherein the barrier metal film contains the same metal as the metal containing body contains.

16. The device according to claim 14, wherein the barrier metal film contains the same metal as the metal containing body contains.

17. The device according to claim 1, wherein the wire is formed by using a seed film which contains the same metal as the metal containing body contains.

18. The device according to claim 7, wherein the wire is formed by using a seed film which contains the same metal as the metal containing body contains.

* * * * *